(12) United States Patent
Bok et al.

(10) Patent No.: US 11,855,055 B2
(45) Date of Patent: Dec. 26, 2023

(54) DISPLAY DEVICE

(71) Applicant: SAMSUNG DISPLAY CO., LTD., Yongin-si (KR)

(72) Inventors: Seung Lyong Bok, Yongin-si (KR); Dong Ho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/755,784

(22) PCT Filed: Oct. 8, 2020

(86) PCT No.: PCT/KR2020/013807
§ 371 (c)(1),
(2) Date: May 6, 2022

(87) PCT Pub. No.: WO2021/091098
PCT Pub. Date: May 14, 2021

(65) Prior Publication Data
US 2022/0384401 A1 Dec. 1, 2022

(30) Foreign Application Priority Data

Nov. 8, 2019 (KR) .................. 10-2019-0142715

(51) Int. Cl.
*H01L 25/16* (2023.01)
*G06F 3/041* (2006.01)
(Continued)

(52) U.S. Cl.
CPC ............ *H01L 25/167* (2013.01); *G06F 3/044* (2013.01); *G06F 3/0412* (2013.01);
(Continued)

(58) Field of Classification Search
CPC ......... G06F 2203/04105; G06F 3/0412; G06F 3/0416; G06F 3/044; G06F 3/0443;
(Continued)

(56) References Cited

U.S. PATENT DOCUMENTS 9,112,112 B2    8/2015   Do et al.
9,773,761 B2    9/2017   Do
(Continued)

FOREIGN PATENT DOCUMENTS

CN      108878626 A      11/2018
KR      10-1244926 B1    3/2013
(Continued)

OTHER PUBLICATIONS

International Search Report of PCT/KR2020/013807, dated Jan. 29, 2021 and English Translation 6 pages.
(Continued)

*Primary Examiner* — Hong Zhou
(74) *Attorney, Agent, or Firm* — Lewis Roca Rothgerber Christie LLP

(57) ABSTRACT

A display device according to one or more embodiments of the present disclosure includes a substrate, a first electrode and a second electrode on the substrate, a light emitting element electrically connected to the first electrode and the second electrode, and a first reflective layer on the light emitting element and including an opening overlapping the light emitting element, wherein the first reflective layer includes a material having a first reflectivity.

24 Claims, 57 Drawing Sheets

(51) Int. Cl.
*G06F 3/044* (2006.01)
*H01L 23/00* (2006.01)
*H01L 33/60* (2010.01)
*H01L 33/32* (2010.01)

(52) U.S. Cl.
CPC .......... *G06F 3/0416* (2013.01); *H01L 24/24* (2013.01); *H01L 24/25* (2013.01); *H01L 33/60* (2013.01); *G06F 2203/04105* (2013.01); *H01L 33/32* (2013.01); *H01L 2224/245* (2013.01); *H01L 2224/24051* (2013.01); *H01L 2224/24147* (2013.01); *H01L 2224/2512* (2013.01); *H01L 2224/25175* (2013.01); *H01L 2924/0549* (2013.01); *H01L 2924/12041* (2013.01); *H01L 2924/12043* (2013.01)

(58) Field of Classification Search
CPC ... G09G 2300/0819; G09G 2300/0842; G09G 2300/0861; G09G 2320/0233; G09G 2320/0238; G09G 3/3233; H01L 2224/24051; H01L 2224/24147; H01L 2224/245; H01L 2224/2512; H01L 2224/25175; H01L 24/24; H01L 24/25; H01L 25/0753; H01L 25/167; H01L 27/12; H01L 2924/0549; H01L 2924/12041; H01L 2924/12043; H01L 2933/0091; H01L 33/20; H01L 33/32; H01L 33/504; H01L 33/507; H01L 33/60; H01L 33/62
See application file for complete search history.

(56) References Cited

U.S. PATENT DOCUMENTS

| | | | |
|---|---|---|---|
| 9,891,746 B2 | 2/2018 | Bae et al. | |
| 9,927,898 B2 | 3/2018 | Bok et al. | |
| 10,249,603 B2 | 4/2019 | Cho et al. | |
| 10,496,204 B2 | 12/2019 | Heo et al. | |
| 10,600,849 B2 | 3/2020 | Shim et al. | |
| 10,769,990 B2 | 9/2020 | Cho et al. | |
| 11,088,301 B2 | 8/2021 | Choi et al. | |
| 2016/0103545 A1* | 4/2016 | Filiz | G06F 3/0412 345/174 |
| 2017/0358563 A1* | 12/2017 | Cho | H01L 33/38 |
| 2018/0175106 A1* | 6/2018 | Kim | H01L 33/20 |
| 2018/0188866 A1* | 7/2018 | Heo | G06F 3/0445 |
| 2019/0004638 A1* | 1/2019 | Lee | G06F 3/0412 |
| 2019/0251898 A1* | 8/2019 | Cho | H01L 25/167 |
| 2019/0319168 A1* | 10/2019 | Kim | H01L 33/58 |
| 2020/0035873 A1* | 1/2020 | Estrada | H01L 33/62 |
| 2020/0152612 A1 | 5/2020 | Chen et al. | |
| 2021/0242380 A1 | 8/2021 | Kim et al. | |

FOREIGN PATENT DOCUMENTS

| | | |
|---|---|---|
| KR | 10-1490758 B1 | 2/2015 |
| KR | 10-2015-0131944 A | 11/2015 |
| KR | 10-2017-0141305 A | 12/2017 |
| KR | 10-2018-0028822 A | 3/2018 |
| KR | 10-2018-0060499 A | 6/2018 |
| KR | 10-2018-0078669 A | 7/2018 |
| KR | 10-2019-0098305 A | 8/2019 |
| KR | 10-2019-0124359 A | 11/2019 |

OTHER PUBLICATIONS

Written Opinion of PCT/KR2020/013807, dated Jan. 29, 2021 and English Translation 7 pages.
LED and Photodiode Are They Same—YouTube Video published on Sep. 11, 2016.

* cited by examiner

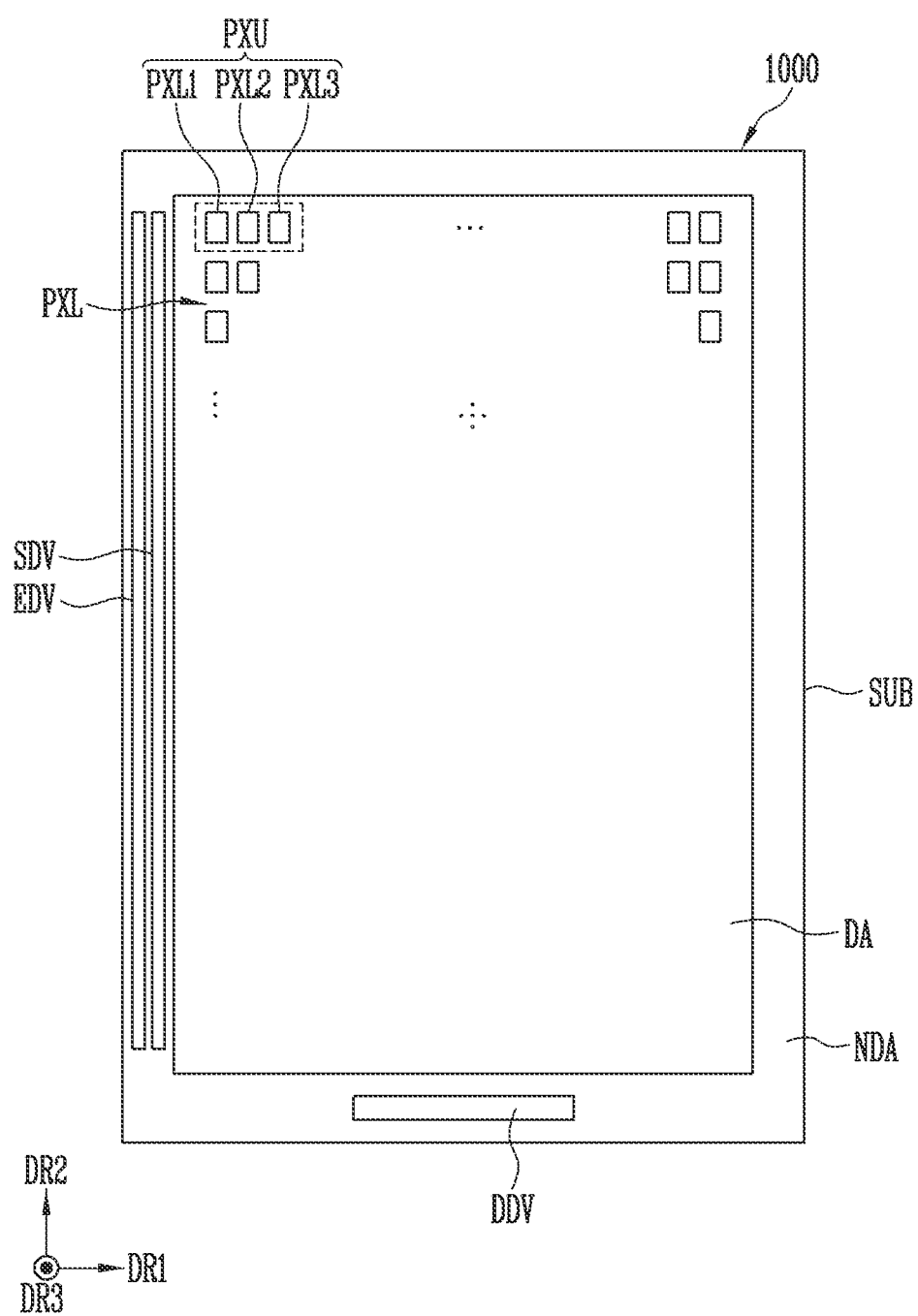

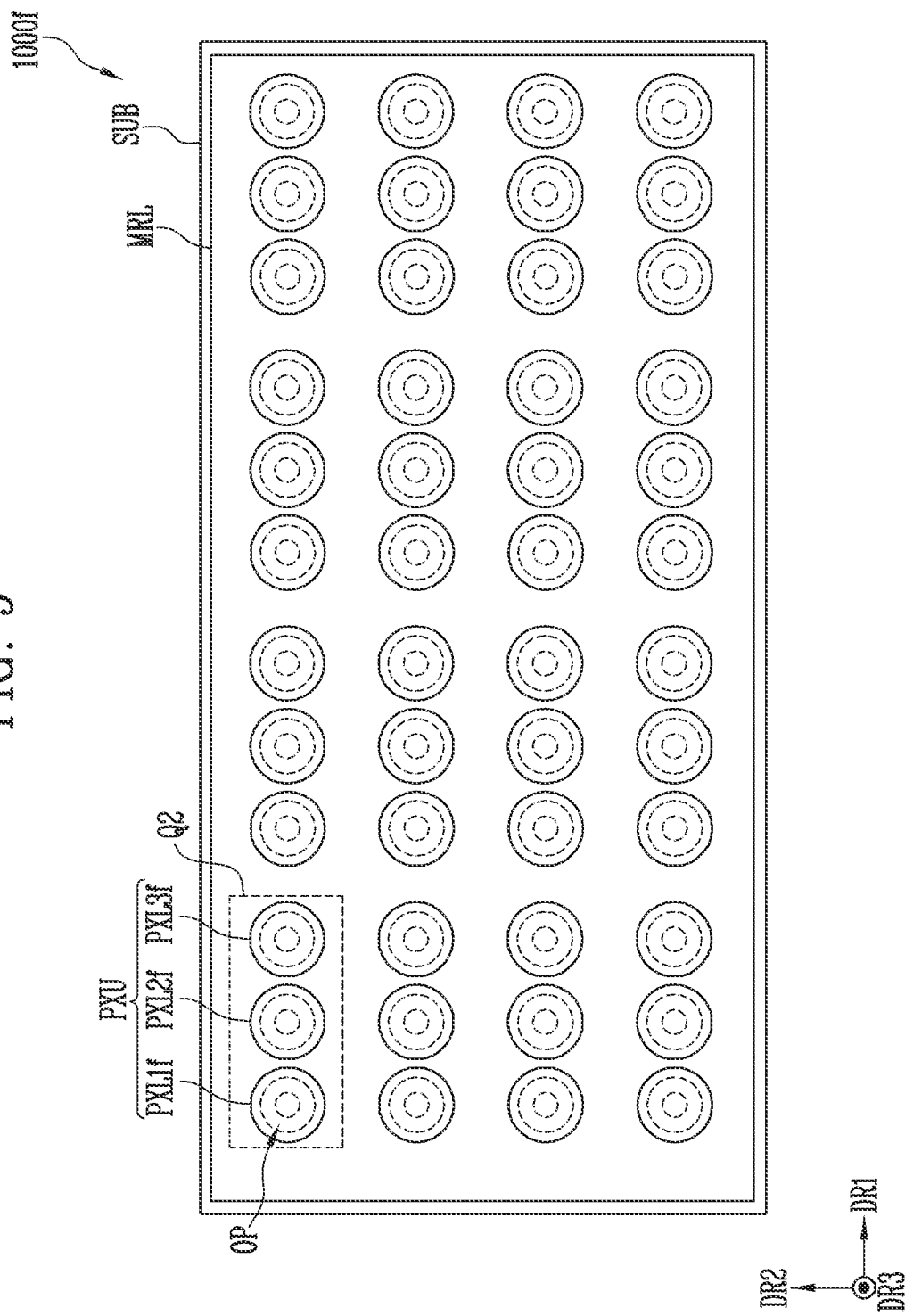

DISPLAY DEVICE

CROSS-REFERENCE TO RELATED APPLICATIONS

This application is a U.S. National Phase Patent Application of International Patent Application Number PCT/KR2020/013807, filed on Oct. 8, 2020, which claims priority to Korean Patent Application Number 10-2019-0142715, filed on Nov. 8, 2019, the entire contents of all of which are incorporated by reference herein.

BACKGROUND

1. Field

The present disclosure relates to a display device, and more particularly, to a display device including a light emitting element.

2. Description of the Related Art

A display device may display an image by using a light emitting element such as a light emitting diode as a light source of a pixel. The light emitting diode has relatively good durability even in harsh environmental conditions and excellent performance in terms of life-span and luminance.

Research has been conducted to manufacture a light emitting diode using a material having a high reliability inorganic crystal structure, and to dispose it on a panel of a display device and use it as a pixel light source. As a part of the research, development of a display device that manufactures a micro-scale or nano-scale light emitting diode and uses it as a light source for each pixel is being conducted.

In addition, a display device that provides a mirror function that may reflect an image of a target positioned in front of the display device by having a reflective member is being developed. In addition, a display device that may concurrently (e.g., simultaneously) implement a mirror function and a touch sensing function is being developed.

SUMMARY

In order to manufacture a display device having a mirror function, a reflective member layer for providing the mirror function is required. In addition, in order to manufacture a display device having a touch sensing function or a pressure sensing function, an additional process of manufacturing a touch electrode layer or a pressure sensing layer is required. However, the manufacturing cost of the display device may be increased.

An aspect of the present disclosure is to provide a display device having a mirror function.

Another aspect of the present disclosure is to provide a display device having a mirror function and a touch sensing function.

Another aspect of the present disclosure is to provide a display device having a mirror function and a pressure sensing function.

Another aspect of the present disclosure is to provide a display device concurrently (e.g., simultaneously) having a mirror function and a fingerprint sensing function.

Aspects of the present disclosure are not limited to the aspects mentioned above, and other technical aspects that are not mentioned may be clearly understood to a person of an ordinary skill in the art using the following description.

One or more embodiments of the present disclosure provides a display device including: a substrate; a first electrode and a second electrode on the substrate; a light emitting element electrically connected to the first electrode and the second electrode; and a first reflective layer on the light emitting element and including an opening overlapping the light emitting element, wherein the first reflective layer includes a material having a first reflectivity.

The display device may further include a first insulation layer that at least partially covers the first electrode and the second electrode and is located between the light emitting element and the substrate; a third electrode on the first electrode and being in contact with one end portion of the light emitting element; a fourth electrode on the second electrode and being in contact with the other end portion of the light emitting element; and a second insulation layer that covers the light emitting element, the third electrode, and the fourth electrode, wherein the first insulation layer may include a first area and a second area, and the third electrode may contact the first electrode through the first area, and the fourth electrode may contact the second electrode through the second area.

The display device may further include a fixing layer around at least a portion of an outer circumferential surface of the light emitting element, wherein the fixing layer may be located between the first insulation layer and the light emitting element.

An insulation layer located between the light emitting element and the first reflective layer may be included.

The insulation layer may include a wavelength conversion particle and a scattering particle.

The display device may further include a wavelength conversion layer on the first reflective layer, wherein the wavelength conversion layer may include a wavelength conversion particle and a scattering particle.

The second electrode surround the first electrode in a plan view.

The display device may further include a second reflective layer on the first reflective layer, wherein the second reflective layer may include a material having a second reflectivity.

The display device may further include a touch sensing controller electrically connected to the first reflective layer, wherein the touch sensing controller is configured to determine a touch position in response to a touch sensing signal received from the first reflective layer.

The touch sensing controller is configured to receive a change in a capacitance value of the first reflective layer as the touch sensing signal.

The touch sensing controller may be further electrically connected to the second reflective layer, and may be configured to receive a change in a capacitance value of the second reflective layer as the touch sensing signal.

The touch sensing controller may be further electrically connected to the second reflective layer, and may be configured to receive a change in a capacitance value between the first reflective layer and the second reflective layer as the touch sensing signal.

The display device may further include a pressure sensing controller electrically connected to the first reflective layer, wherein the pressure sensing controller may be configured to determine a strength of pressure in response to a pressure sensing signal received from the first reflective layer.

The first reflective layer may include a sensing pattern, the sensing pattern may have at least a partially curved shape in a plan view and may have a resistance value that is changed when pressure is applied thereto, and the pressure sensing controller may be configured to receive a change in a resistance value of the sensing pattern as the pressure sensing signal.

The pressure sensing controller may be further electrically connected to the second reflective layer, and the second reflective layer may include a temperature compensation pattern, and the temperature compensation pattern may overlap the sensing pattern and may have the same shape as the sensing pattern.

The pressure sensing controller may include a wheatstone bridge circuit part, and the wheatstone bridge circuit part may include the sensing pattern connected to a first node and a second node, a first resistor connected to a third node and a fourth node, a second resistor connected to the first node and the fourth node, the temperature compensation pattern connected to the second node and the third node, and an amplification circuit connected to the second node and the fourth node, and a driving voltage is applied to the first node and the third node is connected to a ground portion, and the amplification circuit may be configured to output the pressure sensing signal based on a voltage difference between the second node and the fourth node.

The display device may further include an insulation layer located between the first reflective layer and the second reflective layer.

The display device may further include a first sensing electrode and a second sensing electrode on the substrate; and a photodiode electrically connected to the first sensing electrode and the second sensing electrode, wherein the first sensing electrode and the second sensing electrode may be located at the same layer as the first electrode and the second electrode, the photodiode may be located at the same layer as the light emitting element, and the first reflective layer may not overlap the photodiode.

Another embodiment provides a light emitting display device, including: a substrate; a first electrode and a second electrode on the substrate; a light emitting element electrically connected to the first electrode and the second electrode; a first reflective layer on the light emitting element and including an opening overlapping the light emitting element; and a touch sensing controller electrically connected to the first reflective layer, wherein a capacitance value of the first reflective layer is changed according to a touch input, and the touch sensing controller is configured to determine a touch position according to a touch sensing signal based on a change in the capacitance value.

The first reflective layer may include a first sensing pattern and a first sub-sensing pattern, and the touch sensing controller may be configured to receive a change in a mutual capacitance value between the first sensing pattern and the first sub-sensing pattern as the touch sensing signal.

The display device may further include a second reflective layer on the first reflective layer, wherein the second reflective layer may be electrically connected to the touch sensing controller, and the touch sensing controller may be configured to receive a change in a capacitance value of the second reflective layer or a change in a capacitance value between the first reflective layer and the second reflective layer as the touch sensing signal.

The first reflective layer may include a plurality of first sensing electrodes; a first connection portion connecting the plurality of first sensing electrodes adjacent to each other along a first direction; and a plurality of second sensing electrodes located between the plurality of first sensing electrodes.

The display device may further include a second reflective layer on the first reflective layer and including a second connection portion connecting the plurality of second sensing electrodes adjacent to each other along a second direction crossing the first direction, and an insulation layer between the first connection portion and the second connection portion.

Another embodiment provides a display device including: a substrate including a pixel area and a sensor area; a pixel disposed in the pixel area; and a photo sensor located in the sensor area, wherein the pixel includes a first electrode and a second electrode located on the substrate, a light emitting element electrically connected to the first electrode and the second electrode, and a first reflective layer on the light emitting element and including an opening overlapping the light emitting element, the first reflective layer including a material having a constant reflectivity, and the photo sensor includes a first sensing electrode and a second sensing electrode on the substrate, and a photodiode electrically connected to the first sensing electrode and the second sensing electrode.

Particularities of other embodiments are included in the detailed description and drawings.

The display device according to one or more embodiments of the present disclosure may include a reflective layer having a mirror function to provide a mirror function to a user.

In addition, the display device according to one or more embodiments of the present disclosure may share a reflective layer with a touch electrode layer to concurrently (e.g., simultaneously) provide a mirror function and a touch sensing function to a user.

In addition, the display device according to one or more embodiments of the present disclosure may share a reflective layer with a pressure sensing layer to concurrently (e.g., simultaneously) provide a mirror function and a pressure sensing function to a user.

In addition, the display device according to one or more embodiments of the present disclosure may include a reflective layer and a light sensor to concurrently (e.g., simultaneously) provide a mirror function and a fingerprint sensing function to a user.

Effects, aspects, and features of embodiments of the present disclosure are not limited by what is illustrated in the above, and more various effects, aspects, and features are included in the present specification.

BRIEF DESCRIPTION OF THE DRAWINGS

FIG. 2 illustrates a schematic top plan view of a display device according to one or more embodiments.

FIG. 9 illustrates a top plan view of a display device according to one or more embodiments.

DETAILED DESCRIPTION

Figure 1A:
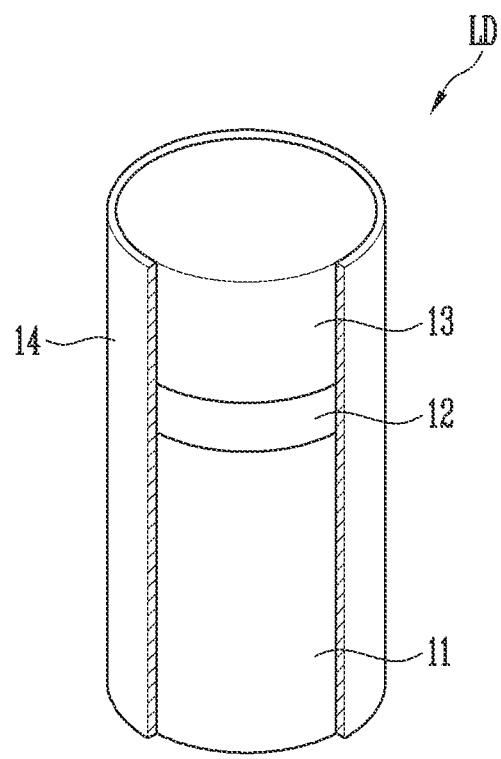
FIG. 1A and FIG. 1B illustrate cutaway perspective views of a light emitting element according to one or more embodiments.

Aspects and features of embodiments of the present disclosure and methods of accomplishing the same may be understood more readily by reference to the following detailed description of embodiments and the accompanying drawings.

However the present disclosure is not limited to the embodiments described hereinafter, and may be embodied in many different forms, and the following embodiments are provided to make the present disclosure complete and to allow those skilled in the art to clearly understand the scope of the present disclosure, and the present disclosure is also defined by the scope of the appended claims and their equivalents.

It will be understood that when an element or a layer is referred to as being 'on' another element or layer, it can be directly on another element or layer, or intervening element or layer may also be present. Throughout the specification, the same reference numerals denote the same constituent elements.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the present disclosure. Singular forms are intended to include plural forms unless the context clearly indicates otherwise.

Hereinafter, embodiments of the present disclosure will be described in detail with reference to the accompanying drawings. The same or similar reference numerals are used for the same constituent elements on the drawing.

Figure 1B:
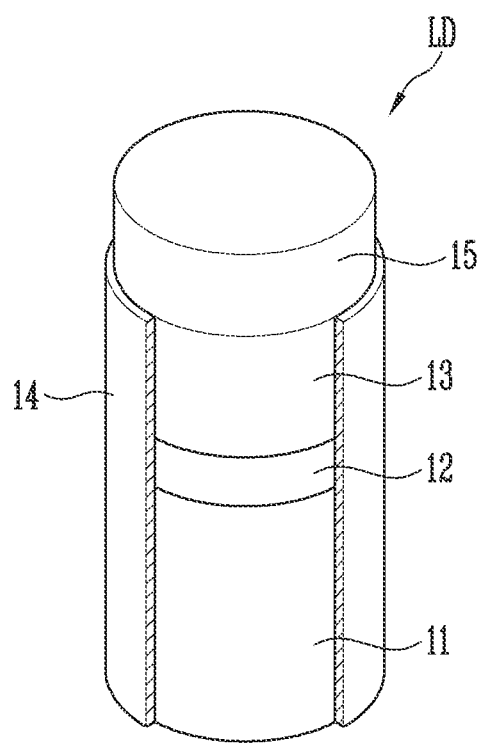

FIG. 1A and FIG. 1B illustrate cutaway perspective views of a light emitting element according to one or more embodiments.

Referring to FIG. 1A and FIG. 1B, a light emitting element LD according to one or more embodiments of the present disclosure may include a first semiconductor layer 11, a second semiconductor layer 13, and an active layer 12 interposed between the first and second semiconductor layers 11 and 13. For example, the light emitting element LD may be implemented as a stacked body in which the first semiconductor layer 11, the active layer 12, and the second semiconductor layer 13 are sequentially stacked.

According to one or more embodiments of the present disclosure, the light emitting element LD may be provided to have a rod shape extending along one direction. When an extending direction of the light emitting element LD is referred to as a length direction, the light emitting element LD may be provided with a first end portion and a second end portion along the length direction.

In the described embodiment of the present disclosure, one of the first and second semiconductor layers 11 and 13 may be disposed at the first end portion, and the other one of the first and second semiconductor layers 11 and 13 may be disposed at the second end.

In the described embodiment of the present disclosure, the light emitting element LD may be provided to have a rod shape. Here, the term "rod shape" may include a rod-like shape or a bar-like shape long in the length direction (that is, an aspect ratio larger than 1), such as a cylindrical or polygonal pillar. For example, a length of the light emitting element LD may be larger than a diameter thereof. However, the present disclosure is not limited thereto. For example, it may be a light emitting element having a core-shell structure.

The light emitting element LD may be manufactured to have, for example, a diameter and/or a length of about a micro-scale or a nano-scale. For example, the diameter of the light emitting element LD may be 600 nm or less, and the length of the light emitting element LD may be 4 μm or less, but the size of the light emitting element LD is not limited thereto, and the size of the light emitting element LD may be changed to meet requirements of the display device to which the light emitting element LD is applied.

For example, the first semiconductor layer 11 may include at least one n-type semiconductor layer. For example, the first semiconductor layer 11 may include a semiconductor material of one of InAlGaN, GaN, AlGaN, InGaN, AlN, and InN, and may include a semiconductor layer doped with a first dopant such as Si, Ge, Sn, or the like. The material included in the first semiconductor layer 11 is not limited thereto, and the first semiconductor layer 11 may be made of various materials.

The active layer 12 is formed on the first semiconductor layer 11, and may be formed to have a single or multi-quantum well structure. The active layer 12 may emit light having a wavelength of 400 nm to 900 nm. According to the described embodiment of the present disclosure, a dopant-doped cladding layer may be formed on an upper portion and/or lower portion of the active layer 12. For example, the cladding layer may be implemented as an AlGaN layer or an InAlGaN layer. In addition, a material such as AlGaN and AlInGaN may be used to form the active layer 12, and in addition, various materials may form the active layer 12.

When an electric field of a suitable voltage (e.g., a set or predetermined voltage) or more is applied to respective end portions of the light emitting element LD, the light emitting element LD emits light while electron-hole pairs are combined in the active layer 12. By controlling the light emitted from the light emitting element LD by using this principle, the light emitting element LD may be used as a light source for various light emitting devices in addition to pixels of a display device.

The second semiconductor layer 13 is provided on the active layer 12, and may include a semiconductor layer of a type different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a semiconductor layer doped with a second dopant such as Mg. The material included in the second semiconductor layer 13 is not limited thereto, and the second semiconductor layer 13 may be formed of various materials.

According to the described embodiment of the present disclosure, the light emitting element LD may additionally include a phosphor layer, another active layer, another semiconductor layer, and/or an electrode layer in an upper portion and/or a lower portion of each of the first semiconductor layer 11, the active layer 12, and the second semiconductor layer 13 described above.

As an example, the light emitting element LD may further include at least one electrode layer disposed at one end (for example, an upper surface) side of the second semiconductor layer 13 or at one end (for example, a lower surface) side of the first semiconductor layer 11. For example, the light emitting element LD may further include an electrode layer 15 disposed at one end side of the second semiconductor layer 13 as shown in FIG. 1B. The electrode layer 15 may be an ohmic electrode, but is not limited thereto. In addition, the electrode layer 15 may include a metal or a metal oxide, and for example, chromium (Cr), titanium (Ti), aluminum (Al), gold (Au), nickel (Ni), ITO, and oxides or alloys thereof may be used alone or in combination for the electrode 15, but the present disclosure is not limited thereto. In addition, in one or more embodiments, the electrode layer 15 may be substantially transparent or translucent. Accordingly, light generated by the light emitting element LD may pass through the electrode layer 15 to be emitted to the outside of the light emitting element LD.

In addition, the light emitting element LD may further include an insulation film 14 around (or surrounding) an outer surface (e.g., an outer peripheral or circumferential surface) of the light emitting element. However, according to the described embodiment of the present disclosure, the insulation film 14 may be omitted, or it may be provided so as to cover only some of the first semiconductor layer 11, the active layer 12, and the second semiconductor layer 13. For example, the insulation film 14 may be provided at a portion other than both end portions of the light emitting element LD, so that both end portions of the light emitting element LD may be exposed.

For convenience of description, FIG. 1A and FIG. 1B illustrate a structure in which a portion of the insulation film 14 is eliminated, and an entire lateral surface of an actual light emitting element LD may be surrounded by the insulation film 14.

According to the described embodiment of the present disclosure, the insulation film 14 may include a transparent insulation material. For example, the insulation film 14 may include at least one or more insulation materials among $SiO_2$, $Si_3N_4$, $Al_2O_3$, and $TiO_2$, but is not limited thereto, and various materials having an insulation characteristic may be used therefor.

The insulation film 14 may prevent an electrical short circuit that may occur when the active layer 12 contacts conductive materials other than the first semiconductor layer 11 and the second semiconductor layer 13. In addition, by forming the insulation film 14, a surfacial defect of the light emitting element LD may be reduced or minimized, thereby improving lifetime and efficiency. In addition, when a plurality of light emitting elements LD are closely disposed, the insulation film 14 may prevent an unwanted short circuit that may occur between respective light emitting elements LD.

The type, structure, and shape of the light emitting element LD according to the described embodiment of the present disclosure may be variously changed.

FIG. 2 illustrates a schematic top plan view of a display device according to one or more embodiments.

Referring to FIG. 1A to FIG. 2, a display device 1000 may include a substrate SUB and a plurality of pixels PXL provided on the substrate SUB. For example, the display device 1000 may include a display area DA in which an image is displayed and a non-display area NDA excluding the display area DA. The non-display area NDA may be around (or may surround) the display area along the edge or periphery of the display area DA.

The display area DA may be an area in which the pixels PXL are provided. The non-display area NDA may be an area in which drivers for driving the pixels PXL and various wire parts connecting the pixels PXL and the drivers are provided.

The display area DA may have various shapes. For example, the display area DA may be provided in various shapes such as a closed polygon including a side formed of a straight line, a circle, an ellipse, and the like including a side formed of a curved line, a semicircle, semi-ellipse, and the like including a side formed of a straight line and a curved line.

When the display area DA includes a plurality of areas, each area may also be provided in various shapes such as a closed polygon including a side formed of a straight line, a semicircle, a semi-ellipse, and the like including a side formed of a curved line. In addition, areas of a plurality of areas may be the same as or different from each other.

In the embodiment of the present disclosure, a case in which the display area DA is provided as one area having a quadrangle shape including a side of a straight line will be described as an example.

The non-display area NDA may be provided at least one side of the display area DA. In the described embodiment of the present disclosure, the non-display area NDA may surround the display area DA along the edge or periphery of the display area DA.

The pixels PXL may be provided in the display area DA on the substrate SUB. Each of the pixels PXL may include at least one light emitting element LD driven by a corresponding scan signal and data signal.

The pixels PXL may include a light emitting element emitting white light and/or color light. Each of the pixels PXL may emit one of red, green and blue colors, but is not limited thereto. For example, each of the pixel PXL may emit one of cyan, magenta, yellow and white colors.

For example, the pixels PXL may include a first pixel PXL1 emitting light of a first color, a second pixel PXL2 emitting light of a second color different from the first color, and a third pixel PXL3 emitting light of a third color different from the first color and the second color. At least one first pixel PXL1, at least one second pixel PXL2, and at least one third pixel PXL3 disposed adjacent to each other may configure one pixel unit PXU that may emit light of various colors.

In one or more embodiments, the first pixel PXL1 may be a red pixel that emits red light, the second pixel PXL2 may be a green pixel that emits green light, and the third pixel PXL3 may be a blue pixel that emits blue light. In the described embodiment, the first pixel PXL1, the second pixel PXL2, and the third pixel PXL3 are provided with a first color light emitting element, a second color light emitting element, and a third color light emitting element as a light source, respectively, so that they respectively emit light of the first color, second color, and third color. In one or more embodiments, the first pixel PXL1, the second pixel PXL2, and the third pixel PXL3 are provided with light emitting elements of the same color, and include color conversion layers of different colors disposed on respective light emitting elements, so that they may emit light of the first color, the second color, and the third color, respectively.

However, the color, type, and/or number of pixels PXL configuring each pixel unit PXU are not particularly limited.

A plurality of pixels PXL may be provided and arranged along a first direction DR1 and a second direction DR2 crossing the first direction DR1. The arrangement form of the pixels PXL is not particularly limited, and the pixels PXL may be arranged in various forms.

The driver provides a signal to each pixel PXL through a wire part, and thus may control driving of each pixel PXL. In FIG. 2, the wire part is omitted for convenience of description.

The driver may include a scan driver SDV that provides a scan signal to the pixels PXL through a scan line, an emission driver EDV that provides an emission control signal to the pixels PXL through an emission control line, a data driver DDV that provides a data signal to the pixels PXL through a data line, and a timing controller. The timing controller may control the scan driver SDV, the emission driver EDV, and the data driver DDV.

In the described embodiment, each of the pixels PXL may be formed of an active pixel. However, a type, structure and/or driving method of the pixels PXL capable of being applied to the present disclosure is not particularly limited.

Figure 3A:
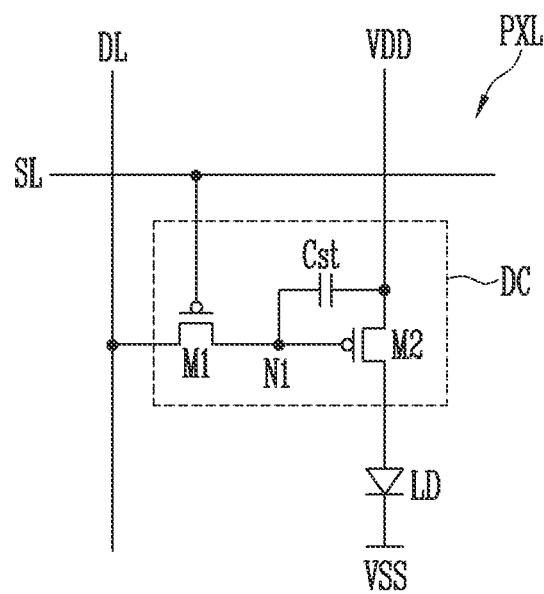
FIGS. 3A to 3C illustrate circuit diagrams of a pixel according to one or more embodiments.
Figure 3B:
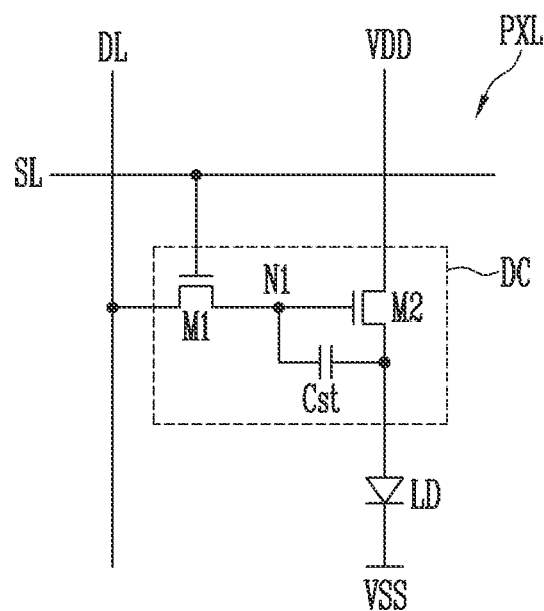
Figure 3C:
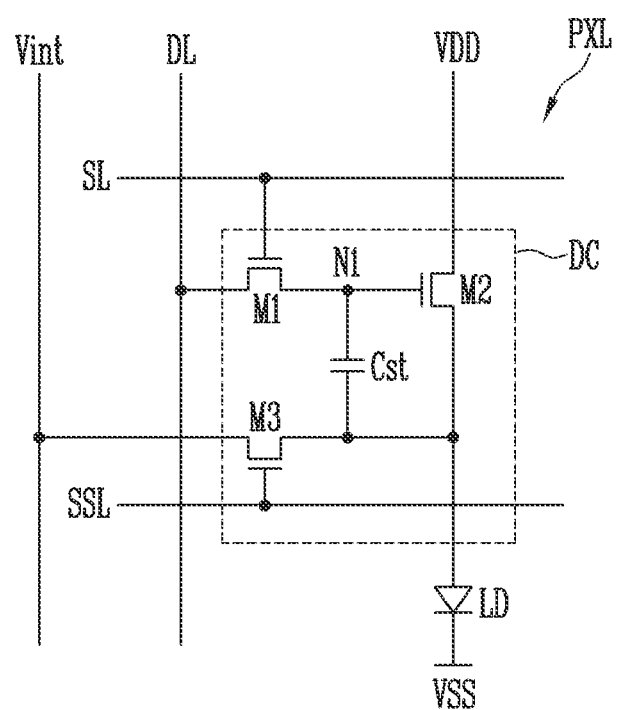

FIG. 3A to FIG. 3C illustrate circuit diagrams of a pixel according to one or more embodiments. Particularly, FIG. 3A and FIG. 3B illustrate examples of pixels configuring a light emitting display panel of an active type.

Referring to FIG. 3A, the pixel PXL may include at least one light emitting element LD and a pixel driving circuit DC connected thereto to drive the light emitting element LD.

A first electrode (for example, anode electrode) of the light emitting element LD may be connected to a first driving power source VDD via the pixel driving circuit DC, and a second electrode (for example, cathode electrode) of the light emitting element LD may be connected to a second power driving source VSS.

The first driving power source VDD and the second driving power source VSS may have different potentials. For example, a potential of the second driving power source VSS may be lower than a potential of the first driving power source VDD by a threshold voltage of the light emitting element LD or more.

The light emitting element LD may emit light with luminance corresponding to a driving current controlled by the pixel driving circuit DC.

Although FIG. 3A illustrates the embodiment in which only one light emitting element LD is included in one pixel PXL, the present disclosure is not limited thereto. For example, the pixel PXL may include a plurality of light emitting elements that are connected to each other in parallel and/or in series.

According to the described embodiment of the present disclosure, the pixel driving circuit DC may include a first transistor M1, a second transistor M2, and a storage capacitor Cst. However, the structure of the pixel driving circuit DC is not limited to the embodiment shown in FIG. 3A. In one or more embodiments, the pixel PXL may further include a pixel sensing circuit. The pixel sensing circuit may measure a value of a driving current of each pixel PXL, and may transmit the measured value to an external circuit (for example, a timing controller) so that respective pixels PXL may be compensated.

A first electrode of the first transistor M1 (e.g., a switching transistor) may be connected to a data line DL, and a second electrode thereof may be connected to a first node N1. Here, the first electrode and the second electrode of the first transistor M1 may be different electrodes, and for example, when the first electrode is a source electrode, the second electrode may be a drain electrode. A gate electrode of the first transistor M1 may be connected to a scan line SL.

The first transistor M1 is turned on when a scan signal of a voltage at which the first transistor M1 may be turned on (for example, a gate-on voltage or a low-level voltage) is supplied from the scan line SL, so that it may electrically connect the data line DL and the first node N1. In this case, a data signal of a corresponding frame is supplied to the data line DL, and accordingly, the data signal may be transmitted to the first node N1. The data signal transmitted to the first node N1 may be stored in the storage capacitor Cst.

A first electrode of the second transistor M2 (e.g., a driving transistor) may be connected to the first driving power source VDD, and a second electrode may be electrically connected to the first electrode (for example, anode electrode) of the light emitting element LD. A gate electrode of the second transistor M2 may be connected to the first node N1. The second transistor M2 may control an amount of a driving current supplied to the light emitting elements LD in response to a voltage of the first node N1.

One electrode of the storage capacitor Cst may be connected to the first driving power source VDD, and the other electrode may be connected to the first node N1. The storage capacitor Cst may be charged with the voltage (e.g., may hold a charge) corresponding to the data signal supplied to the first node N1, and may maintain the charged voltage until a data signal of a next frame is supplied.

For better understanding and ease of description, FIG. 3A illustrates the relatively simple driving circuit DC including the first transistor M1 for transmitting the data signal into the pixel PXL, the storage capacitor Cst for storing the data signal, and the second transistor M2 for supplying a driving current corresponding to the data signal to the light emitting element LD.

However, the present disclosure is not limited thereto, and the structure of the driving circuit DC may be variously changed. For example, the driving circuit DC may additionally include at least one transistor such as a transistor for compensating a threshold voltage of the second transistor T2, a transistor for initializing the first node N1, and/or a transistor for controlling an emission time of the light emitting element LD, or other circuit elements such as a boosting capacitor for boosting the voltage of the first node N1.

In addition, transistors included in the driving circuit DC, for example, both the first and second transistors M1 and M2 are shown as P-type transistors in FIG. 3A, but the present disclosure is not limited thereto. That is, at least one of the first and second transistors M1 and M2 included in the driving circuit DC may be changed to an N-type transistor.

For example, referring to FIG. 3B, the first and second transistors M1 and M2 of the driving circuit DC may be implemented as N-type transistors. The driving circuit DC shown in FIG. 3B is similar in configuration or operation to the driving circuit DC shown in FIG. 3A except for a change of a connection position of some constituent elements due to a change of a transistor type. Therefore, a detailed description thereof will be omitted.

Referring to FIG. 3C, in some embodiments, the pixel PXL may further include a third transistor M3 (e.g., a sensing transistor).

A gate electrode of the third transistor M3 may be connected to a sensing line SSL. One electrode of the third transistor M3 may be connected to an initialization power source Vint, and the other electrode thereof may be connected to the anode electrode of the light emitting element LD. The third transistor M3 may transmit an initialization voltage to the pixel PXL according to a sensing signal supplied to the sensing line SSL or may sense a voltage value at the anode electrode of the light emitting element LD.

Figure 4:
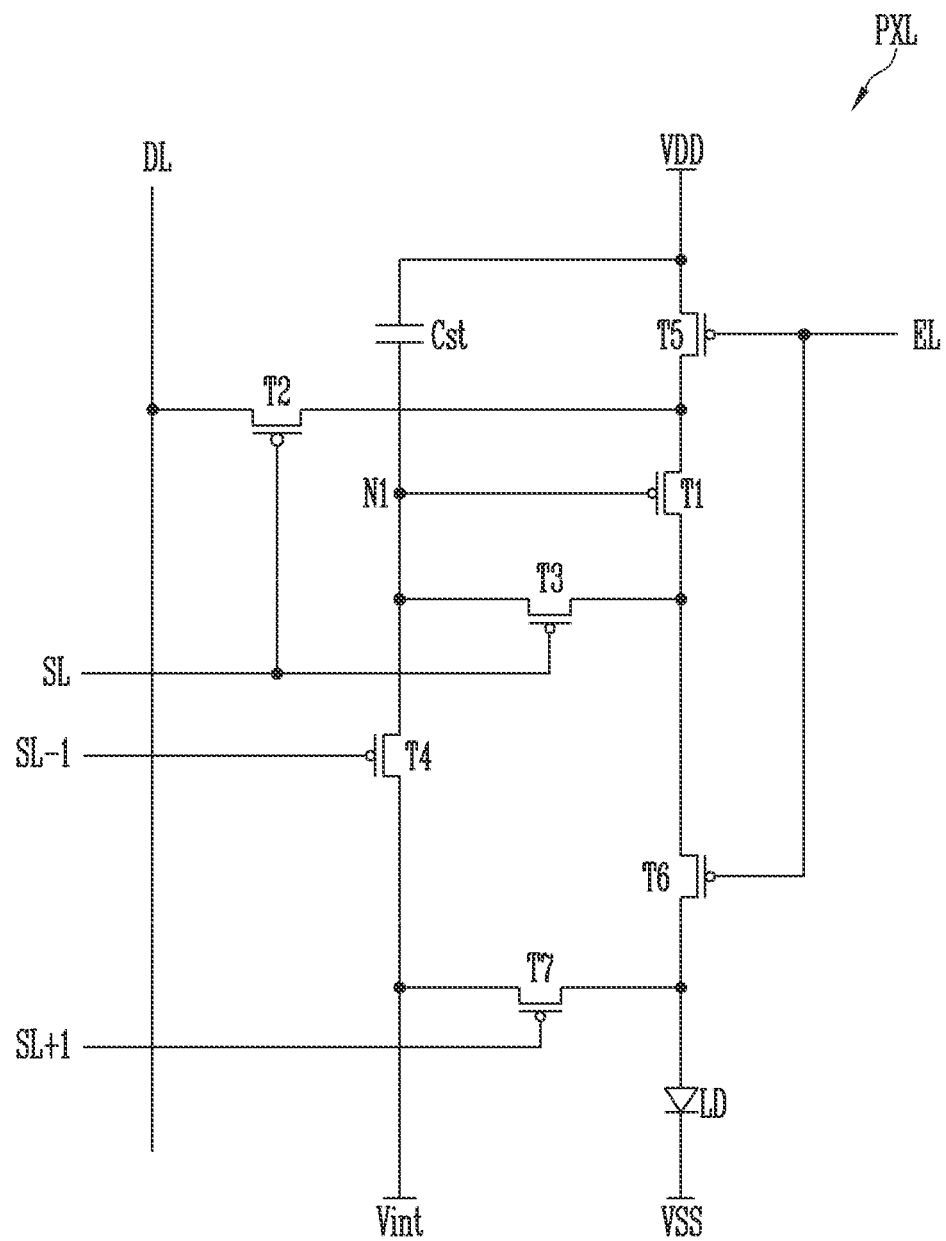
FIG. 4 illustrates a circuit diagram of a pixel according to one or more embodiments.

FIG. 4 illustrates a circuit diagram of a pixel according to one or more embodiments.

Referring to FIG. 4, the pixel PXL according to one or more embodiments of the present disclosure may include a light emitting element LD, first to seventh transistors T1, T2, T3, T4, T5, T6, and T7, and a storage capacitor Cst.

A first electrode (for example, anode electrode) of the light emitting element LD may be connected to the first transistor T1 via the sixth transistor T6, and a second electrode (for example, cathode electrode) of the light emitting element LD may be connected to the second driving power source VSS. The light emitting element LD may emit light with desired luminance (e.g., set or predetermined luminance) corresponding to an amount of current supplied from the first transistor T1.

One electrode of the first transistor T1 (e.g., a driving transistor) may be connected to the first driving power source VDD via the fifth transistor T5, and the other electrode thereof may be connected to the first electrode of the light emitting element LD via the sixth transistor T6. The first transistor T1 may control an amount of current flowing from the first driving power source VDD to the second driving power source VSS via the light emitting element LD in response to a voltage of the first node N1 which is a gate electrode of the first transistor T1.

The second transistor T2 (e.g., a switching transistor) may be connected between the data line DL and one electrode of the first transistor T1. In addition, a gate electrode of the second transistor T2 may be connected to the scan line SL. The second transistor T2 may be turned on when a scan signal of a gate-on voltage (e.g., a low level voltage) is supplied to the scan line SL to electrically connect the data line DL and one electrode of the first transistor T1.

The third transistor T3 may be connected between the other electrode of the first transistor T1 and the first node N1. In addition, a gate electrode of the third transistor T3 may be connected to the scan line SL. The third transistor T3 may be turned on when a scan signal of a gate-on voltage (e.g., a low level voltage) is supplied to the scan line SL to electrically connect the other electrode of the first transistor T1 and the first electrode N1.

The fourth transistor T4 may be connected between the first node N1 and the initialization power source Vint. In addition, a gate electrode of the fourth transistor T4 may be connected to a previous scan line SL−1. The fourth transistor T4 may be turned on when a scan signal of a gate-on voltage (e.g., a low level voltage) is supplied to the previous scan line SL−1 to supply a voltage of the initialization power source Vint to the first node N1. Here, the initialization power source Vint may be set to a voltage lower than the data signal.

The fifth transistor T5 may be connected between the first driving power source VDD and one electrode of the first transistor T1. A gate electrode of the fifth transistor T5 may be connected to an emission control line EL. The fifth transistor T5 may be turned on when an emission control signal of a gate-on voltage (e.g., a low level voltage) is supplied to the emission control line EL, and may be turned off when an emission control signal of a gate-off voltage (e.g., a high level voltage) is supplied to the emission control line EL.

The sixth transistor T6 may be connected between the other electrode of the first transistor T1 and the first electrode of the light emitting element LD. A gate electrode of the sixth transistor T6 may be connected to the emission control line EL. The sixth transistor T6 may be turned on when an emission control signal of a gate-on voltage (e.g., a low level voltage) is supplied to the emission control line EL, and may be turned off when an emission control signal of a gate-off voltage (e.g., a high level voltage) is supplied to the emission control line EL.

The seventh transistor T7 may be connected between the initialization power source Vint and the first electrode (for example, anode electrode) of the light emitting element LD. A gate electrode of the seventh transistor T7 may be connected to a next scan line SL+1. The seventh transistor T7 may be turned on when a scan signal of a gate-on voltage (e.g., a low level voltage) is supplied to the next scan line SL+1 to supply a voltage of the initialization power source Vint to the first electrode of the light emitting element LD.

FIG. 4 illustrates the case in which a gate electrode of the seventh transistor T7 is connected to the next scan line SL+1. However, the present disclosure is not limited thereto. For example, in one or more embodiments of the present disclosure, the gate electrode of the seventh transistor T7 may be connected to the scan line SL. In this case, when the scan signal of the gate-on voltage (e.g., a low level voltage) is supplied to the scan line SL, the voltage of the initialization power source Vint may be supplied to the anode electrode of the light emitting element LD via the seventh transistor T7.

The storage capacitor Cst may be connected between the first driving power source VDD and the first node N1. A data signal and a voltage corresponding to a threshold voltage of the first transistor T1 may be stored in the storage capacitor Cst.

Although the transistors included in the driving circuit DC, for example, the first to seventh transistors T1, T2, T3, T4, T5, T6, and T7 are all shown as P-type transistors in FIG. 4, the present disclosure is not limited thereto. For example, at least one of the first to seventh transistors T1, T2, T3, T4, T5, T6, and T7 may be changed to an N-type transistor.

Figure 5:
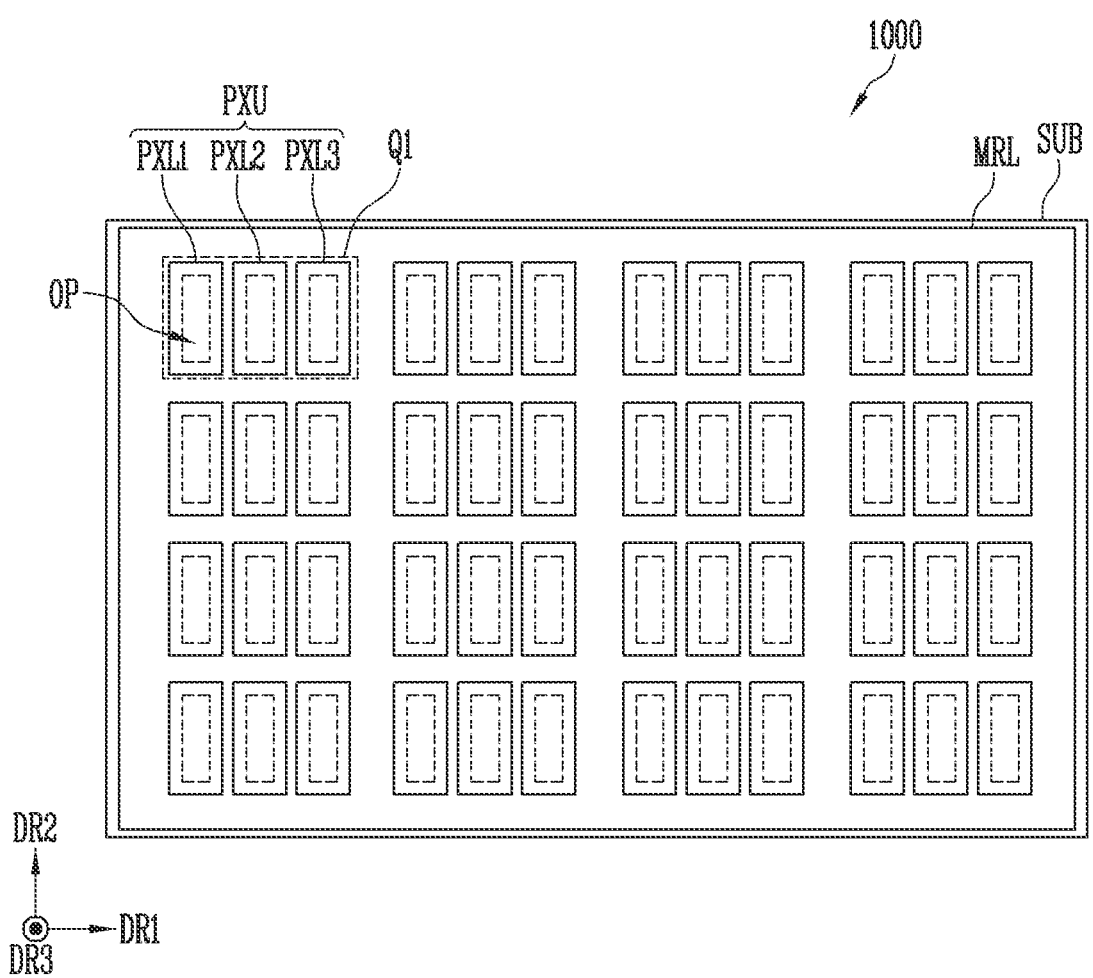
FIG. 5 illustrates a top plan view of a display device according to one or more embodiments.
Figure 6:
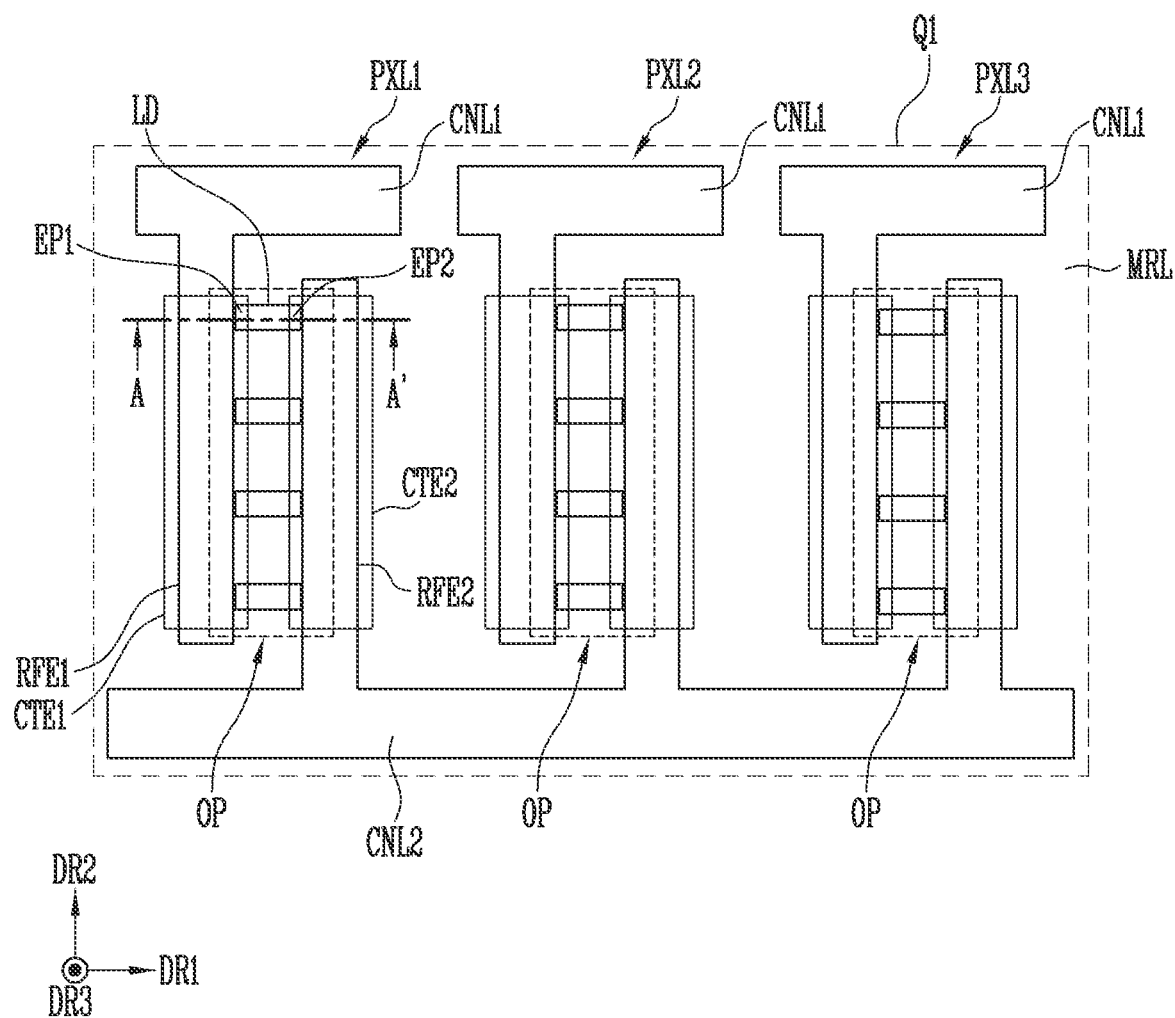
FIG. 6 illustrates an enlarged top plan view of an area Q1 of FIG. 5.

FIG. 5 illustrates a top plan view of a display device according to one or more embodiments. FIG. 6 illustrates an enlarged top plan view of an area Q1 of FIG. 5. FIG. 7A to FIG. 7D illustrate cross-sectional views of a pixel according to one or more embodiments, and illustrate cross-sectional views taken along the line A-A' of FIG. 6.

For better understanding and ease of description, hereinafter, each electrode is simplified and illustrated as a single electrode layer, but the present disclosure is not limited thereto. In the described embodiment of the present disclosure, "formed and/or provided on (or at) the same layer" may mean formed in the same process.

In addition, although FIG. 7A to FIG. 7D illustrate a cross-sectional structure of the first pixel PXL1, cross-sectional structures of other pixels may be substantially the same as or similar to it.

Figure 7A:
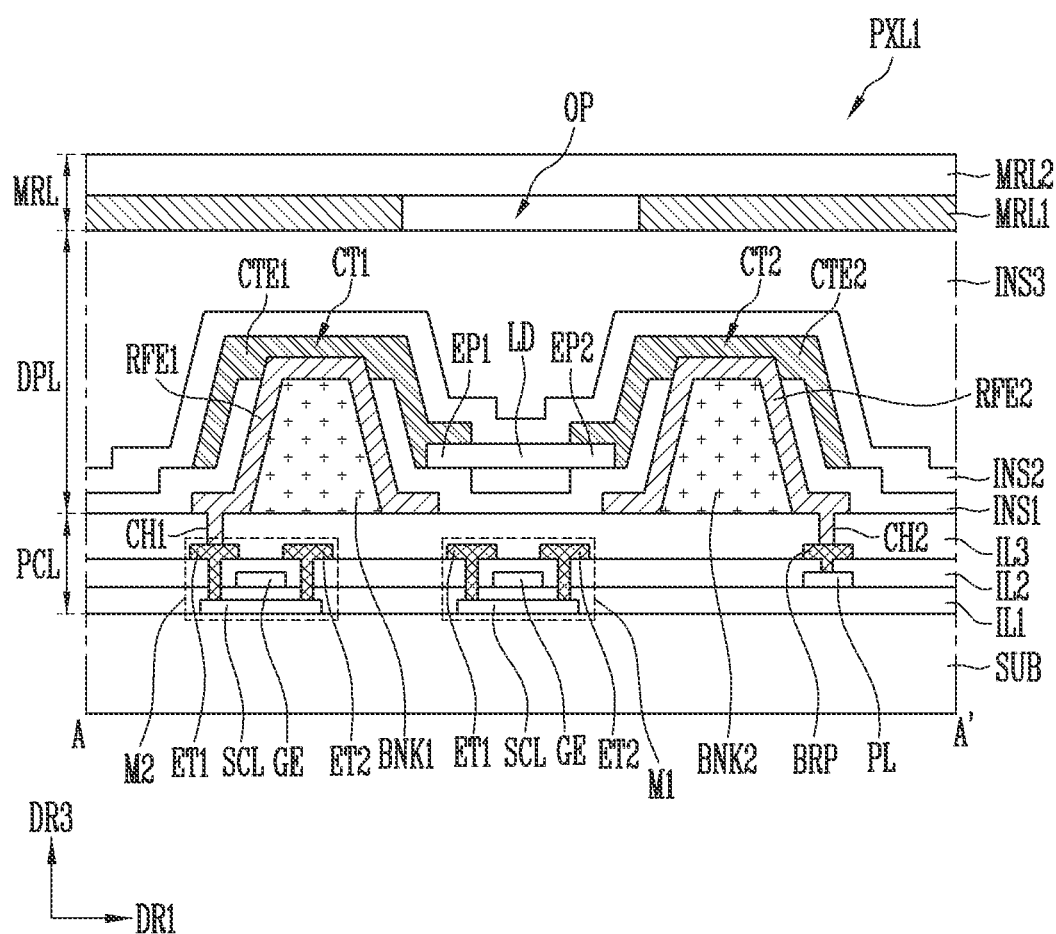
FIGS. 7A to 7D illustrate cross-sectional views of a pixel according to one or more embodiments, and illustrate cross-sectional views taken along the line A-A' of FIG. 6.

Referring to FIG. 5, FIG. 6, and FIG. 7A, as described above in FIG. 2, the display device 1000 may include the substrate SUB and the plurality of pixels PXL1, PXL2, and PXL3 provided on the substrate SUB. In addition, the display device 1000 may include a pixel circuit layer PCL, a display element layer DPL, and a reflective layer MRL sequentially disposed on the substrate SUB. The pixel circuit layer PCL, the display element layer DPL, and the reflective layer MRL may be entirely formed on the substrate SUB.

The substrate SUB may be a rigid substrate or a flexible substrate, and its material or physical properties are not particularly limited. For example, the substrate SUB may be a rigid substrate made of glass or tempered glass, or a flexible substrate made of a thin film made of plastic or metal. In addition, the substrate SUB may be a transparent substrate, but is not limited thereto. For example, the substrate SUB may be a translucent substrate, an opaque substrate, or a reflective substrate.

The pixel circuit layer PCL may include a plurality of circuit elements configuring a pixel driving circuit of each of the pixels PXL1, PXL2, and PXL3. FIG. 7A illustrates a structure in which the pixel circuit layer PCL includes the first transistor M1 and the second transistor M2 of FIG. 3A to FIG. 3C. However, the structure of the pixel circuit layer PCL is not limited thereto, and other circuit elements of FIG. 3A and FIG. 3B and FIG. 4 may be further included.

Respective transistors included in the pixel circuit layer PCL may have a substantially equivalent or similar cross-sectional structure. In addition, the structures of respective transistors are not limited to the structure illustrated in FIG. 7A.

The pixel circuit layer PCL may include a plurality of layers. For example, the pixel circuit layer PCL may include a first layer IL1, a second layer IL2, and a third layer IL3 sequentially stacked on the substrate SUB. Each of the first to third layers IL1 to IL3 may be an insulation layer including an organic insulation material or an inorganic insulation material. In addition, in one or more embodiments, the pixel circuit layer PCL may further include a buffer layer disposed between the substrate SUB and the first layer IL1. The buffer layer may prevent impurities from diffusing into each circuit element.

Each of the first and second transistors M1 and M2 may include a semiconductor layer SCL, a gate electrode GE, a first transistor electrode ET1, and a second transistor electrode ET2.

The semiconductor layer SCL may be disposed between the substrate SUB and the first layer IL1. When the pixel circuit layer PCL includes the buffer layer, the semiconductor layer SCL may be disposed between the buffer layer and the first layer IL1. The semiconductor layer SCL may include a first region contacting the first transistor electrode ET1, a second region connected to the second transistor electrode ET2, and a channel region positioned between the first and second regions. One of the first and second regions may be a source region, and the other thereof may be a drain region.

The semiconductor layer SCL may be a semiconductor pattern made of polysilicon, amorphous silicon, an oxide semiconductor, or the like. In addition, the channel region of the semiconductor layer SCL may be an intrinsic semiconductor as a semiconductor pattern that is not doped with impurities, and each of the first and second regions of the semiconductor layer SCL may be a semiconductor pattern doped with suitable impurities (e.g., set or predetermined impurities).

The gate electrode GE may be disposed between the first layer IL1 and the second layer IL2, and may overlap at least a portion of the semiconductor layer SCL in a thickness direction of the substrate (e.g., a third direction DR3). The gate electrode GE may be insulated from the semiconductor layer SCL by the first layer IL1. For example, the first layer IL1 may be a gate insulation film.

The first and second transistor electrodes ET1 and ET2 may be disposed on the second layer IL2. The first and second transistor electrodes ET1 and ET2 may be electrically connected to the semiconductor layer SCL. For example, the first and second transistor electrodes ET1 and ET2 may contact the first region and the second region of the semiconductor layer SCL through a contact hole passing through the first layer IL1 and the second layer IL2, respectively.

Although the first transistor electrode ET1 of the second transistor M2 may be electrically connected to a first electrode RFE1 of the display element layer DPL by a contact hole CH1 passing through the third layer IL3 disposed on the first transistor electrode ET1.

In addition, the pixel circuit layer PCL may include a power wire PL and a bridge pattern BRP. The power wire PL may be a wire connected to the second driving power source VSS of FIG. 3A to FIG. 3C. The power wire PL may be formed on (or at) the same layer as the gate electrode GE of the first and second transistors M1 and M2, but is not limited thereto.

The bridge pattern BRP may be disposed on the power wire PL to be electrically connected to each other. The bridge pattern BRP may be formed on (or at) the same layer as the first and second transistor electrodes ET1 and ET2 of the first and second transistors M1 and M2, but is not limited thereto.

Although the bridge pattern BRP may be electrically connected to a second electrode RFE2 of the display element layer DPL by a contact hole CH2 passing through the third layer IL3.

In the present specification, the pixel circuit layer PCL is not shown in drawings other than FIG. 7A, but this is only omitted for better understanding and ease of description, and the pixel circuit layer PCL or a constituent element corresponding thereto may be further disposed on the substrate SUB.

The display element layer DPL may be disposed on the pixel circuit layer PCL, and may include a plurality of light emitting elements LD included in each of the pixels PXL1, PXL2, and PXL3.

For example, the display element layer DPL may include first and second banks BNK1 and BNK2, first and second electrodes RFE1 and RFE2, a first insulation layer INS1, a light emitting element LD, third and fourth electrodes CTE1 and CTE2, a second insulation layer INS2, and a third insulation layer INS3, which are on the pixel circuit layer PCL (or substrate SUB).

The first bank BNK1 and the second bank BNK2 may be provided on the substrate SUB. A space in which the light emitting element LD is disposed may be provided between the first bank BNK1 and the second bank BNK2. In the described embodiment, the first bank BNK1 and the second bank BNK2 may be spaced from each other along the first direction DR1 on the substrate SUB by a length of the light emitting element LD or more.

The first bank BNK1 and the second bank BNK2 may be an insulation material including an organic material or an inorganic material, but the materials of the first bank BNK1 and the second bank BNK2 are not limited thereto.

Each of the first bank BNK1 and the second bank BNK2 may have a trapezoid shape with sides inclined at a suitable angle (e.g., a set or predetermined angle), but the shapes of the first bank BNK1 and the second bank BNK2 are not limited thereto, and they may have various shapes, such as semi-elliptical, circular, and quadrangular shape.

The first electrode RFE1 (or first pixel electrode) and the second electrode RFE2 (or second pixel electrode) may be provided on the substrate SUB, and may be disposed on the bank layer BNKL. In the described embodiment, the first electrode RFE1 and the second electrode RFE2 may be provided on the corresponding first and second banks BNK1 and BNK2, respectively. For example, the first electrode RFE1 may be provided on the first bank BNK1, and the second electrode RFE2 may be provided on the second bank BNK2.

The first electrode RFE1 and the second electrode RFE2 may be disposed with a substantially uniform thickness along surfaces of the first bank BNK1 and the second bank BNK2, and the first electrode RFE1 and the second electrode RFE2 may be correspondingly provided to the shapes of the first bank BNK1 and the second bank BNK2. For example, the first electrode RFE1 may have a shape corresponding to a slope of the first bank BNK1, and the second electrode RFE2 may have a shape corresponding to a slope of the second bank BNK2.

The first electrode RFE1 and the second electrode RFE2 may be provided to be spaced from each other along the first direction DR1 on the substrate SUB with the light emitting element LD interposed therebetween, and may be provided to extend along the second direction DR2 crossing the first direction DR1.

In the described embodiment, the first electrode RFE1 may be disposed adjacent to a first end portion EP1 of each light emitting element LD, and may be electrically connected to each light emitting element LD through the third electrode CTE1. The second electrode RFE2 may be disposed adjacent to a second end portion EP2 of each light emitting element LD, and may be electrically connected to each light emitting element LD through the fourth electrode CTE2.

The first electrode RFE1 and the second electrode RFE2 may be disposed on or at the same plane as each other, and may have the same height. When the first electrode RFE1 and the second electrode RFE2 have the same height, the light emitting element LD may be more stably connected to the first electrode RFE1 and the second electrode RFE2, respectively.

The first electrode RFE1 and the second electrode RFE2 may be made of a conductive material. The conductive material may include a metal such as Ag, Mg, Al, Pt, Pd, Au, Ni, Nd, Ir, Cr, Ti, or an alloy thereof.

In addition, the first electrode RFE1 and the second electrode RFE2 may be formed as a single film, but is not limited thereto, and may be formed as a multi-film. For example, the first electrode RFE1 and the second electrode RFE2 may further include a capping layer made of a transparent conductive material. The capping layer is disposed to cover the first electrode RFE1 and the second electrode RFE2, thereby preventing damage to the first and second electrodes RFE1 and RFE2 that may occur during the manufacturing process of the display device.

Here, the materials of the first electrode RFE1 and the second electrode RFE2 are not limited to the above-described materials. For example, the first electrode RFE1 and the second electrode RFE2 may be made of a conductive material having a constant reflectivity. When the first electrode RFE1 and the second electrode RFE2 are made of a conductive material having a constant reflectivity, light emitted from both end portions EP1 and EP2 of the light emitting element LD may proceed in an image display direction (for example, the third direction DR3).

For example, because the first electrode RFE1 and the second electrode RFE2 have shapes corresponding to the shapes of the first bank BNK1 and the second bank BNK2, the light emitted from both end portions EP1 and EP2 of each of the light emitting elements LD may be reflected by the first electrode RFE1 and the second electrode RFE2 to further proceed in the third direction DR3. Accordingly, light output efficiency of the display device may be improved.

One of the first and second electrodes RFE1 and RFE2 may be an anode electrode, and the other thereof may be a cathode electrode.

As shown in FIG. 6, the first electrode RFE1 may be connected to a first connection wire CNL1, and the second electrode RFE2 may be connected to a second connection wire CNL2. In the described embodiment, the first connection wire CNL1 may be provided integrally with the first electrode RFE1, and the second connection wire CNL2 may be provided integrally with the second electrode RFE2. In one or more embodiments, the first connection wire CNL1 and the second connection wire CNL2 may be separately formed from the first electrode RFE1 and the second electrode RFE2 to be electrically connected thereto through a separate via hole or a separate contact hole.

Referring further to FIG. 3A, the first electrode RFE1 and the second electrode RFE2 may be electrically connected to the pixel driving circuit DC and the second driving power source VSS through the first connection wire CNL1 and the second connection wire CNL2, respectively.

The first electrode RFE1 and the second electrode RFE2 may be respectively connected to the first end portion EP1 and the second end portion EP2 of the light emitting element LD to provide a driving signal to the light emitting element LD, and the light emitting element LD may emit light of a desired luminance (e.g., a set or predetermined luminance) may be emitted in response to a driving current provided from the driving circuit DC.

The first insulation layer INS1 may be provided on the first electrode RFE1 and the second electrode RFE2. The first insulation layer INS1 may be entirely provided on the substrate SUB to cover the first and second banks BNK1 and BNK2 and the first and second electrodes RFE1 and RFE2, which are described above. In addition, the first insulation layer INS1 may be disposed along a surface of the substrate SUB on which the first and second banks BNK1 and BNK2 and the first and second electrodes RFE1 and RFE2 are not disposed.

The first insulation layer INS1 may be provided between the substrate SUB and each light emitting element LD. In the described embodiment, the first insulation layer INS1 may be an inorganic insulation layer made of an inorganic material. In this case, the first insulation layer INS1 may be disposed with a substantially uniform thickness along surfaces of the substrate SUB and the first and second electrodes RFE1 and RFE2, and at least a partial empty space may be formed between the first insulation layer INS1 and the light emitting element LD.

Figure 7B:
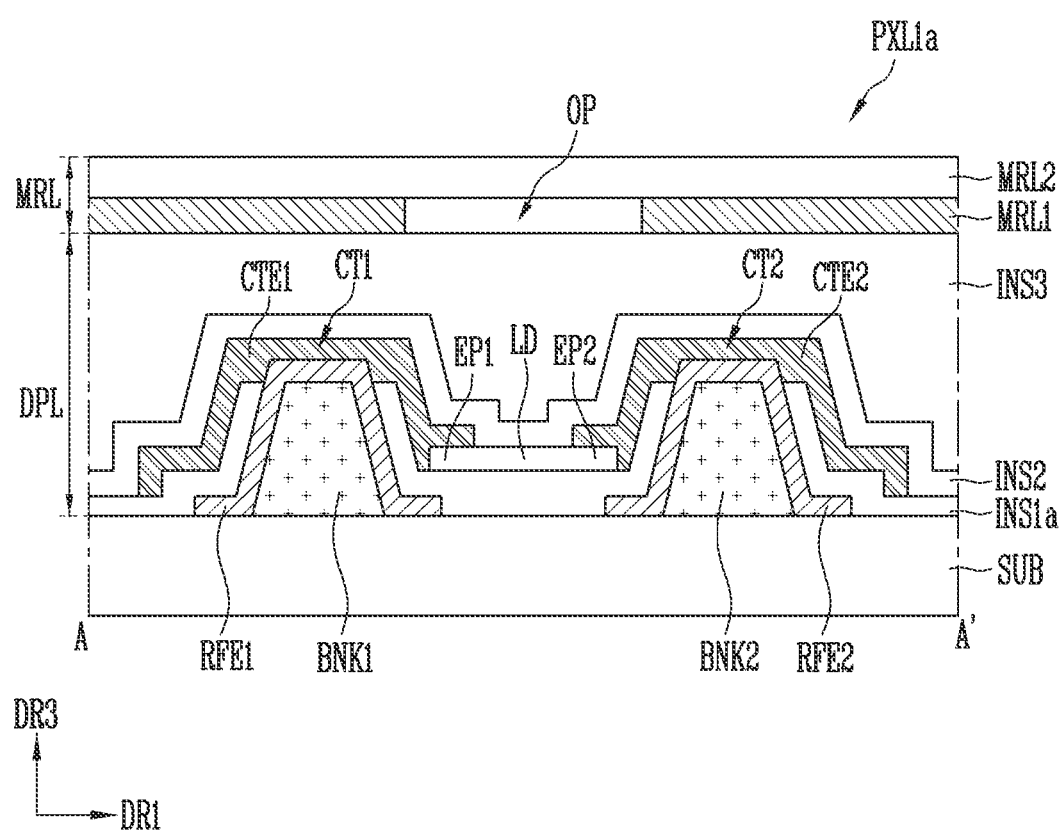

In one or more embodiments, the first insulation layer INS1 may include an organic insulation film made of an organic material. For example, as shown in FIG. 7B, a first pixel PXL1*a* (or the display element layer DPL) may include a first insulation layer INS1*a* including an organic insulation film. In this case, the first insulation layer INS1*a* may fill the space between the substrate SUB and the light emitting element LD, and may stably support the light emitting element LD.

Figure 7C:
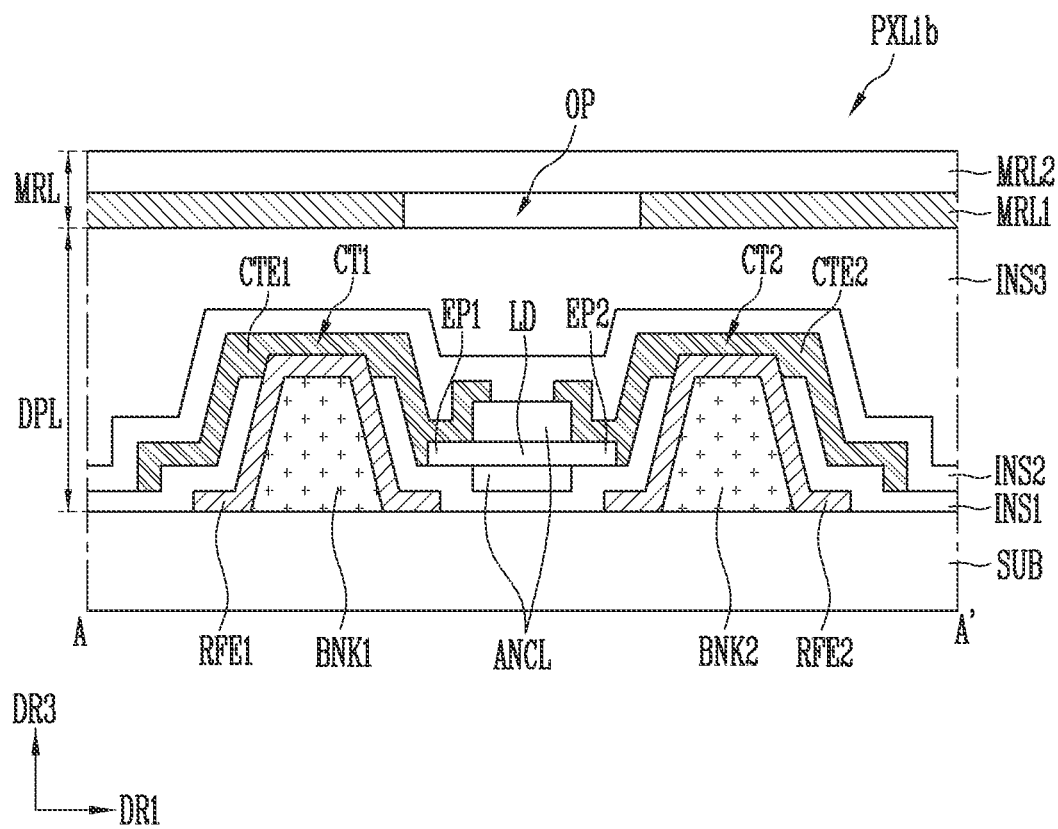
Figure 7D:
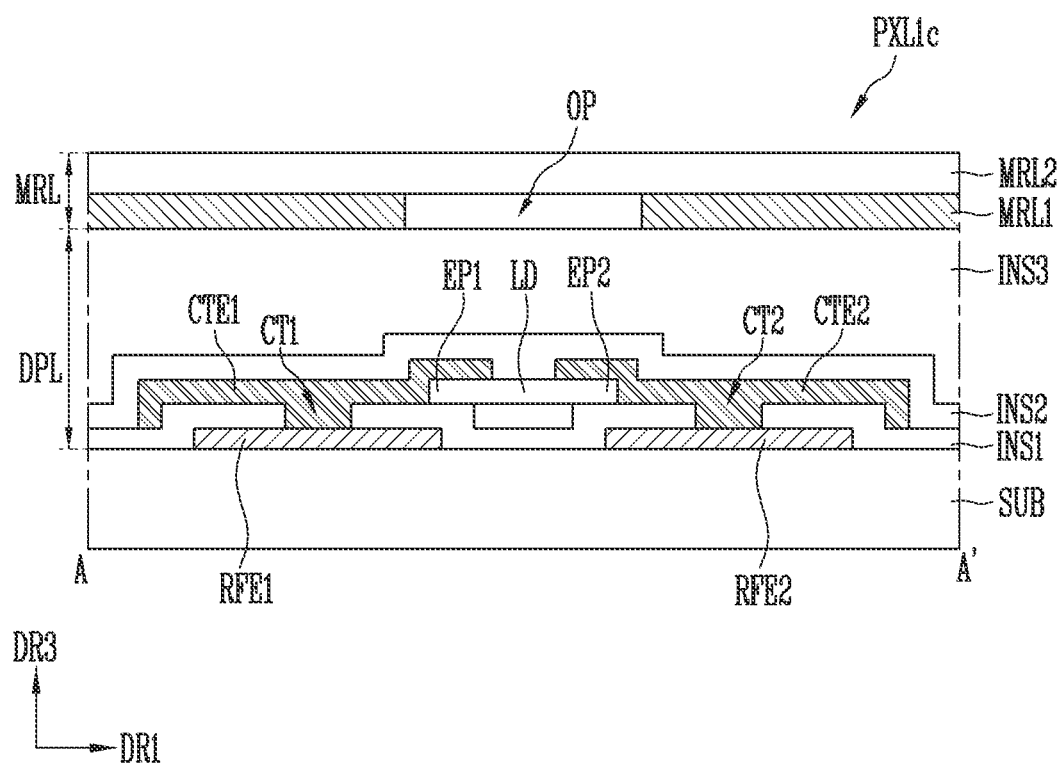

In one or more embodiments, the display element layer DPL may further include a fixing layer for fixing the light emitting element LD. For example, as shown in FIG. 7C, a first pixel PXL1*b* (or the display element layer DPL) may further include an anchoring layer ANCL disposed on the first insulation layer INS1. The anchoring layer ANCL may include an organic insulation film made of an organic material, but is not limited thereto. The anchoring layer ANCL fills a space between the light emitting element LD and the first insulation layer INS1, and is formed to be around (or to surround) the light emitting element LD, so that it allows the light emitting element LD to be more stably disposed on and fixed to the first insulation layer INS1.

The first insulation layer INS1 may include a first contact portion CT1 (or a first area) and a second contact portion CT2 (or a second area). The first contact portion CT1 and the second contact portion CT2 may expose at least a portion of the first electrode RFE1 and the second electrode RFE2.

The first and second contact portions CT1 and CT2 may be formed on corresponding first and second banks BNK1 and BNK2, respectively. For example, the first contact portion CT1 may be formed on the first bank BNK1, and the second contact portion CT2 may be formed on the second bank BNK2.

The first contact portion CT1 and the second contact portion CT2 may have a thickness and/or depth corresponding to a thickness of the first insulation layer INS1. That is, the first contact portion CT1 and the second contact portion CT2 may completely penetrate the first insulation layer INS1 in the corresponding area. Accordingly, the first and second electrodes RFE1 and RFE2 may be exposed to the outside to contact third and fourth electrodes CTE1 and CTE2, which will be described later.

The light emitting element LD may be disposed on the first insulation layer INS1. The light emitting element LD may be disposed in a space formed by the first bank BNK1 and the second bank BNK2, and may be electrically connected between the first electrode RFE1 and the second electrode RFE2. The first end portion EP1 of the light emitting element LD may be electrically connected to the first electrode RFE1, and the second end portion EP2 of the light emitting element LD may be electrically connected to the second electrode RFE2.

The third electrode CTE1 (or first contact electrode) and the fourth electrode CTE2 (or second contact electrode) may be provided on the first insulation layer INS1 and the light emitting element LD.

The third electrode CTE1 and the fourth electrode CTE2 may partially overlap one of both end portions EP1 and EP2 of each light emitting element LD. For example, the third electrode CTE1 may partially overlap the first end portion EP1 of each light emitting element LD, and the fourth electrode CTE2 may partially overlap the second end portion EP2 of each light emitting element LD.

The third electrode CTE1 may cover the first electrode RFE1 and overlap the first electrode RFE1 when viewed in a plan view. The third electrode CTE1 may be electrically connected to the first electrode RFE1 through the first contact portion CT1 of the first insulation layer INS1.

The fourth electrode CTE2 may cover the second electrode RFE2 and overlap the second electrode RFE2 when viewed in a plan view. The fourth electrode CTE2 may be electrically connected to the second electrode RFE2 through the second contact portion CT2 of the first insulation layer INS1.

Each of the third and fourth electrodes CTE1 and CTE2 may be made of a transparent conductive material. For example, the transparent conductive material may include an ITO, an IZO, an ITZO, or the like. When the third and fourth electrodes CTE1 and CTE2 are made of a transparent conductive material, loss may be reduced when light emitted from the light emitting element LD proceeds in the third direction DR3. The materials of the third and fourth electrodes CTE1 and CTE2 are not limited to the above-described materials.

In the described embodiment, the third and fourth electrodes CTE1 and CTE2 may be provided at the same plane. That is, the third and fourth electrodes CTE1 and CTE2 may be concurrently (or simultaneously) formed. However, they are not limited thereto, as the third and fourth electrodes CTE1 and CTE2 may be provided on different planes. That is, the third and fourth electrodes CTE1 and CTE2 may be formed on different layers. In this case, an insulation pattern may be further disposed on one of the third and fourth electrodes CTE1 and CTE2, and the other thereof may be disposed on the insulation pattern.

The second insulation layer INS2 may be provided on the third electrode CTE1 and the fourth electrode CTE2. The second insulation layer INS2 may cover the third electrode CTE1 and the fourth electrode CTE2 to prevent damage to the third electrode CTE1 and the fourth electrode CTE2. In addition, the second insulation layer INS2 may serve as an encapsulation layer that prevents oxygen and moisture from penetrating into the light emitting element LD.

The second insulation layer INS2 may include an inorganic insulation film made of an inorganic material or an organic insulation film made of an organic material. The second insulation layer INS2 may be formed as a single layer as shown in the drawing, but is not limited thereto, and may be formed as a multilayer including an organic insulation film and an inorganic insulation film.

The third insulation layer INS3 may be further provided on the second insulation layer INS2. The third insulation layer INS3 may be a planarization layer that alleviates a step caused by various configurations disposed thereunder. The third insulation layer INS3 may include an organic insulation film, but is not limited thereto, and may include an inorganic insulation film. In addition, the third insulation layer INS3 may be formed as a single layer, but may be formed as a multilayer according to one or more embodiments.

The reflective layer MRL may be disposed on the display element layer DPL. For example, the reflective layer MRL may be disposed on the third insulation layer INS3 of the display element layer DPL. The reflective layer MRL may be entirely disposed on the display element layer DPL (or the substrate SUB).

The reflective layer MRL may include a first reflective layer MRL1 and a second reflective layer MRL2 disposed on the first reflective layer MRL1. The first reflective layer MRL1 and the second reflective layer MRL2 may overlap each other.

The first reflective layer MRL1 may include a material having a constant reflectivity. In the described embodiment, the first reflective layer MRL1 may include a metal such as Ag, Mg, Al, Pt, Pd, Au, Ni, Nd, Ir, Cr, or Ti. In one or more embodiments, the first reflective layer MRL1 may include an alloy, a metal nitride, a conductive metal oxide, or the like. For example, the first reflective layer MRL1 may include an aluminum-containing alloy, an aluminum nitride (AlNx), a silver-containing alloy, a tungsten nitride (WNx), a copper-containing alloy, a chromium nitride (CrNx), a molybdenum-containing alloy, a titanium nitride (TiNx), a tantalum nitride (TaNx), a strontium ruthenium oxide (SRO), a zinc oxide (ZnOx), a tin oxide (SnOx), an indium oxide (InOx), a gallium oxide (GaOx), or the like. The material included in the first reflective layer MRL1 is not limited as long as it has a constant reflectivity in addition to the above-described materials.

The first reflective layer MRL1 may be disposed to overlap the electrodes disposed thereunder. For example, the first reflective layer MRL1 may overlap at least one of the first electrode RFE1, the second electrode RFE2, the third electrode CTE1, and the fourth electrode CTE2 of the display element layer DPL.

In addition, the first reflective layer MRL1 may include a plurality of openings OP (or light transmitting portions). The opening OP may be formed to correspond to each of the pixels PXL1, PXL2, and PXL3. For example, the opening OP may be formed to at least partially overlap the light emitting element LD included in each of the pixels PXL1, PXL2, and PXL3. The light emitted from the light emitting element LD may be emitted in the display direction (for example, third direction DR3) through the opening OP.

The formation position and shape of the opening OP may be further varied. For example, the opening OP may overlap some of the light emitting elements LD included in each of the pixels PXL1, PXL2, and PXL3, and may not overlap other some thereof. In addition, the opening OP may be formed in an area overlapping at least one of the first electrode RFE1, the second electrode RFE2, the third electrode CTE1, and the fourth electrode CTE2 of the display element layer DPL.

The second reflective layer MRL2 may be entirely disposed on the first reflective layer MRL1.

The second reflective layer MRL2 may include a material having a constant reflectivity. In the described embodiment, the second reflective layer MRL2 may include a metal such as Ag, Mg, Al, Pt, Pd, Au, Ni, Nd, Ir, Cr, or Ti. In another embodiment, the second reflective layer MRL2 may include an alloy, a metal nitride, a conductive metal oxide, or the like. For example, the second reflective layer MRL2 may include an aluminum-containing alloy, an aluminum nitride (AlNx), a silver-containing alloy, a tungsten nitride (WNx), a copper-containing alloy, a chromium nitride (CrNx), a molybdenum-containing alloy, a titanium nitride (TiNx), a tantalum nitride (TaNx), a strontium ruthenium oxide (SRO), a zinc oxide (ZnOx), a tin oxide (SnOx), an indium oxide (InOx), a gallium oxide (GaOx), or the like. The material included in the second reflective layer MRL2 is not limited as long as it has a constant reflectivity in addition to the above-described materials.

The second reflective layer MRL2 may include the same material as the first reflective layer MRL1, but is not limited thereto. That is, the first reflective layer MRL1 and the second reflective layer MRL2 may include different materials. In addition, even when the first reflective layer MRL1 and the second reflective layer MRL2 include the same material (for example, metal), the purity (or content) of the material included in the first reflective layer MRL1 and the second reflective layer MRL2 may be different from each other.

Unlike the first reflective layer MRL1, the second reflective layer MRL2 may not include an opening. That is, the second reflective layer MRL2 may overlap the light emitting element LD disposed thereunder. The second reflective layer MRL2 may have a constant light transmittance. That is, the light emitted from the light emitting element LD may transmit through the first reflective layer MRL1 and the second reflective layer MRL2 to be emitted in the display direction (for example, third direction DR3). However, it is not limited thereto, and the second reflective layer MRL2 may further include an opening.

In the described embodiment, the second reflective layer MRL2 may have the same thickness as the first reflective layer MRL1, but is not limited thereto. In one or more embodiments, the thickness of the second reflective layer MRL2 may be different from that of the first reflective layer MRL1. For example, the thickness of the second reflective layer MRL2 may be thinner than that of the first reflective layer MRL1. As the thickness of the second reflective layer MRL2 is formed thinner, the light transmittance of the second reflective layer MRL2 may be improved. In another embodiment, the thickness of the second reflective layer MRL2 may be thicker than that of the first reflective layer MRL1. Even in this case, the second reflective layer MRL2 may have a light transmittance larger than or equal to a certain level.

The second reflective layer MRL2 may reduce light scattering that may occur while the light emitted from the light emitting element LD transmits through the first reflective layer MRL1, thereby improving visibility of the display device.

As described above, the reflective layer MRL may include a material having a constant reflectivity. Accordingly, the reflective layer MRL may reflect light proceeding from the outside toward the reflective layer MRL and then emit it back to the outside. That is, the reflective layer MRL may reflect an image of an object positioned in front of the display device, and may provide a mirror function to a user.

On the other hand, the above-described embodiments illustrate the structure in which the display element layer (DPL) includes the first and second banks BNK1 and BNK2, but the present disclosure is not limited thereto. For example, like the structure illustrated in FIG. 7D, a first pixel PX1c (or the display element layer DPL) may not include a bank structure. When the display device does not include a bank structure, the thickness of the display element layer DPL may be reduced, and a slimmed display device may be realized.

Figure 8A:
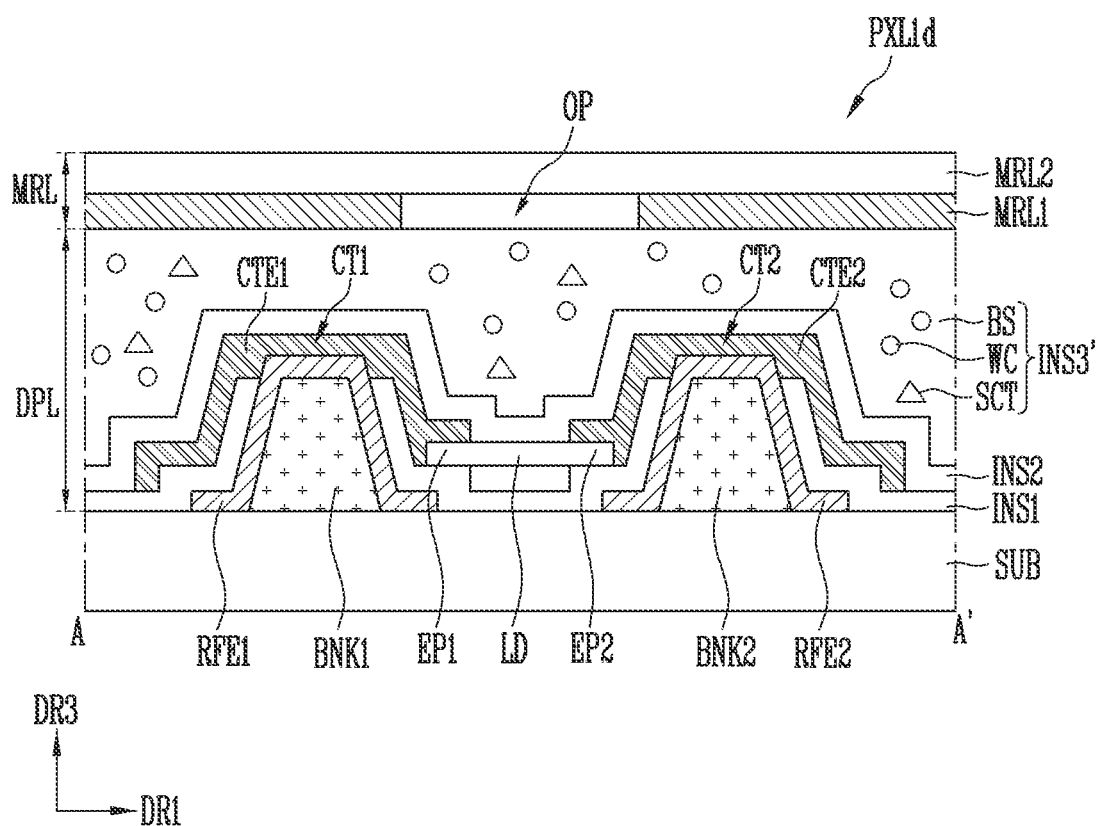
FIG. 8A and FIG. 8B illustrate cross-sectional views of a pixel according to one or more embodiments.
Figure 8B:
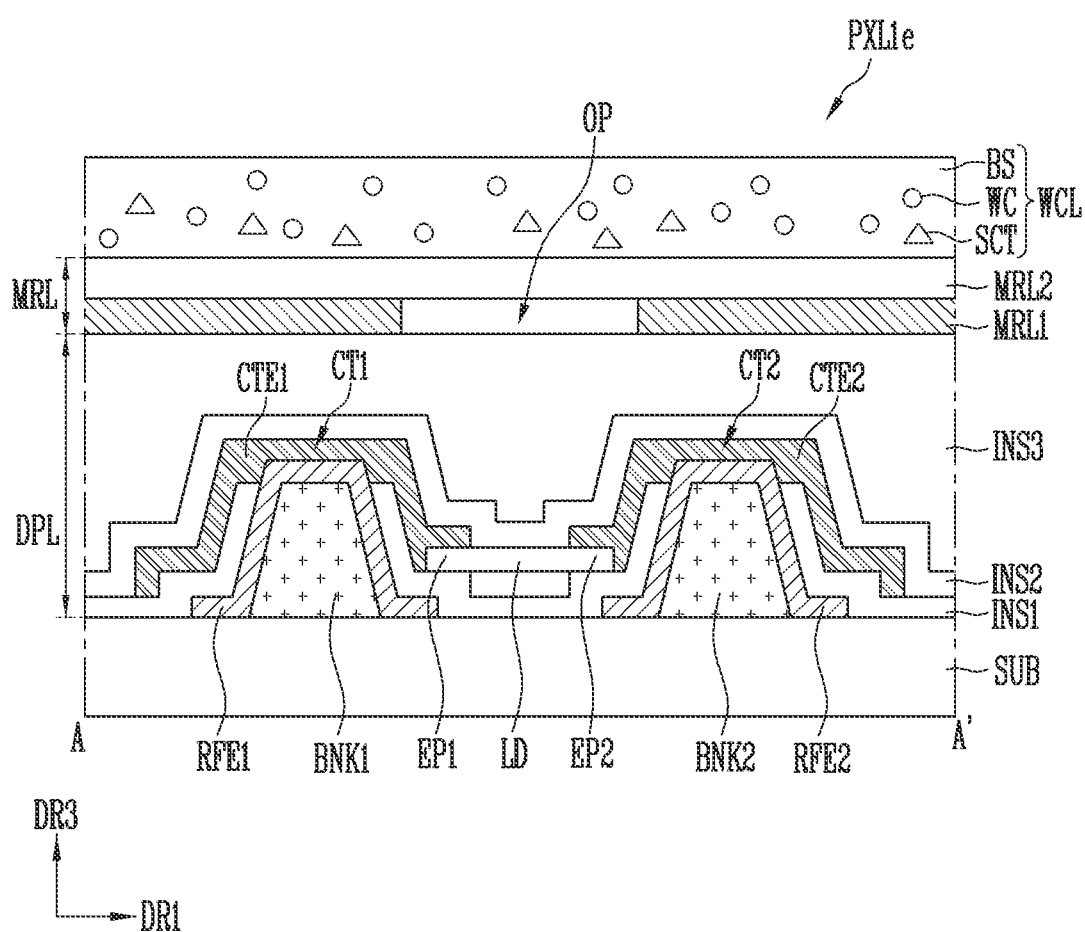

FIG. 8A and FIG. 8B illustrate cross-sectional views of a pixel according to one or more embodiments.

A display device illustrated in FIG. 8A and FIG. 8B may further include a material or material layer further including a material for converting a color (or wavelength) of light emitted from the light emitting element LD.

For example, compared with the embodiment of FIG. 7A, the embodiment of FIG. 8A is different in that a third insulation layer INS3' further includes wavelength conversion particles, and the embodiment of FIG. 8B is different in that the display device further includes a wavelength conversion layer that is disposed on the reflective layer MRL. The same components as those in the previous embodiment are denoted by the same reference numerals, and descriptions thereof will be omitted or simplified, and differences will be mainly described.

Referring to FIG. 8A, a first pixel PXL1d may include the third insulation layer INS3' including wavelength conversion particles WC. For example, the third insulation layer INS3' may include a base resin BS, and the wavelength conversion particles WC, and scattering particles SCT dispersed in the base resin BS.

The base resin BS is not particularly limited as long as it is a material having high light transmittance and excellent dispersion properties for the wavelength conversion particles WC and scattering particles SCT. For example, the base resin BS may include an organic material such as an epoxy-based resin, an acryl-based resin, a cardo-based resin, or an imide-based resin.

The wavelength conversion particles WC may convert a peak wavelength of incident light to another specific peak wavelength. That is, the wavelength conversion particles WC may convert a color of the incident light into another color.

For example, the light emitting element LD may emit blue light, and the wavelength conversion particles WC may convert the blue light provided from the light emitting element LD into light of another color to emit it. For example, the wavelength conversion particles WC may convert the blue light provided from the light emitting element LD into red light or green light to emit it.

An example of the wavelength conversion particle WC may include a quantum dot, a quantum rod, or a phosphor. The quantum dot may be a particle material that emits light of a specific wavelength while electrons transition from a conduction band to a valence band. Hereinafter, the wavelength conversion particle WC is described as being the quantum dot, but is not limited thereto.

The quantum dot may be a semiconductor nano crystal material. The quantum dot may has a specific band gap according to its composition and size to absorb incident light and then emit light with a unique wavelength. An example of the semiconductor nano crystal of the quantum dot may include a Group IV nano crystal, a Group II-VI compound nano crystal, a Group III-V compound nano crystal, a Group IV-VI nano crystal, or a combination thereof.

For example, the Group IV nano crystal may include a binary compound such as silicon (Si), germanium (Ge), silicon carbide (SiC), or silicon-germanium (SiGe), but the present disclosure is not limited thereto.

In addition, the Group II-VI compound nano crystal may include, for example, a binary element compound such as CdSe, CdTe, ZnS, ZnSe, ZnTe, ZnO, HgS, HgSe, HgTe, MgSe, MgS, and a mixture thereof, a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, or a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, but the present disclosure is not limited thereto.

In addition, the Group III-V compound nano crystal may include, for example, a binary element compound such as GaN, GaP, GaAs, GaSb, AlN, AlP, AlAs, AlSb, InN, InP, InAs, InSb, and a mixture thereof, a ternary element compound such as GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof, or a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but the present disclosure is not limited thereto.

The Group IV-VI nano crystal may include, for example, a binary element compound such as SnS, SnSe, SnTe, PbS, PbSe, PbTe, and a mixture thereof, a ternary element compound such as SnSeS, SnSeTe, SnSTe, PbSeS, PbSeTe, PbSTe, SnPbS, SnPbSe, SnPbTe, and a mixture thereof, or a quaternary element compound such as SnPbSSe, SnPbSeTe, SnPbSTe, and a mixture thereof, but the present disclosure is not limited thereto.

The form of the quantum dot may be one generally used in the art, but is not particularly limited, and for example, it may be forms such as spherical, pyramidal, multi-armed, or cubic nanotubes, nanotubes, nanowires, nanofibers, and nanoplate-shaped particles. The binary element compound, the ternary element compound, or the quaternary element compound described above may be present in particles at uniform concentrations, or they may be divided into states having partially different concentrations to be present in the same particle, respectively.

The quantum dot may have a core-shell structure including a core including the above-described nano crystal and a shell surrounding the core. An interface between the core and the shell may have a concentration gradient in which a concentration of elements of the shell decreases closer to its center. The shell of the quantum dot may serve as a passivation layer for maintaining a semiconductor characteristic and/or as a charging layer for applying an electrophoretic characteristic to the quantum dot, by preventing chemical denaturation of the core. The shell may be a single layer or multilayer. An example of the shell of the quantum dot may include an metal or nonmetal oxide, a semiconductor compound, or a combination thereof.

For example, the metal or non-metal oxide may include a binary element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiOS, and the like, or a ternary element compound such as $MgAl_2O_4$, $CoFe_2O_4$, $NiFe_2O_4$, $CoMn_2O_4$, and the like, but the present disclosure is not limited thereto.

In addition, the semiconductor compound may include, for example, CdS, CdSe, CdTe, ZnS, ZnSe, ZnTe, ZnSeS, GaAs, GaP, GaSb, HgS, HgSe, HgTe, InAs, InP, InSb, AlAs, AlP, AlSb, or the like, but the present disclosure is not limited thereto.

Light emitted by the above-described quantum dot may have a light emitting wavelength spectrum full width of half maximum (FWHM) of about 45 nm or less, thereby improving color purity and color reproducibility of the color displayed by the display device. In addition, the light emitted by the quantum dot may be emitted in several directions regardless of an incident direction of the incident light. Through this, side visibility of the display device may be improved.

The scattering particles SCT may have a refractive index different from that of the base resin BS and form an optical interface with the base resin BS. The scattering particle SCT is not particularly limited as long as it is a material capable of scattering at least a portion of transmitted light, for example, it may be an oxide particle such as a titanium oxide ($TiO_2$), an aluminum oxide ($Al_2O_3$), an indium oxide ($In_2O_3$), a zinc oxide (ZnO), a tin oxide ($SnO_2$), or silica.

The scattering particle SCT may scatter light in a random direction regardless of the incident direction of the incident light without substantially converting the wavelength of the light transmitting through the third insulation layer INS3'. Through this, side visibility of the display device may be improved.

As described above, the color (or wavelength) of the light emitted from the light emitting element LD may be converted by the wavelength conversion particles WC of the third insulation layer INS3', and the color-converted light may transmit through the reflective layer MRL through the opening OP to be emitted in the third direction DR3.

Referring to FIG. 8B, a first pixel PXL1e may further include a wavelength conversion layer WCL disposed on the reflective layer MRL. The wavelength conversion layer WCL may be entirely formed on the reflective layer MRL (or substrate SUB), but is not limited thereto. For example, the wavelength conversion layer WCL may be formed only in a partial region overlapping the opening OP of the reflective layer MRL.

For example, the wavelength conversion layer WCL may include a base resin BS, and the wavelength conversion particles WC and scattering particles SCT dispersed inside the base resin BS. Because the base resin BS, the wavelength conversion particle WC, and the scattering particle SCT included in the wavelength conversion layer WCL are substantially the same as or similar to those in the embodiment of FIG. 8A described above, a detailed description thereof will be omitted.

The light emitted from the light emitting element LD may transmit through the reflective layer MRL through the opening OP, and a color (or wavelength) of the transmitted light may be converted by the wavelength conversion particle WC of the wavelength conversion layer WCL to be emitted in the third direction DR3.

Figure 10:
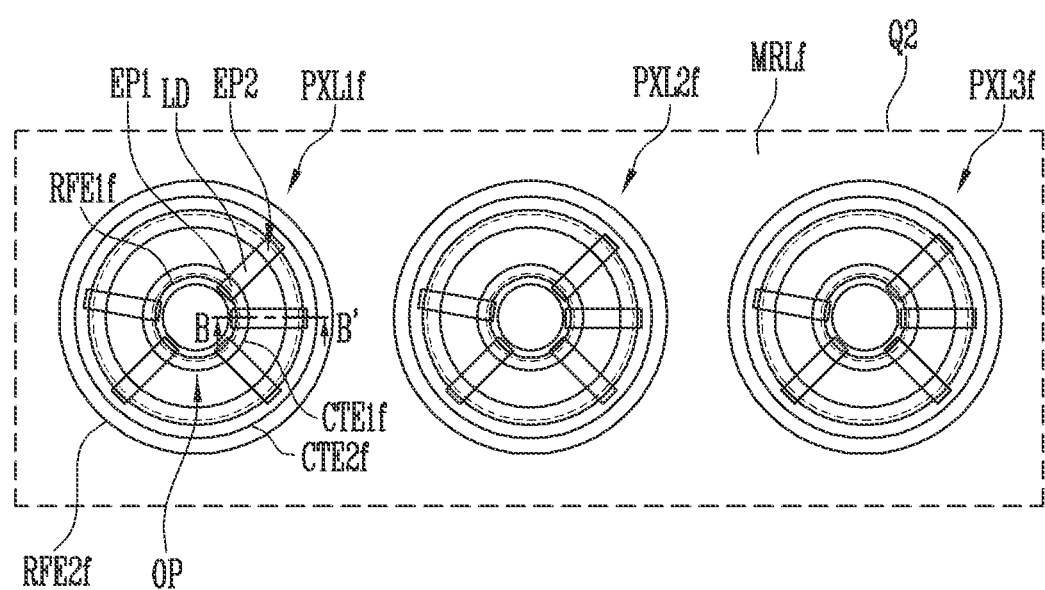
FIG. 10 illustrates an enlarged top plan view of an area Q2 of FIG. 9.
Figure 11:
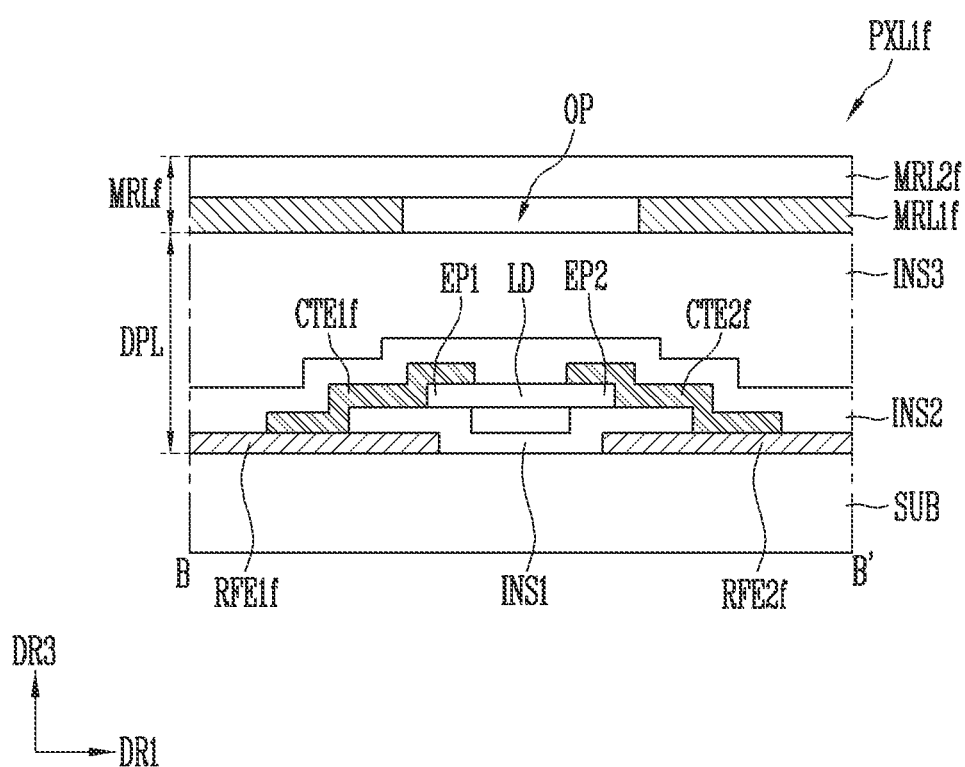
FIG. 11 illustrates a cross-sectional view taken along the line B-B' of FIG. 10.

FIG. 9 illustrates a top plan view of a display device according to one or more embodiments. FIG. 10 illustrates an enlarged top plan view of an area Q2 of FIG. 9. FIG. 11 illustrates a cross-sectional view taken along the line B-B' of FIG. 10.

The embodiment of FIGS. 9 to 11 is different from the embodiment of FIG. 5 to FIG. 7A in that each pixel includes circular electrodes in a plan view.

Referring to FIG. 9 to FIG. 11, the display device 1000f may include the substrate SUB and the plurality of pixels PXL1f, PXL2f, and PXL3f provided on the substrate SUB. In addition, the display device 1000 may include a pixel circuit layer, the display element layer DPL, and the reflective layer MRL sequentially disposed on the substrate SUB.

The display element layer DPL may include first and second electrodes RFE1f and RFE2f, the first insulation layer INS1, the light emitting element LD, third and fourth electrodes CTE1f and CTE2f, the second insulation layer INS2, and the third insulation layer INS3, which are disposed on the substrate SUB (or pixel circuit layer).

The first electrode RFE1f and the second electrode RFE2f may be spaced from each other with the light emitting element LD therebetween on the substrate SUB. For example, the first electrode RFE1f and the second electrode RFE2f may be disposed such that one electrode surrounds another electrode in a plan view.

For example, the first electrode RFE1f may be surrounded by the second electrode RFE2f. For example, the first electrode RFE1f may be formed in a circular shape in a plan view, and the second electrode RFE2f may be formed in a shape (for example, donut shape) surrounding the first electrode RFE1f. The shapes of the first electrode RFE1f and the second electrode RFE2f are not limited thereto. For example, the first electrode RFE1f may be formed in an elliptical shape or a polygonal shape such as a triangle or a quadrangle. In addition, as long as the second electrode RFE2f is also formed to surround the first electrode RFE1f, the shape thereof is not limited.

The light emitting element LD may be disposed between the first electrode RFE1f and the second electrode RFE2f. The first end portion EP1 of the light emitting element LD may be connected to the first electrode RFE1f through the third electrode CTE1f, and the second end portion EP2 may be connected to the second electrode RFE2f through the fourth electrode CTE2f.

The third electrode CTE1f and the fourth electrode CTE2f may be at least partially contacted (or electrically connected) to the first electrode RFE1f and the second electrode RFE2f, respectively.

The third electrode CTE1f and the fourth electrode CTE2f may also be formed similarly to the first electrode RFE1f and the second electrode RFE2f. For example, the third electrode CTE1f may overlap the first electrode RFE1f, and may be formed in a donut shape (or circular shape) in a plan view. In addition, the fourth electrode CTE2f may overlap the second electrode RFE2f, and may be disposed in a shape (or donut shape) surrounding the third electrode CTE1f.

A reflective layer MRL may include a first reflective layer MRL1 and a second reflective layer MRL2. The first reflective layer MRL1 may include an opening OP overlapping at least a portion of the light emitting element LD. The opening OP may be formed in a donut shape to correspond to a region in which the light emitting elements LD are disposed as shown in FIG. 10, but is not limited thereto. For example, the opening OP may be formed in a circular shape to overlap the light emitting elements LD.

Hereinafter, other embodiments of the display device will be described. The embodiments of FIG. 12 to FIG. 35 may include a structure in which the above-described reflective layer is shared with a touch sensor. In the following embodiment, the same components as those in the previously described embodiment are denoted by the same reference numerals, and descriptions thereof will be omitted or simplified, and differences will be mainly described.

Figure 12:
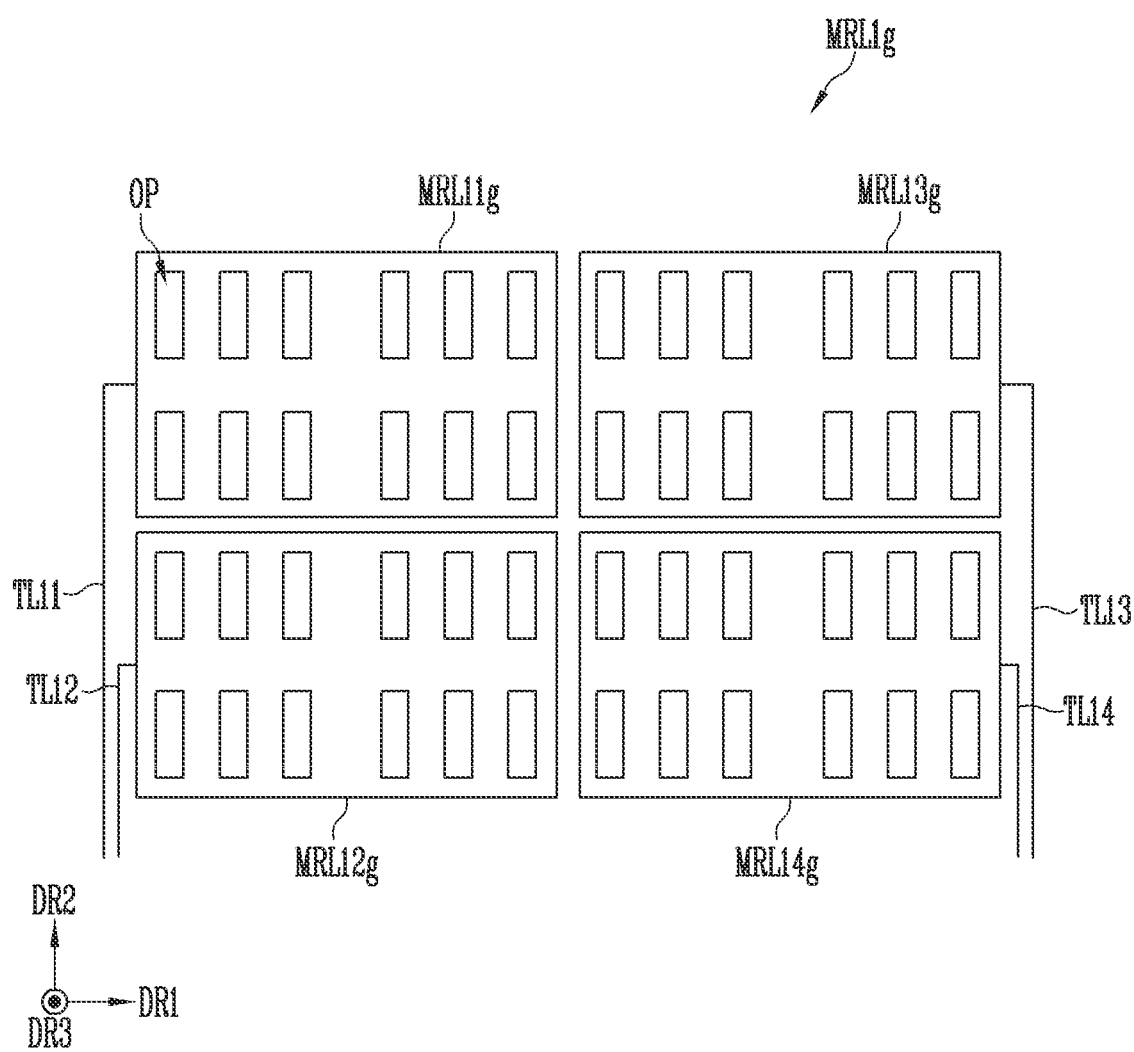
FIG. 12 illustrates a top plan view of a first reflective layer according to one or more embodiments.
Figure 13:
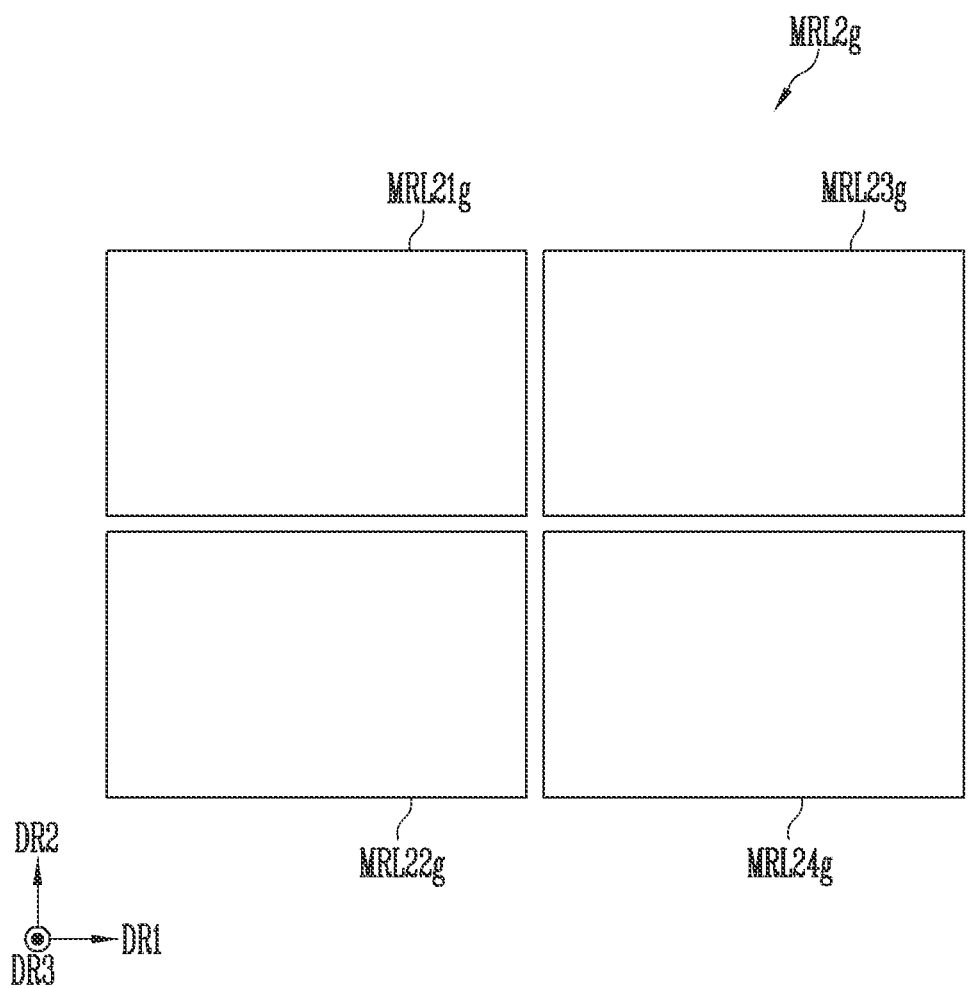
FIG. 13 illustrates a top plan view of a second reflective layer according to one or more embodiments.
Figure 14:
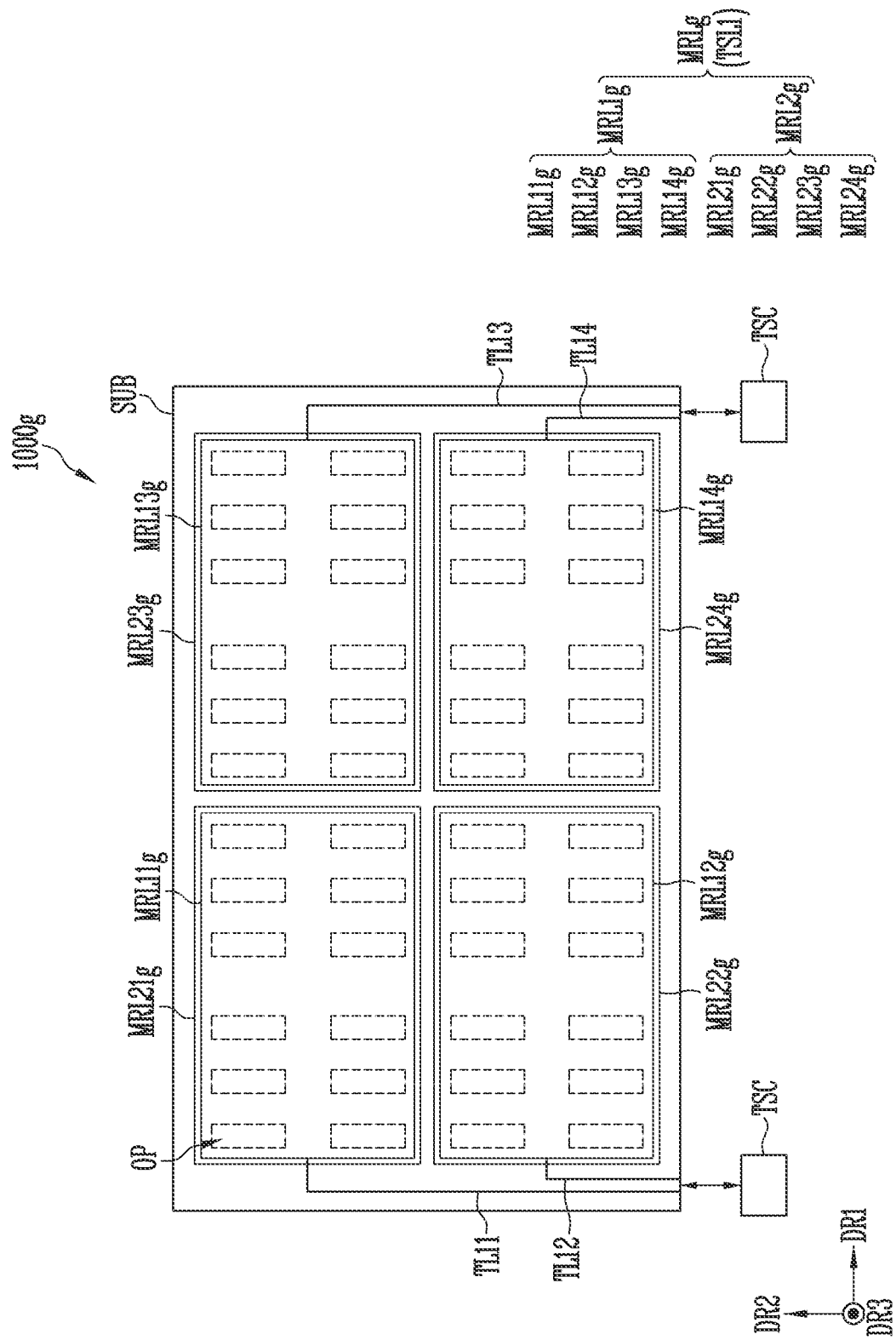
FIG. 14 illustrates a top plan view of a display device according to one or more embodiments.

FIG. 12 illustrates a top plan view of a first reflective layer according to one or more embodiments. FIG. 13 illustrates a top plan view of a second reflective layer according to one or more embodiments. FIG. 14 illustrates a top plan view of a display device according to one or more embodiments.

Referring to FIG. 12 to FIG. 14, a display device 1000g may include a reflective layer MRLg disposed on the substrate SUB. The reflective layer MRLg may be shared with a touch electrode layer TSL1 of the display device 1000g. For example, the reflective layer MRLg may function as a sensing electrode of a self-capacitance type of touch screen panel.

The reflective layer MRLg may include a first reflective layer MRL1g and a second reflective layer MRL2g.

The first reflective layer MRL1g may include a plurality of sensing patterns MRL11g, MRL12g, MRL13g, and MRL14g. For example, the sensing patterns MRL11g, MRL12g, MRL13g, and MRL14g may include a first sensing pattern MRL11g, a second sensing pattern MRL12g, a third sensing pattern MRL13g, and a fourth sensing pattern MRL14g. The sensing patterns MRL11g, MRL12g, MRL13g, and MRL14g may be disposed to be spaced from each other.

Each of the plurality of sensing patterns MRL11g, MRL12g, MRL13g, and MRL14g may be formed to have a size corresponding to a suitable number of pixels (e.g., a set or predetermined number of pixels, PXL in FIG. 2). For example, each of the plurality of sensing patterns MRL11g, MRL12g, MRL13g, and MRL14g may be formed to have a size corresponding to one pixel, or may be formed to have a size corresponding to two or more pixels. FIG. 12 and FIG. 14 illustrate the structure in which each of the sensing patterns MRL11g, MRL12g, MRL13g, and MRL14g is formed to have a size corresponding to twelve pixels, but it is only an example of the plurality of sensing patterns MRL11g, MRL12g, MRL13g, and MRL14g, but is not limited thereto.

In addition, respective sensing patterns MRL11g, MRL12g, MRL13g, and MRL14g may have the same planar area, but are not limited thereto.

The sensing patterns MRL11g, MRL12g, MRL13g, and MRL14g of the first reflective layer MRL1g may include an opening OP formed at a position corresponding to each pixel. As described above, the opening OP may at least partially overlap the light emitting element (LD in FIG. 6) of each pixel.

The sensing patterns MRL11g, MRL12g, MRL13g, and MRL14g of the first reflective layer MRL1g may be electrically connected to touch sensing lines TL11, TL12, TL13, and TL14, respectively. For example, the first sensing pattern MRL11g may be connected to the first touch sensing line TL11, the second sensing pattern MRL12g may be connected to the second touch sensing line TL12, the third sensing pattern MRL13g may be connected to the third touch sensing line TL13, and the fourth sensing pattern MRL14g may be connected to the fourth touch sensing line TL14.

The touch sensing lines TL11, TL12, TL13, and TL14 may be connected to a touch sensing controller TSC of the display device 1000g. The touch sensing controller TSC may be formed as one controller on the substrate SUB or a plurality of controllers to provide a touch driving signal to the touch sensing lines TL11, TL12, TL13, and TL14 or to receive a touch sensing signal from the touch sensing lines TL11, TL12, TL13, and TL14. The position of the touch sensing controller TSC is not limited thereto, and may be formed on a separate member to be connected thereto by other wires.

In one or more embodiments, the touch sensing lines TL11, TL12, TL13, and TL14 may be formed at the same layer as the first reflective layer MRL1g, and may be concurrently simultaneously formed. In addition, the touch sensing lines TL11, TL12, TL13, and TL14 may be made of the same material as the first reflective layer MRL1g. In one or more embodiments, the touch sensing lines TL11, TL12, TL13, and TL14 may be formed on a layer different from the first reflective layer MRL1g. For example, the touch sensing lines TL11, TL12, TL13, and TL14 may be formed at the same layer as the second reflective layer MRL2g. In addition, the touch sensing lines TL11, TL12, TL13, and TL14 may be made of a different material from the first reflective layer MRL1g.

The second reflective layer MRL2g may include a plurality of reflective patterns MRL21g, MRL22g, MRL23g, and MRL24g. For example, the plurality of reflective patterns MRL21g, MRL22g, MRL23g, and MRL24g may include a first reflective pattern MRL21g, a second reflective pattern MRL22g, a third reflective pattern MRL23g, and a fourth reflective pattern MRL24g.

Each of the reflection patterns MRL21g, MRL22g, MRL23g, and MRL24g may be formed to have a size corresponding to a suitable number (e.g., a set or predetermined number) of pixels (PXL in FIG. 2). For example, each of the reflective patterns MRL21g, MRL22g, MRL23g, and MRL24g may be formed to have a size corresponding to one pixel, or may be formed to have a size corresponding to two or more pixels. FIG. 13 and FIG. 14 illustrate the structure in which each of the reflective patterns MRL21g, MRL22g, MRL23g, and MRL24g is formed to have a size corresponding to twelve pixels, but the present disclosure is not limited thereto.

The first reflective layer MRL1g and the second reflective layer MRL2g may be in direct contact with each other, and in this case, each of the reflective patterns MRL21g, MRL22g, MRL23g, and MRL24g may be formed to correspond to each of the sensing patterns MRL11g, MRL12g, MRL13g, and MRL14g.

In the described embodiment, an area of each of reflective patterns MRL21g, MRL22g, MRL23g, and MRL24g) may be substantially the same as an area of each of the corresponding sensing patterns MRL11g, MRL12g, MRL13g, and MRL14g. For example, an area of the first reflective pattern MRL21g may be substantially the same as an area of the first sensing pattern MRL11g, an area of the second reflective pattern MRL22g may be substantially the same as an area of the second sensing pattern MRL12g, an area of the third reflective pattern MRL23g may be substantially the same as an area of the third sensing pattern MRL13g, and an area of the fourth reflective pattern MRL24g may be substantially the same as an area of the fourth sensing pattern MRL14g.

The second reflective layer MRL2g is disposed on the first reflective layer MRL1g to reduce light scattering that may occur while the light emitted from the light emitting element (LD in FIG. 7A) transmits through the first reflective layer MRL1g, thereby improving visibility of the display device.

As described above, the reflective layer MRLg may be shared with the touch electrode layer TSL1, and may function as a sensing electrode of a self-capacitance type of touch screen panel. For example, when an external conductor (for example, a user's finger) touches (or is adjacent to) the display device 1000g, a capacitance value may be changed at the touched position. That is, the capacitance value of the reflective layer MRLg may be changed by a touch input. The change in the capacitance value may be a touch sensing signal for touch sensing, and the touch sensing signal may be provided to the touch sensing controller TSC through the touch sensing lines TL11, TL12, TL13, and TL14 connected to the reflective layer MRLg. The touch sensing controller TSC (or an operation processing device connected to the touch sensing controller TSC) may determine a position where an external conductor is touched based on the touch sensing signal according to the change in the capacitance value.

The reflective layer MRLg may concurrently (or simultaneously) perform a mirror function for reflecting an image of an object positioned in front of the display device and a touch electrode function for detecting a touched position on the display device. When the reflective layer MRLg is shared with the touch electrode layer TSL1, a separate process for forming the touch electrode may be omitted, the manufacturing process of the display device may be simplified, and the manufacturing cost may be reduced.

Figure 15A:
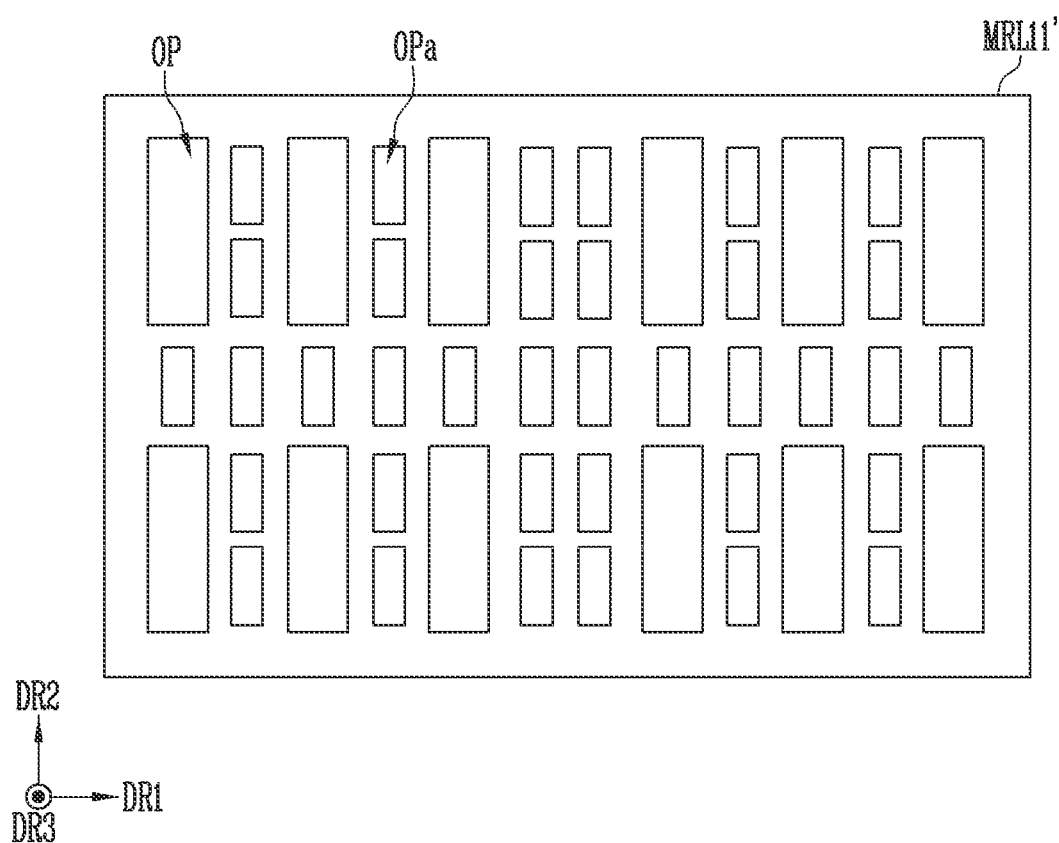
FIG. 15A illustrates a top plan view of a first reflective layer according to one or more embodiments.
Figure 15B:
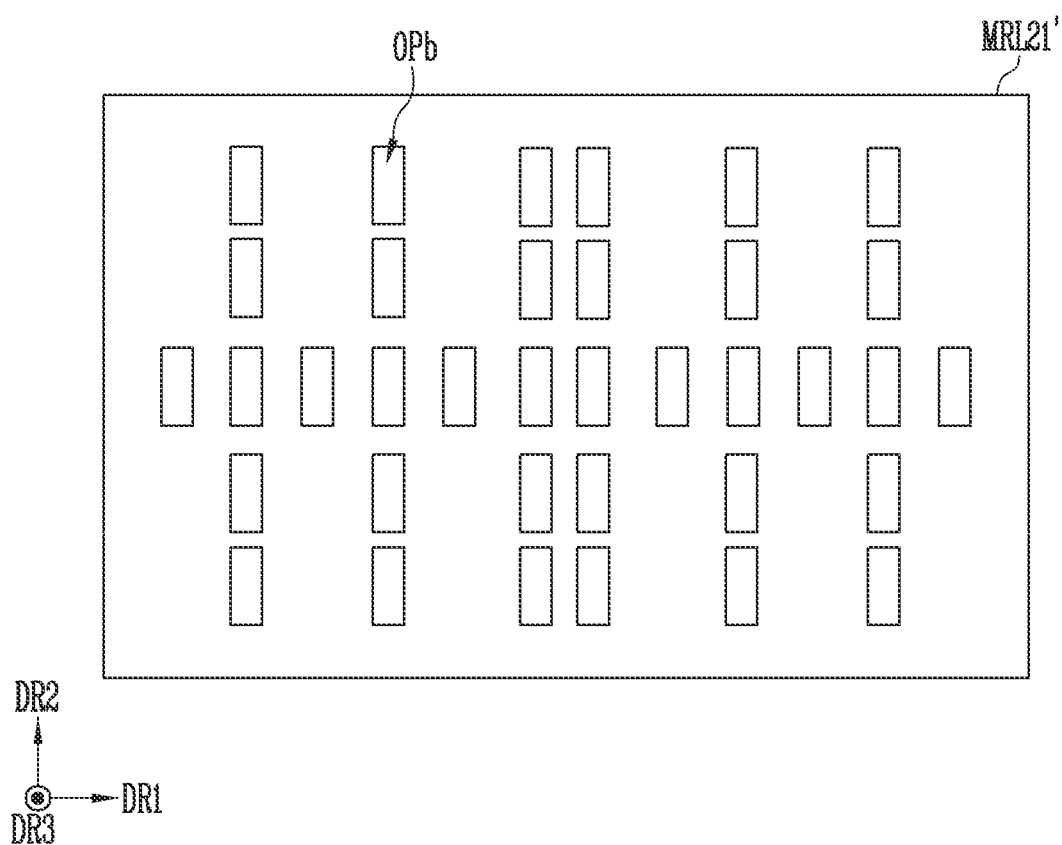
FIG. 15B illustrates a top plan view of a second reflective layer according to one or more embodiments.

FIG. 15A illustrates a top plan view of a first reflective layer according to one or more embodiments. FIG. 15B illustrates a top plan view of a second reflective layer according to one or more embodiments. For example, FIG. 15A illustrates a portion of the first reflective layer corresponding to the first sensing pattern MRL11g of FIG. 12, and FIG. 15B illustrates a portion of the second reflective layer corresponding to the first reflective pattern MRL21g of FIG. 13.

The embodiment of FIG. 15A and FIG. 15B is different from the embodiment of FIG. 12 to FIG. 14 in that a first reflective layer MRL11' and a second reflective layer MRL2l' further include a sub-opening.

Referring to FIG. 15A and FIG. 15B in conjunction with FIG. 5 to FIG. 7A, the first reflective layer MRL11' may include an opening OP that overlaps respective pixels, and may further include a first sub-opening OPa. In addition, the second reflective layer MRL2l' may include a second sub-opening OPb.

The first sub-opening OPa of the first reflective layer MRL11' may be formed in a region in which the opening OP is not formed. That is, the first sub-opening OPa may overlap various electrodes RFE1, RFE2, CTE1, and CTE2 of the display element layer DPL without overlapping the light emitting element LD.

The second sub-opening OPb of the second reflective layer MRL2l' may at least partially overlap the first sub-opening OPa of the first reflective layer MRL11'. Accordingly, the second sub-opening OPb may overlap the various electrodes RFE1, RFE2, CTE1, and CTE2 of the display element layer DPL.

The shapes of the first sub-opening OPa and the second sub-opening OPb are not limited to those described above, and may be formed in more various shapes. For example, the first sub-opening OPa and the second sub-opening OPb may be formed in a hatched shape along an oblique direction between the first direction DR1 and the second direction DR2.

When the first reflective layer MRL11' and the second reflective layer MRL2l' each include the first sub-opening OPa and the second sub-opening OPb, parasitic capacitance that may be generated between the first reflective layer MRL11' and the second reflective layer MRL2l' and the various electrodes RFE1, RFE2, CTE1, and CTE2 of the display element layer DPL may be reduced. Accordingly, a touch recognition error that may occur due to the parasitic capacitance may be improved, and touch recognition accuracy of the display device may be improved.

The structure in which the first reflective layer MRL11' and the second reflective layer MRL2l' include the first sub-opening OPa and the second sub-opening OPb may be applied to all of the following embodiments, through which the touch recognition accuracy of the display device may be improved.

Figure 16:
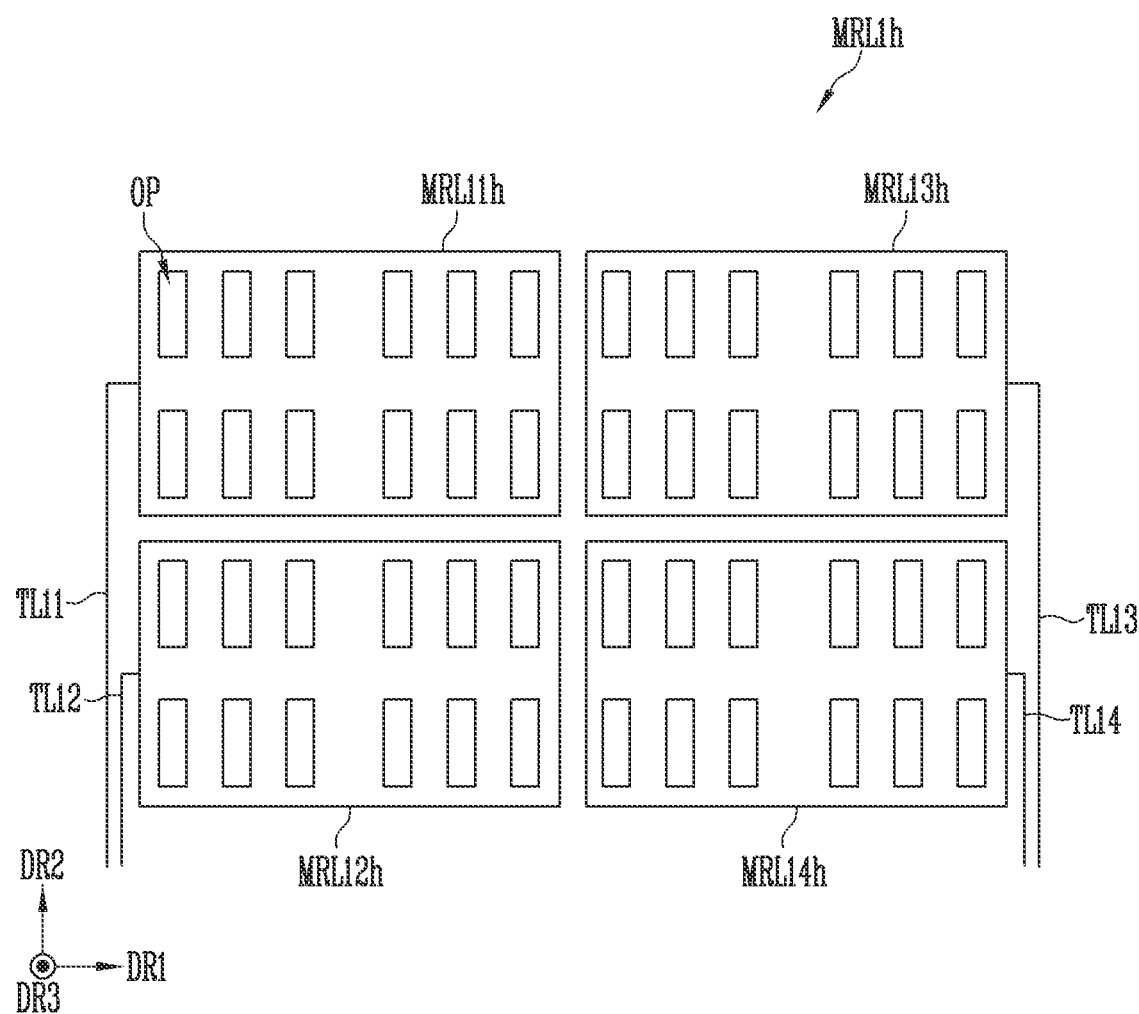
FIG. 16 illustrates a top plan view of a first reflective layer according to one or more embodiments.
Figure 17:
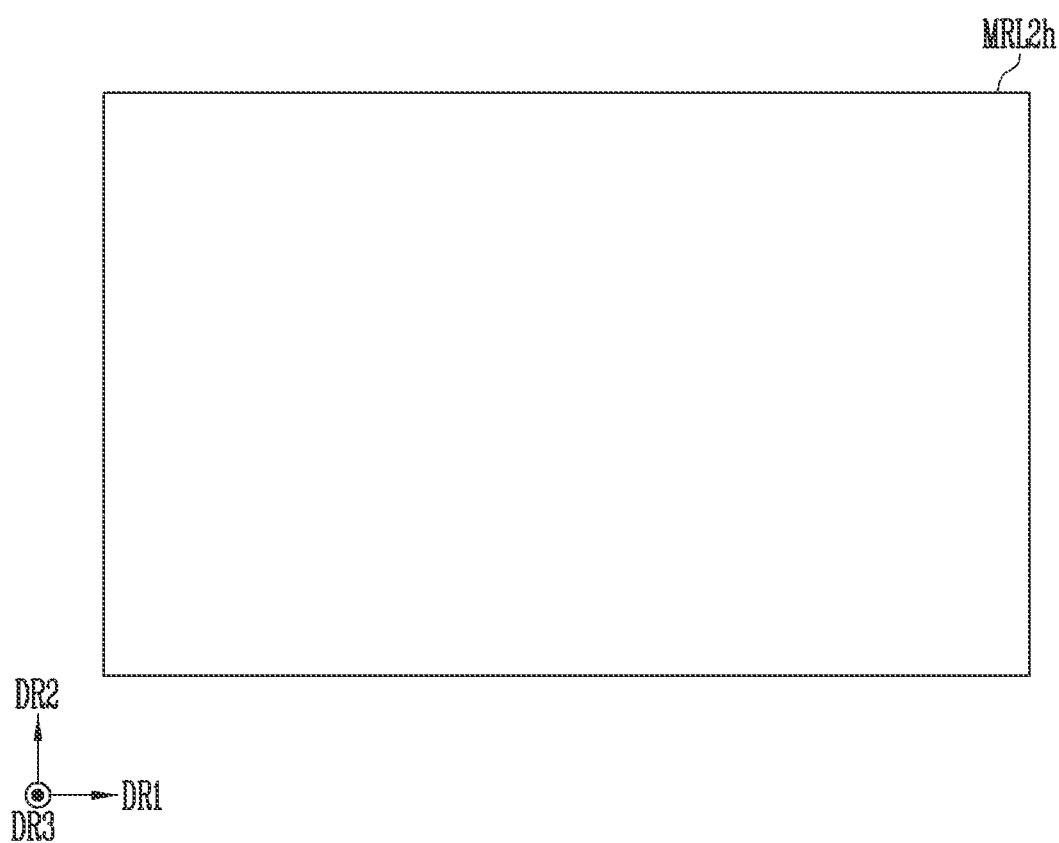
FIG. 17 illustrates a top plan view of a second reflective layer according to one or more embodiments.
Figure 18:
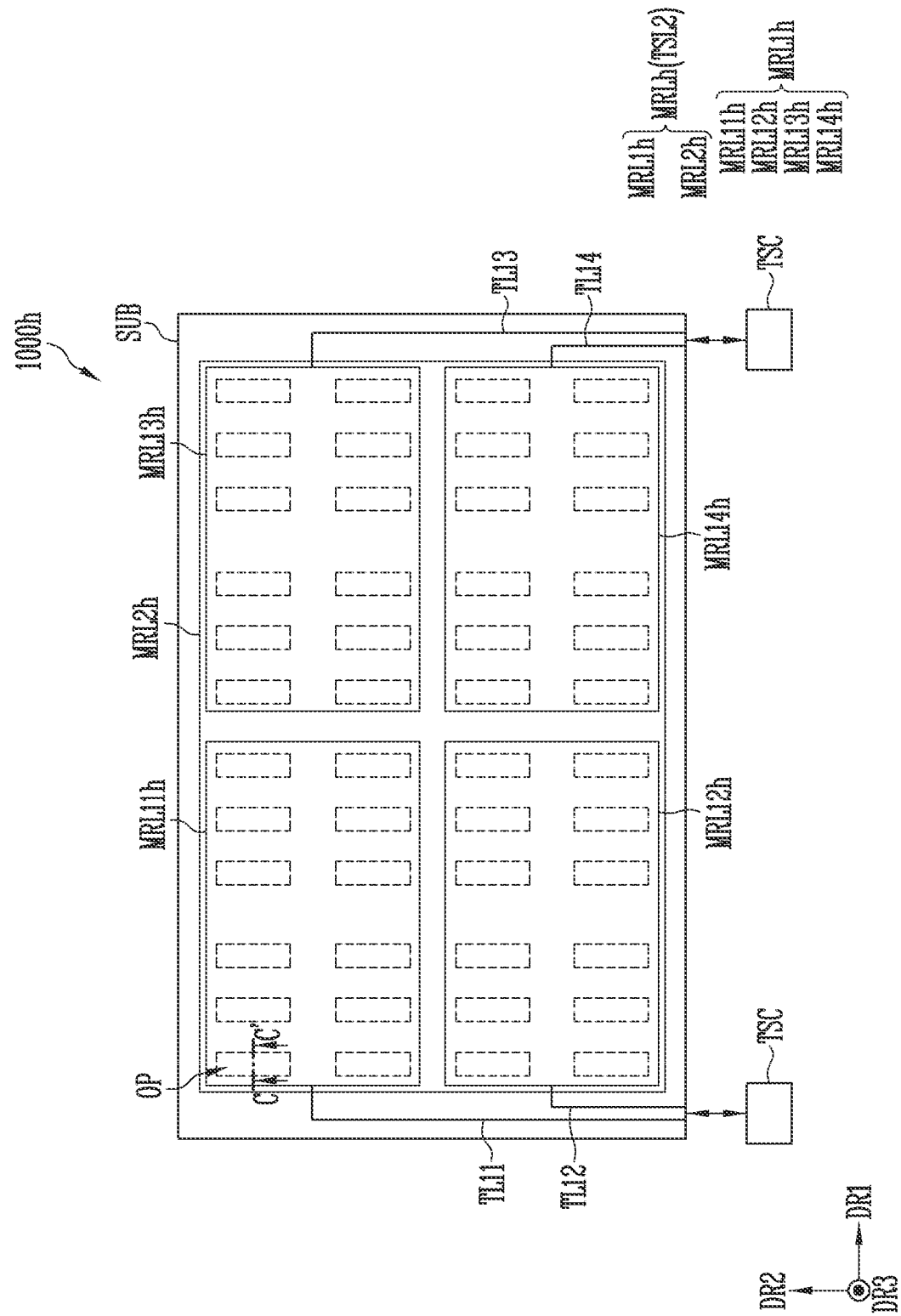
FIG. 18 illustrates a top plan view of a display device according to one or more embodiments.
Figure 19:
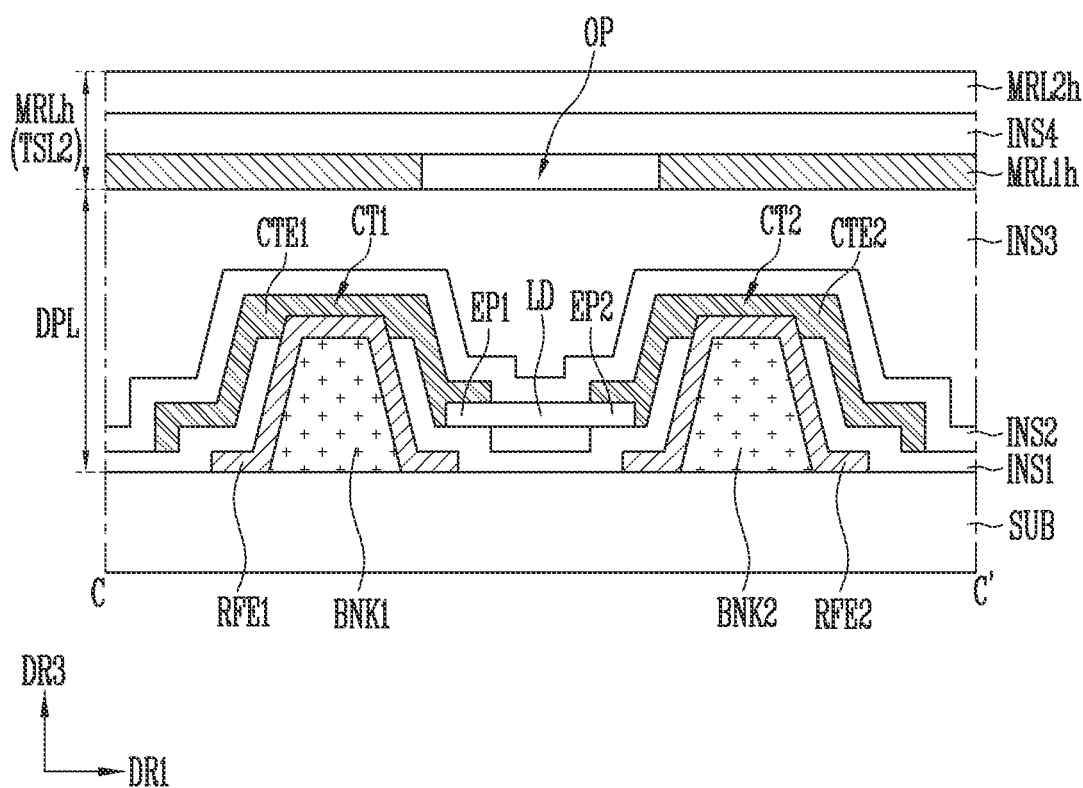
FIG. 19 illustrates a cross-sectional view taken along the line C-C' of FIG. 18.

FIG. 16 illustrates a top plan view of a first reflective layer according to one or more embodiments. FIG. 17 illustrates a top plan view of a second reflective layer according to one or more embodiments. FIG. 18 illustrates a top plan view of a display device according to one or more embodiments. FIG. 19 illustrates a cross-sectional view taken along the line C-C' of FIG. 18.

The embodiment of FIG. 16 to FIG. 19 is different from the previous embodiment in that a fourth insulation layer is further disposed between the first reflective layer and the second reflective layer, and other constituent elements are substantially the same or similar.

Referring to FIG. 16 to FIG. 19, a display device 1000h may include a reflective layer MRLh disposed on the substrate SUB. The reflective layer MRLh may be shared with a touch electrode layer TSL2 of the display device 1000h. The reflective layer MRLh may function as a sensing electrode of a self-capacitance type of touch screen panel.

The reflective layer MRLh may include a first reflective layer MRL1h and a second reflective layer MRL2h.

The first reflective layer MRL1h may include a plurality of sensing patterns MRL11h, MRL12h, MRL13h, and MRL14h. For example, the plurality of sensing patterns MRL11h, MRL12h, MRL13h, and MRL14h may include a first sensing pattern MRL11h, a second sensing pattern MRL12h, a third sensing pattern MRL13h, and a fourth sensing pattern MRL14h. The sensing patterns MRL11h, MRL12h, MRL13h, and MRL14h may be disposed to be spaced from each other.

Each of the sensing patterns MRL11h, MRL12h, MRL13h, and MRL14h may be formed to have a size corresponding to a suitable number (e.g., a set or predetermined number) of pixels (PXL in FIG. 2). FIG. 16 and FIG. 18 illustrate the structure in which each of the sensing patterns MRL11h, MRL12h, MRL13h, and MRL14h is formed to have a size corresponding to twelve pixels, but the present disclosure is not limited thereto.

In addition, respective sensing patterns MRL11h, MRL12h, MRL13h, and MRL14h may have the same planar area, but are not limited thereto.

The sensing patterns MRL11h, MRL12h, MRL13h, and MRL14h of the first reflective layer MRL1h may include an opening OP formed at a position corresponding to each pixel. The opening OP may at least partially overlap the light emitting element LD of each pixel.

The sensing patterns MRL11h, MRL12h, MRL13h, and MRL14h of the first reflective layer MRL1h may be electrically connected to touch sensing lines TL11, TL12, TL13, and TL14, respectively. For example, the first sensing pattern MRL11h may be connected to the first touch sensing line TL11, the second sensing pattern MRL12h may be connected to the second touch sensing line TL12, the third sensing pattern MRL13h may be connected to the third touch sensing line TL13, and the fourth sensing pattern MRL14h may be connected to the fourth touch sensing line TL14.

The fourth insulation layer INS4 may be further disposed on the first reflective layer MRL1h. The fourth insulation layer INS4 may be entirely disposed on the first reflective layer MRL1h.

The fourth insulation layer INS4 may include an inorganic insulation film made of an inorganic material or an organic insulation film made of an organic material. For example, when the fourth insulation layer INS4 includes an inorganic insulation film, an empty space may be formed between the fourth insulation layer INS4 and the third insulation layer INS3 by the opening OP of the first reflective layer MRL1h. As another example, when the fourth insulation layer INS4 includes an organic insulation film, the fourth insulation layer INS4 may fill the space due to the opening OP of the first reflective layer MRL1h, and the second reflective layer MRL2h may be stably disposed on the first reflective layer MRL1h.

The second reflective layer MRL2h may be a reflective pattern disposed on the fourth insulation layer INS4. The second reflective layer MRL2h may reduce light scattering that may occur while the light emitted from the light emitting element LD transmits through the first reflective layer MRL1h, thereby improving visibility of the display device. The second reflective layer MRL2h may be entirely formed on the first reflective layer MRL1h and may be integrally formed therewith, but in one or more embodiments, it may also be configured of a plurality of reflective patterns.

As described above, the reflective layer MRLh may be shared with the touch electrode layer TSL2, and may function as a sensing electrode of a self-capacitance type of touch screen panel.

In addition, the first reflective layer MRL1h and the second reflective layer MRL2h may be electrically separated by the fourth insulation layer INS4. Accordingly, the first reflective layer MRL1h may function as a touch sensing electrode regardless of the shape of the second reflective layer MRL2h.

The above-described fourth insulation layer INS4 may be applied to all of the following embodiments and previous embodiments.

Figure 20:
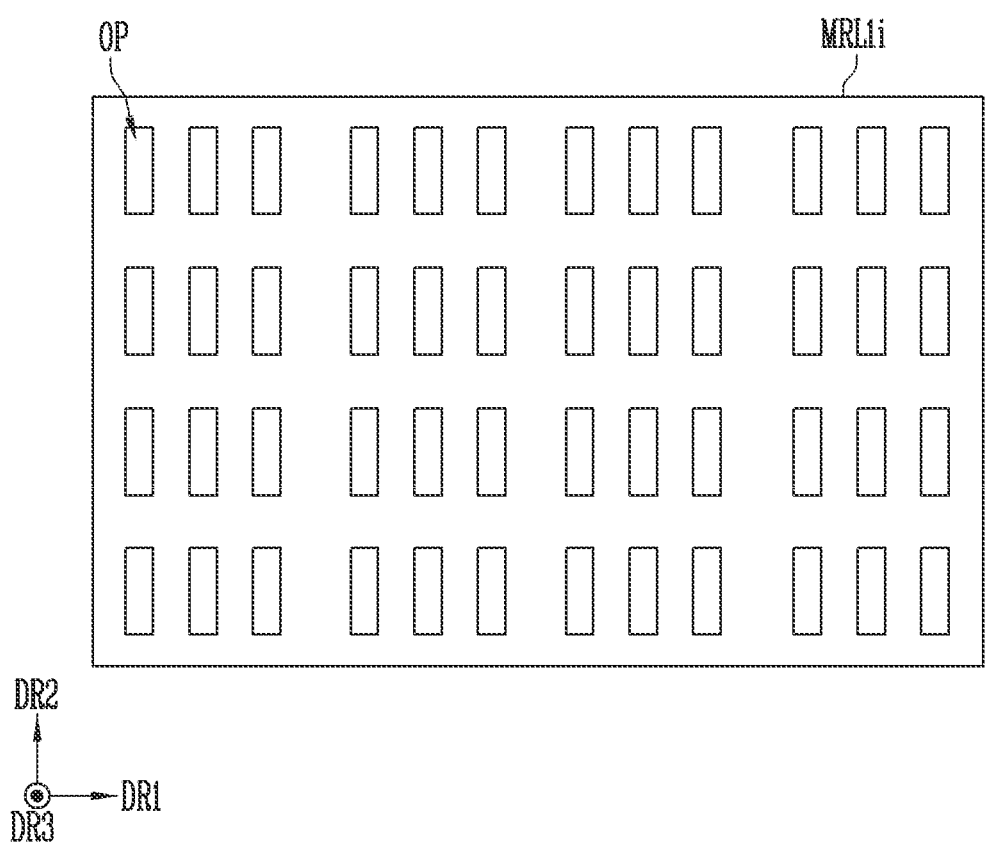
FIG. 20 illustrates a top plan view of a first reflective layer according to one or more embodiments.
Figure 21:
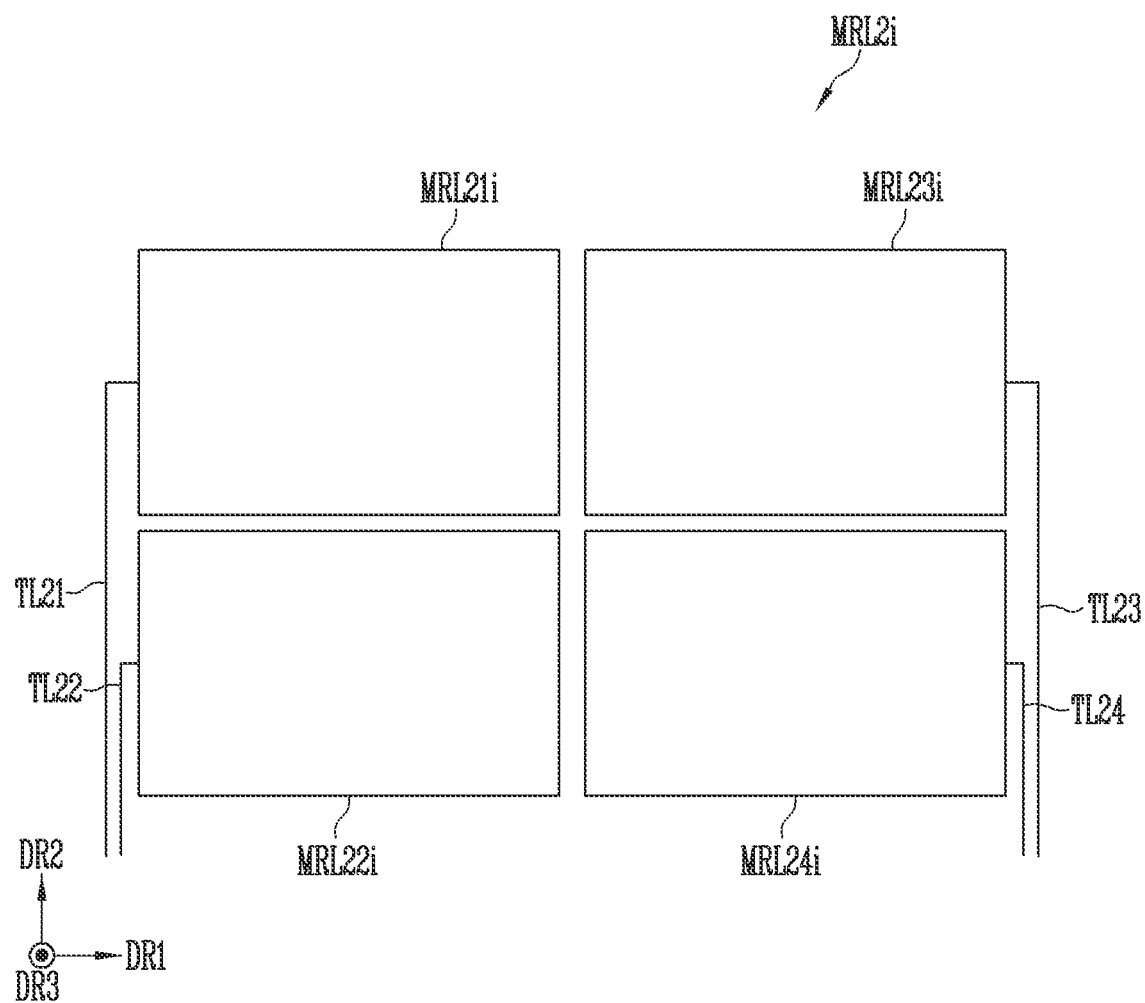
FIG. 21 illustrates a top plan view of a second reflective layer according to one or more embodiments.
Figure 22:
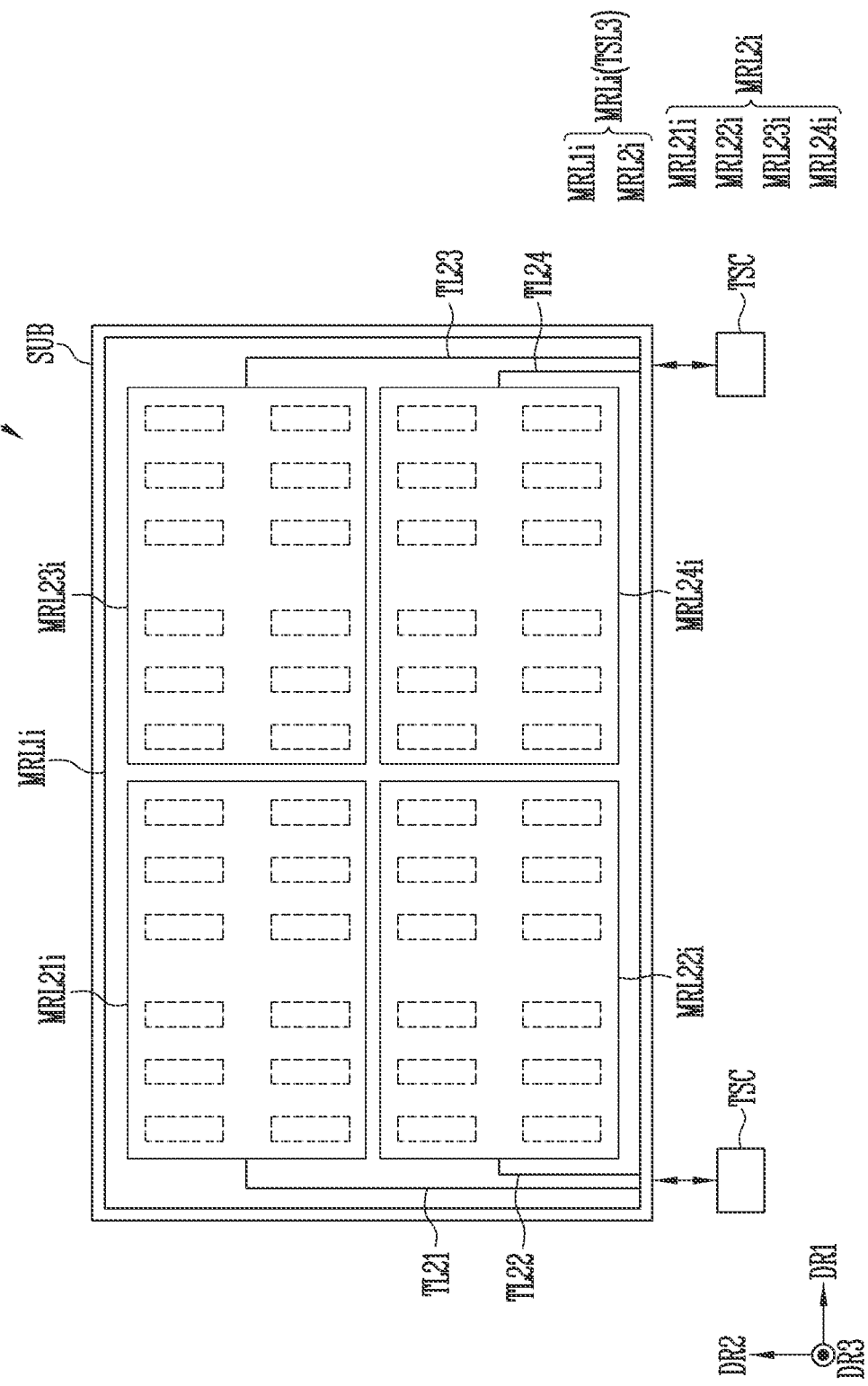
FIG. 22 illustrates a top plan view of a display device according to one or more embodiments.

FIG. 20 illustrates a top plan view of a first reflective layer according to one or more embodiments. FIG. 21 illustrates a top plan view of a second reflective layer according to one or more embodiments. FIG. 22 illustrates a top plan view of a display device according to one or more embodiments.

The embodiment of FIG. 20 to FIG. 22 is different from the previous embodiment in that the second reflective layer includes a sensing pattern, and other constituent elements are substantially the same or similar.

Referring to FIG. 20 to FIG. 22, a display device 1000i may include a reflective layer MRLi disposed on the substrate SUB. The reflective layer MRLi may be shared with a touch electrode layer TSL3 of the display device 1000i. For example, the reflective layer MRLi may function as a sensing electrode of a self-capacitance type of touch screen panel.

The reflective layer MRLi may include a first reflective layer MRL1i and a second reflective layer MRL2i.

The first reflective layer MRL1i may include an opening OP formed at a position corresponding to each pixel. As described above, the opening OP may at least partially overlap the light emitting element (LD in FIG. 6) of each pixel.

The first reflective layer MRL1i may be integrally formed, as shown in the drawing, but is not limited thereto. For example, the first reflective layer MRL1i may be configured of a plurality of reflective patterns.

The second reflective layer MRL2i may include a plurality of sensing patterns MRL21i, MRL22i, MRL23i, and MRL24i. For example, the plurality of sensing patterns MRL21i, MRL22i, MRL23i, and MRL24i may include a first sensing pattern MRL21i, a second sensing pattern MRL22i, a third sensing pattern MRL23i, and a fourth sensing pattern MRL24i. The plurality of sensing patterns MRL21i, MRL22i, MRL23i, and MRL24i may be disposed to be spaced from each other.

Each of the sensing patterns MRL21i, MRL22i, MRL23i, and MRL24i may be formed to have a size corresponding to a suitable number (e.g., a set or predetermined number) of pixels (PXL in FIG. 2). For example, each of the sensing patterns MRL21i, MRL22i, MRL23i, and MRL24i may be formed to have a size corresponding to one pixel, or may be formed to have a size corresponding to two or more pixels. FIG. 21 and FIG. 22 illustrate the structure in which each of the sensing patterns MRL21i, MRL22i, MRL23i, and MRL24i of the second reflective layer MRL2i is formed to have a size corresponding to twelve pixels, but the present disclosure is not limited thereto.

In addition, respective sensing patterns MRL21i, MRL22i, MRL23i, and MRL24i may have the same planar area, but are not limited thereto.

The sensing patterns MRL21i, MRL22i, MRL23i, and MRL24i of the second reflective layer MRL2i may be electrically connected to touch sensing lines TL21, TL22, TL23, and TL24, respectively. For example, the first sensing pattern MRL21i may be connected to the first touch sensing line TL21, the second sensing pattern MRL22i may be connected to the second touch sensing line TL22, the third sensing pattern MRL23i may be connected to the third touch sensing line TL23, and the fourth sensing pattern MRL24i may be connected to the fourth touch sensing line TL24.

The touch sensing lines TL21, TL22, TL23, and TL24 may be connected to a touch sensing controller TSC of the display device 1000i. The touch sensing controller TSC may be formed as one controller on the substrate SUB or a plurality of controllers to provide a touch driving signal to the touch sensing lines TL21, TL22, TL23, and TL24 or to receive a touch sensing signal from the touch sensing lines TL21, TL22, TL23, and TL24. The position of the touch sensing controller TSC is not limited thereto, and may be formed on a separate member to be connected thereto by other wires.

As one or more embodiments, the touch sensing lines TL21, TL22, TL23, and TL24 may be formed at the same layer as the second reflective layer MRL2$i$, and may be concurrently (e.g., simultaneously) formed. In addition, the touch sensing lines TL21, TL22, TL23, and TL24 may be made of the same material as the second reflective layer MRL2$i$. As another embodiment, the touch sensing lines TL21, TL22, TL23, and TL24 may be formed on a layer different from the second reflective layer MRL2$i$. For example, the touch sensing lines TL21, TL22, TL23, and TL24 may be formed at the same layer as the first reflective layer MRL1$i$. In addition, the touch sensing lines TL21, TL22, TL23, and TL24 may be made of a different material from the second reflective layer MRL2$i$.

A separate insulation member (for example, the fourth insulation layer INS4 of FIG. 19) may be disposed between the first reflective layer MRL1$i$ and the second reflective layer MRL2$i$, and the first reflective layer MRL1$i$ and the second reflective layer MRL2$i$ may be electrically isolated from each other. Accordingly, the second reflective layer MRL2$i$ may function as a touch sensing electrode regardless of the shape of the first reflective layer MRL1$i$.

The second reflective layer MRL2$i$ is disposed on the first reflective layer MRL1$i$ to reduce light scattering that may occur while the light emitted from the light emitting element (LD in FIG. 7A) transmits through the first reflective layer MRL1$i$, thereby improving visibility of the display device.

As described above, the reflective layer MRL$i$ may be shared with the touch electrode layer TSL3, and may function as a sensing electrode of a self-capacitance type of touch screen panel.

Figure 23:
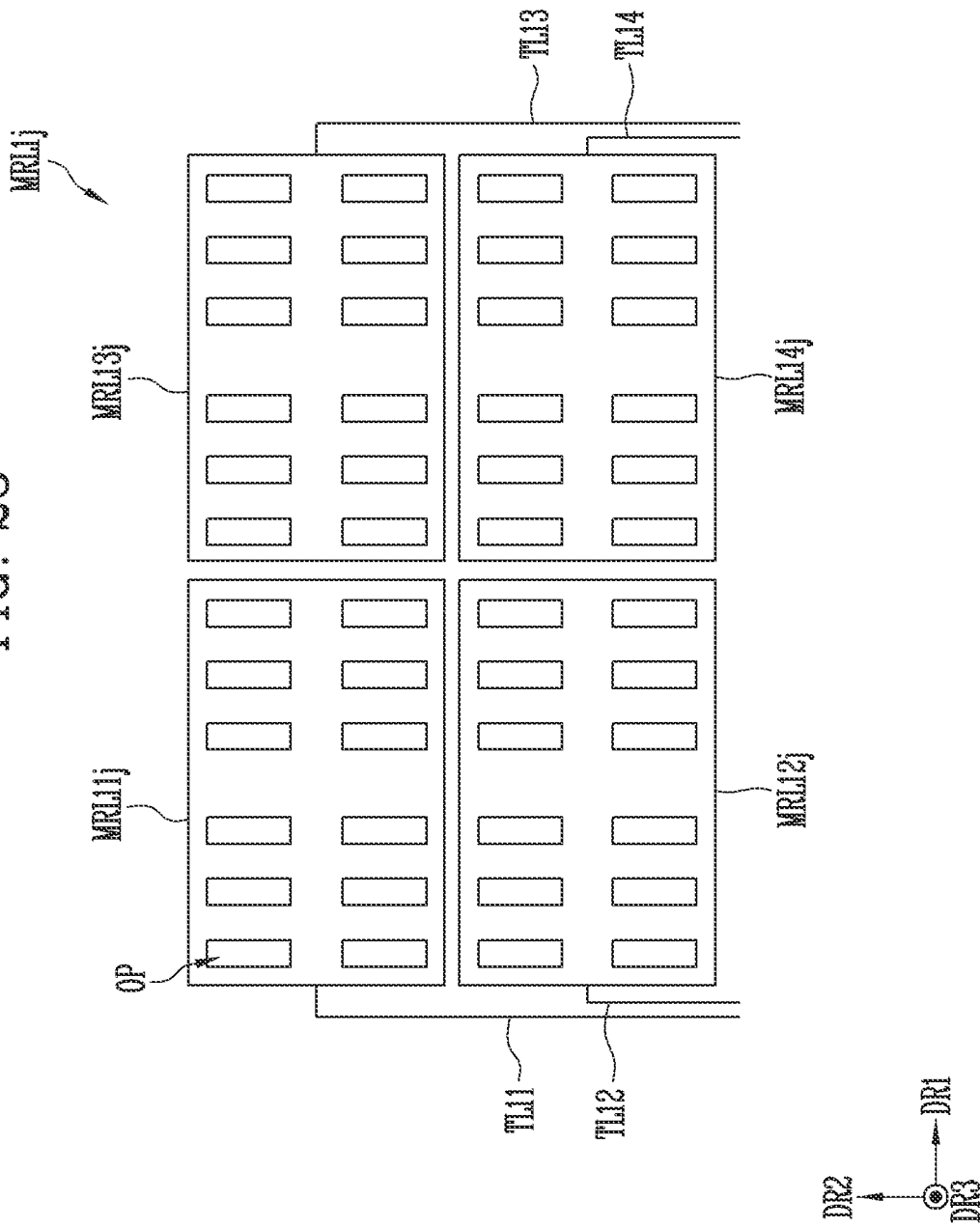
FIG. 23 illustrates a top plan view of a first reflective layer according to one or more embodiments.
Figure 24:
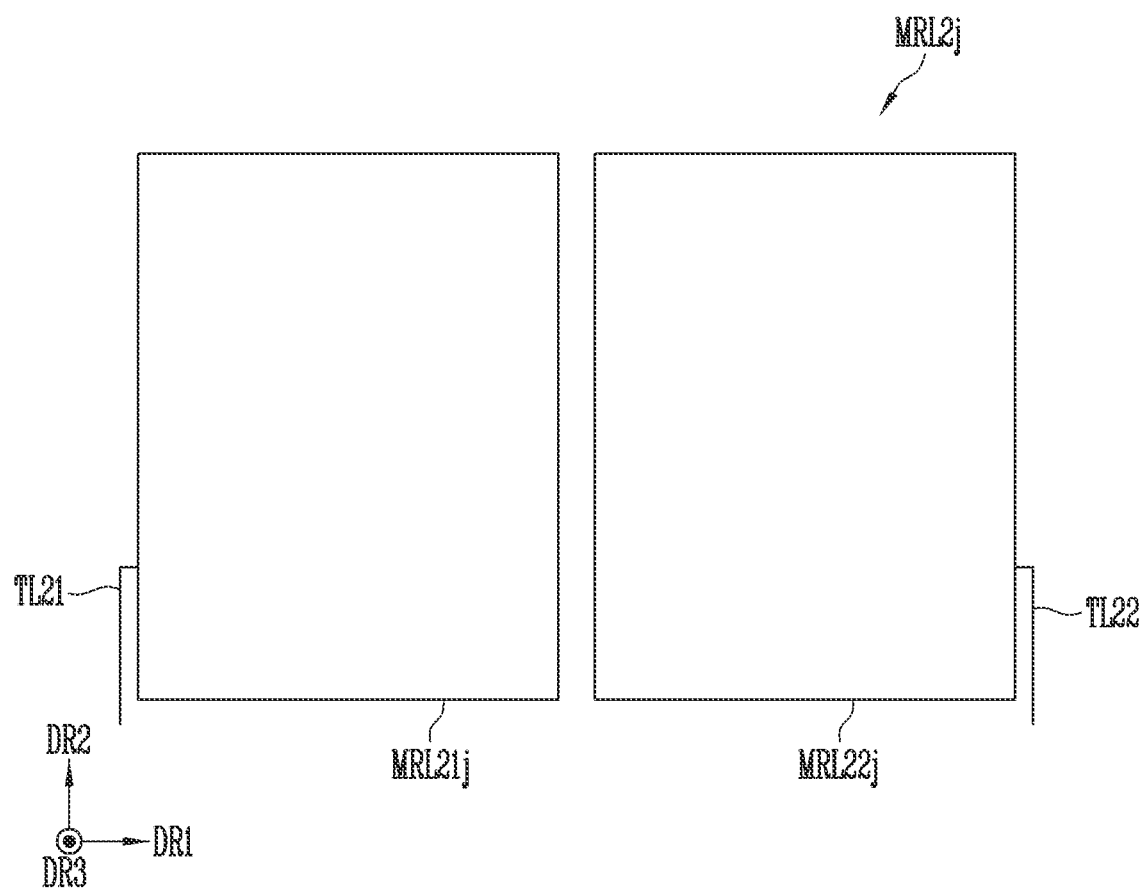
FIG. 24 illustrates a top plan view of a second reflective layer according to one or more embodiments.
Figure 25:
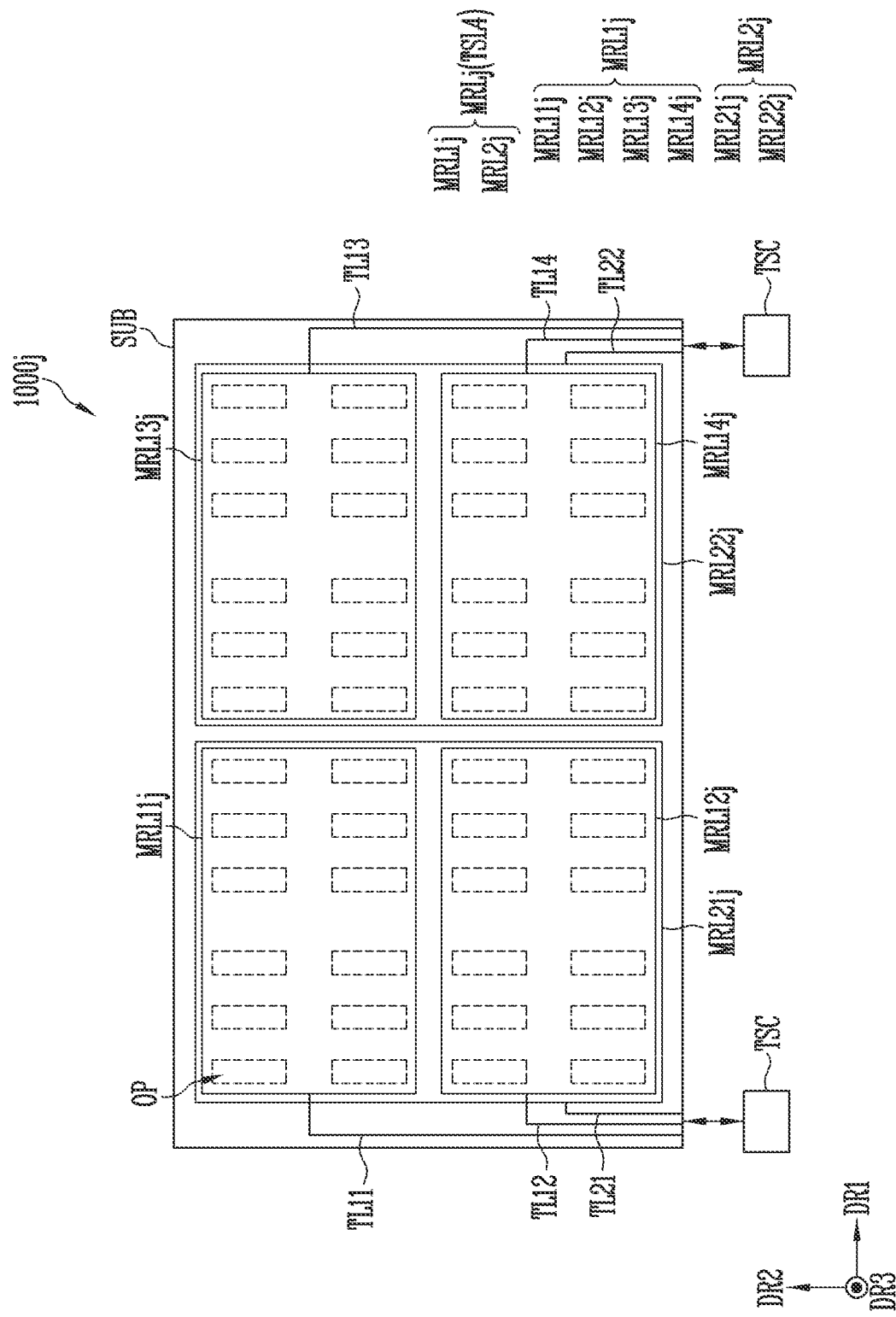
FIG. 25 illustrates a top plan view of a display device according to one or more embodiments.

FIG. 23 illustrates a top plan view of a first reflective layer according to one or more embodiments. FIG. 24 illustrates a top plan view of a second reflective layer according to one or more embodiments. FIG. 25 illustrates a top plan view of a display device according to one or more embodiments.

The embodiment of FIG. 23 to FIG. 25 is different from the previous embodiments in that both the first reflective layer and the second reflective layer function as a touch sensing electrode, and other constituent elements are substantially the same or similar.

Referring to FIG. 23 to FIG. 25, a display device 1000$j$ may include a reflective layer MRL$j$ disposed on the substrate SUB. The reflective layer MRL$j$ may be shared with a touch electrode layer TSL4 of the display device 1000$j$. For example, the reflective layer MRL$j$ may function as a sensing electrode of a self-capacitance type of touch screen panel.

The reflective layer MRL$j$ may include a first reflective layer MRL1$j$ and a second reflective layer MRL2$j$.

The first reflective layer MRL1$j$ may include a plurality of sensing patterns MRL11$j$, MRL12$j$, MRL13$j$, and MRL14$j$. For example, the plurality of sensing patterns MRL11$j$, MRL12$j$, MRL13$j$, and MRL14$j$ may include a first sensing pattern MRL11$j$, a second sensing pattern MRL12$j$, a third sensing pattern MRL13$j$, and a fourth sensing pattern MRL14$j$. The sensing patterns MRL11$j$, MRL12$j$, MRL13$j$, and MRL14$j$ may be disposed to be spaced from each other.

The sensing patterns MRL11$j$, MRL12$j$, MRL13$j$, and MRL14$j$ may be formed to have a size corresponding to a suitable number (e.g., a set or predetermined number) of pixels (PXL in FIG. 2). For example, each of the sensing patterns MRL11$j$, MRL12$j$, MRL13$j$, and MRL14$j$ may be formed to have a size corresponding to one pixel, or may be formed to have a size corresponding to two or more pixels. FIG. 23 and FIG. 25 illustrate the structure in which each of the sensing patterns MRL11$j$, MRL12$j$, MRL13$j$, and MRL14$j$ is formed to have a size corresponding to twelve pixels, but the present disclosure is not limited thereto.

In addition, respective sensing patterns MRL11$j$, MRL12$j$, MRL13$j$, and MRL14$j$ may have the same planar area, but are not limited thereto.

The sensing patterns MRL11$j$, MRL12$j$, MRL13$j$, and MRL14$j$ of the first reflective layer MRL1$j$ may include an opening OP formed at a position corresponding to each pixel. As described above, the opening OP may at least partially overlap the light emitting element (LD in FIG. 6) of each pixel.

The sensing patterns MRL11$j$, MRL12$j$, MRL13$j$, and MRL14$j$ of the first reflective layer MRL1$j$ may be electrically connected to touch sensing lines TL11, TL12, TL13, and TL14, respectively. For example, the first sensing pattern MRL11$j$ may be connected to the first touch sensing line TL11, the second sensing pattern MRL12$j$ may be connected to the second touch sensing line TL12, the third sensing pattern MRL13$j$ may be connected to the third touch sensing line TL13, and the fourth sensing pattern MRL14$j$ may be connected to the fourth touch sensing line TL14.

In one or more embodiments, the touch sensing lines TL11, TL12, TL13, and TL14 may be formed at the same layer as the first reflective layer MRL1$j$, and may be concurrently (e.g., simultaneously) formed. In addition, the touch sensing lines TL11, TL12, TL13, and TL14 may be made of the same material as the first reflective layer MRL1$j$.

The second reflective layer MRL2$j$ may include a plurality of sensing patterns MRL21$j$ and MRL22$j$. For example, the plurality of sensing patterns MRL21$j$ and MRL22$j$ may include a fifth sensing pattern MRL21$j$ and a sixth sensing pattern MRL22$j$.

The sensing patterns MRL21$j$ and MRL22$j$ may be formed to have a size corresponding to a suitable number (e.g., a set or predetermined number) of pixels (PXL in FIG. 2). For example, each of the sensing patterns MRL21$j$ and MRL22$j$ may be formed to have a size corresponding to two or more pixels. FIG. 24 and FIG. 25 illustrate the structure in which each of the sensing patterns MRL21$j$ and MRL22$j$ is formed to have a size corresponding to 24 pixels, but the present disclosure is not limited thereto.

In addition, the sensing patterns MRL21$j$ and MRL22$j$ may have the same planar area, but are not limited thereto.

An area of each of the sensing patterns MRL21$j$ and MRL22$j$ of the second reflective layer MRL2$j$ may be different from an area of each of the sensing patterns MRL11$j$, MRL12$j$, MRL13$j$, and MRL14$j$ of the first reflective layer MRL1$j$. For example, the area of each of the sensing patterns MRL21$j$ and MRL22$j$ of the second reflective layer MRL2$j$ may be larger than the area of each of the sensing patterns MRL11$j$, MRL12$j$, MRL13$j$, and MRL14$j$ of the first reflective layer MRL1$j$. For example, each of the sensing patterns MRL21$j$ and MRL22$j$ of the second reflective layer MRL2$j$ may have an area corresponding to the area of any two of the sensing patterns MRL11$j$, MRL12$j$, MRL13$j$, and MRL14$j$ of the first reflective layer MRL1$j$. The area of each of the sensing patterns MRL21$j$ and MRL22j of the second reflective layer MRL2j is not limited thereto, and may have more various sizes.

The sensing patterns MRL21j and MRL22j of the second reflective layer MRL2j may be electrically connected to the touch sensing lines TL21 and TL22, respectively. For example, the fifth sensing pattern MRL21j may be electrically connected to the fifth touch sensing line TL21, and the sixth sensing pattern MRL22j may be electrically connected to the sixth touch sensing line TL22.

In one or more embodiments, the touch sensing lines TL21 and TL22 may be formed at the same layer as the first reflective layer MRL2j, and may be concurrently (e.g., simultaneously) formed. In addition, the touch sensing lines TL21 and TL22 may be made of the same material as the second reflective layer MRL2j. However, the formation position, formation timing, and material of the touch sensing lines are not limited thereto.

The touch sensing lines TL11, TL12, TL13, TL14, TL21, and TL22 connected to the first reflective layer MRL1j and the second reflective layer MRL2j may be connected to a touch sensing controller TSC of the display device 1000j. The touch sensing controller TSC may be formed as one controller on the substrate SUB or a plurality of controllers to provide a touch driving signal to the touch sensing lines TL11, TL12, TL13, TL14, TL21, and TL22 or to receive a touch sensing signal from the touch sensing lines TL11, TL12, TL13, TL14, TL21, and TL22. The position of the touch sensing controller TSC is not limited thereto, and may be formed on a separate member to be connected thereto by other wires.

A separate insulation member (for example, the fourth insulation layer INS4 of FIG. 19) may be disposed between the first reflective layer MRL1j and the second reflective layer MRL2j, and the first reflective layer MRL1j and the second reflective layer MRL2j may be electrically isolated from each other. Accordingly, each of the first reflective layer MRL1j and the second reflective layer MRL2j may function as a touch sensing electrode.

As described above, the reflective layer MRLj may be shared with the touch electrode layer TSL4, and may function as a sensing electrode of a self-capacitance type of touch screen panel.

In addition, a touch sensor connected to the first reflective layer MRL1j and a touch sensor connected to the second reflective layer MRL2j may be individually driven, and if necessary, only the touch sensor connected to the first reflective layer MRL1j may be driven, while only the touch sensor connected to the second reflective layer MRL2j may be driven. Because the first reflective layer MRL1j includes a narrower touch electrode than that of the second reflective layer MRL2j, an accurate touch position may be detected, while because the second reflective layer MRL2j includes a wider touch electrode than that of the first reflective layer MRL1j, the touch position may be detected at a high speed. In addition, the touch position may be detected by driving both the touch sensor connected to the first reflective layer MRL1j and the touch sensor connected to the second reflective layer MRL2j. For example, after detecting a substantial touch position through the second reflective layer MRL2j, an accurate touch position may be detected through the first reflective layer MRL1j.

Figure 26:
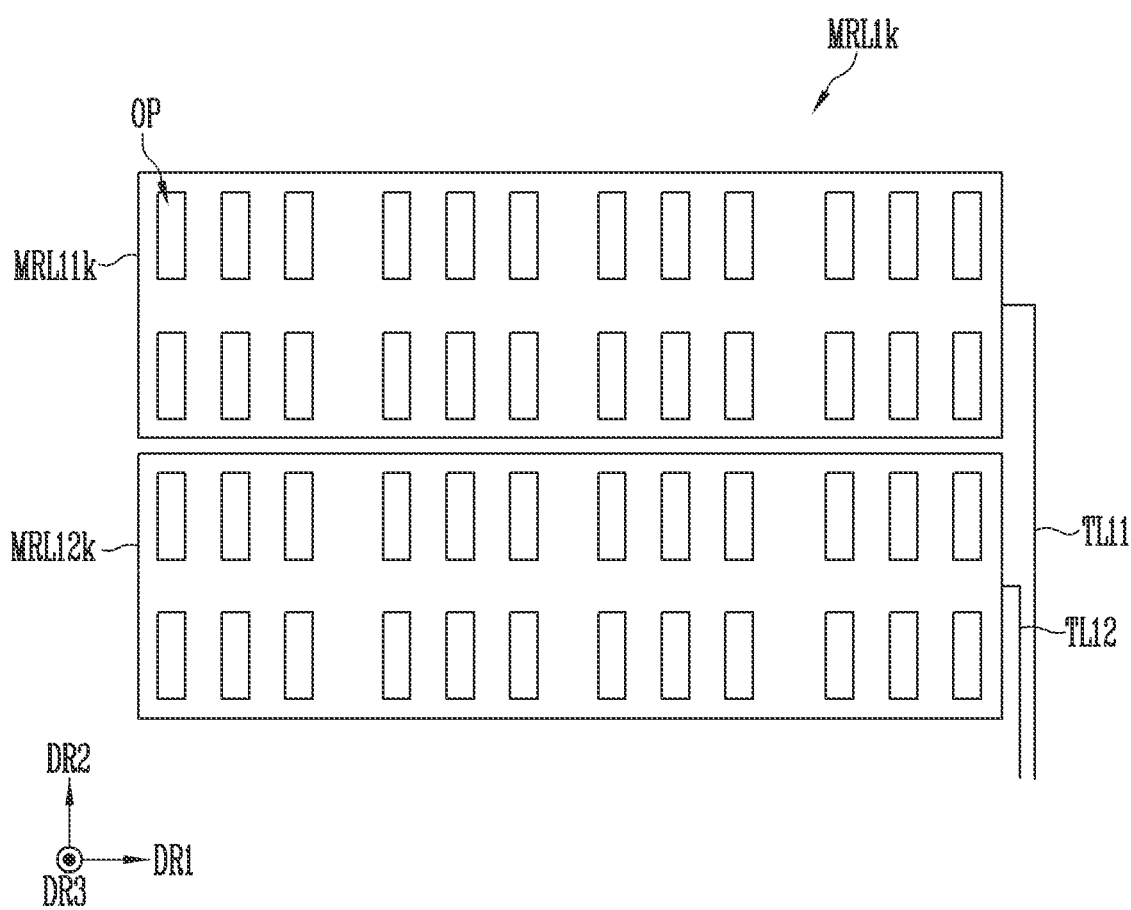
FIG. 26 illustrates a top plan view of a first reflective layer according to one or more embodiments.
Figure 27:
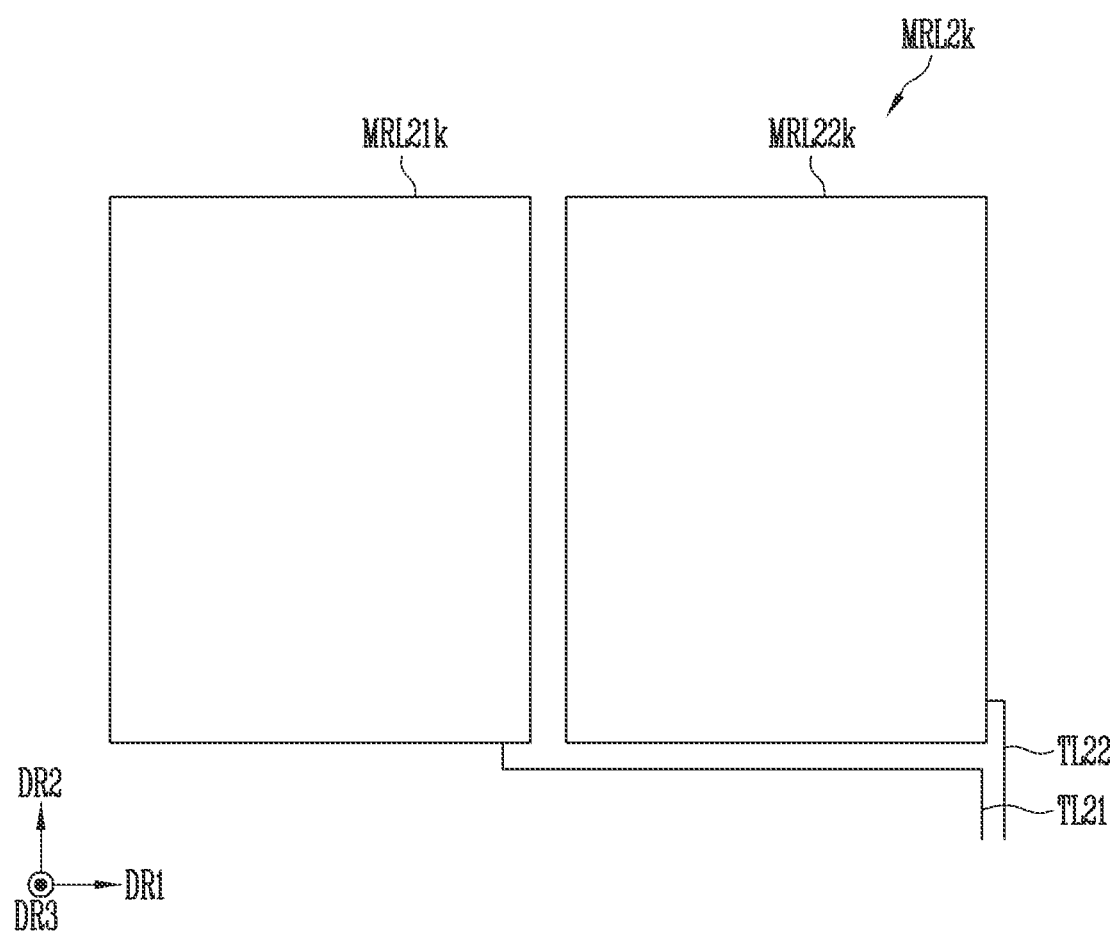
FIG. 27 illustrates a top plan view of a second reflective layer according to one or more embodiments.
Figure 28:
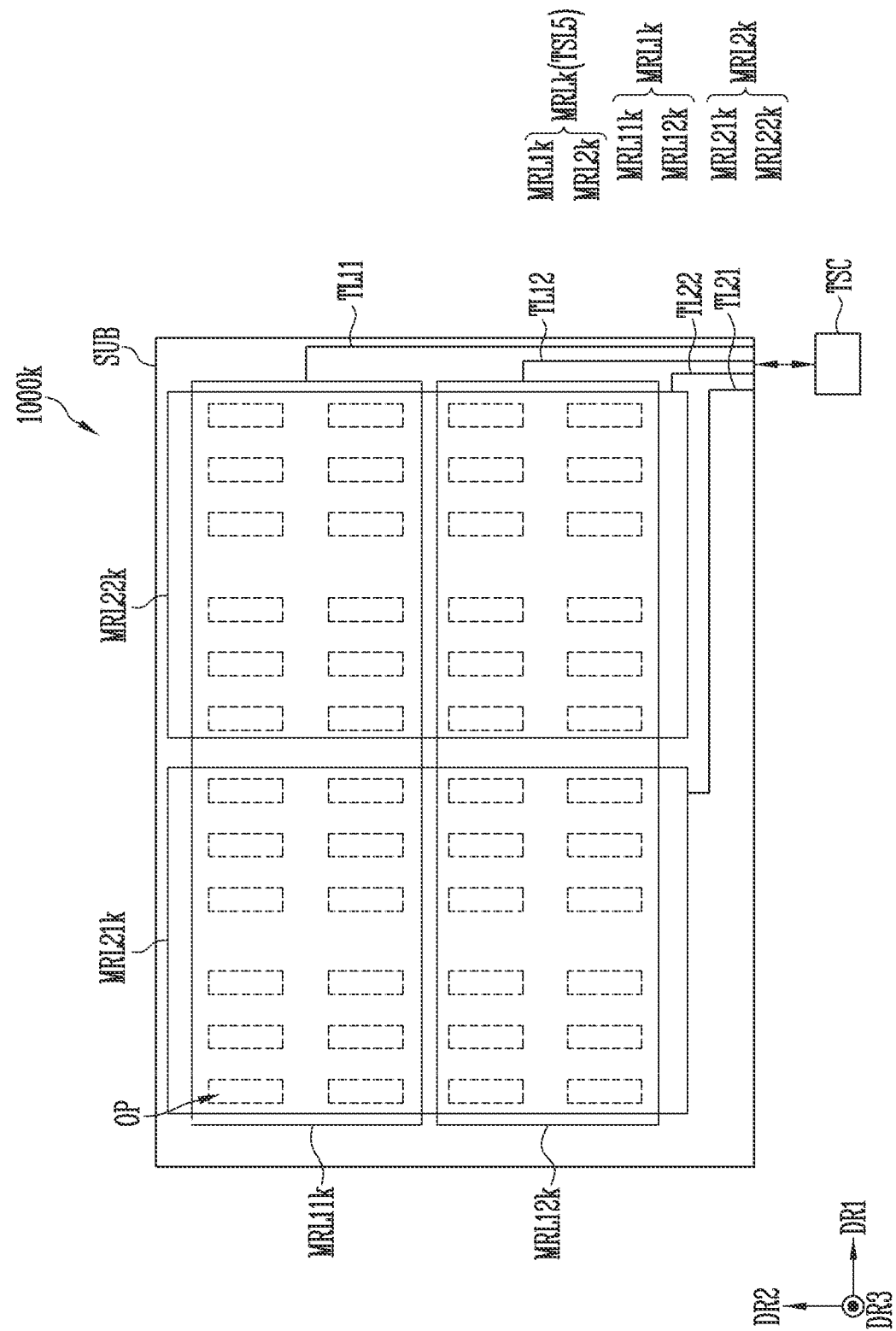
FIG. 28 illustrates a top plan view of a display device according to one or more embodiments.

FIG. 26 illustrates a top plan view of a first reflective layer according to one or more embodiments. FIG. 27 illustrates a top plan view of a second reflective layer according to one or more embodiments. FIG. 28 illustrates a top plan view of a display device according to one or more embodiments.

The embodiment of FIG. 26 to FIG. 28 is different from the previous embodiments in that the display device includes a mutual-capacitance type of touch sensor, and other constituent elements are the same or similar.

Referring to FIG. 26 to FIG. 28, a display device 1000k may include a reflective layer MRLk disposed on the substrate SUB. The reflective layer MRLk may be shared with a touch electrode layer TSL5 of the display device 1000k. For example, the reflective layer MRLk may function as a sensing electrode of a mutual-capacitance type of touch screen panel.

The reflective layer MRLk may include a first reflective layer MRL1k and a second reflective layer MRL2k.

The first reflective layer MRL1k may include a plurality of sensing patterns MRL11k and MRL12k. For example, the plurality of sensing patterns MRL11k and MRL12k may include a first sensing pattern MRL11k and a second sensing pattern MRL12k. Each of the sensing patterns MRL11k and MRL12k may extend along the first direction DR1 and may be arranged to be spaced from each other along the second direction DR2.

Each of the sensing patterns MRL11k and MRL12k may be formed to have a size corresponding to a suitable number (e.g., a set or predetermined number) of pixels (PXL in FIG. 2). For example, each of the sensing patterns MRL11k and MRL12k may be formed to have a size corresponding to two or more pixels. FIG. 26 and FIG. 28 illustrate the structure in which each of the sensing patterns MRL11k and MRL12k is formed to have a size corresponding to 24 pixels, but the present disclosure is not limited thereto.

In addition, the sensing patterns MRL11k and MRL12k may have the same planar area, but are not limited thereto.

The sensing patterns MRL11k and MRL12k of the first reflective layer MRL1k may include an opening OP formed at a position corresponding to each pixel. As described above, the opening OP may at least partially overlap the light emitting element (LD in FIG. 6) of each pixel.

The sensing patterns MRL11k and MRL12k of the first reflective layer MRL1k may be electrically connected to the touch sensing lines TL11 and TL12, respectively. For example, the first sensing pattern MRL11k may be connected to the first touch sensing line TL11, and the second sensing pattern MRL12k may be connected to the second touch sensing line TL12.

In one or more embodiments, the touch sensing lines TL11 and TL12 may be formed at the same layer as the first reflective layer MRL1k, and may be concurrently (e.g., simultaneously) formed. In addition, the touch sensing lines TL11 and TL12 may be made of the same material as the first reflective layer MRL1k. As another embodiment, the touch sensing lines TL11 and TL12 may be formed on a different layer from the first reflective layer MRL1k. In addition, the touch sensing lines TL11 and TL12 may be made of a different material from the first reflective layer MRL1k.

The second reflective layer MRL2k may include a plurality of sensing patterns MRL21k and MRL22k. For example, the plurality of sensing patterns MRL21k and MRL22k may include a third sensing pattern MRL21k and a fourth sensing pattern MRL22k. Each of the sensing patterns MRL21k and MRL22k may extend along the second direction DR2 and may be arranged to be spaced from each other along the first direction DR1. In one or more embodiments, the sensing patterns MRL21k and MRL22k of the second reflective layer MRL2k and the sensing patterns MRL11k and MRL12k of the first reflective layer MRL1k may perpendicularly cross each other in a plan view.

Each of the sensing patterns MRL21k and MRL22k may be formed to have a size corresponding to a suitable number (e.g., a set or predetermined number) of pixels (PXL in FIG. 2). For example, each of the sensing patterns MRL21k and MRL22k may be formed to have a size corresponding to two or more pixels. FIG. 27 and FIG. 28 illustrate the structure in which each of the sensing patterns MRL21k and MRL22k is formed to have a size corresponding to 24 pixels, but the present disclosure is not limited thereto.

In addition, the sensing patterns MRL21k and MRL22k may each have the same planar area, but are not limited thereto.

The second reflective layer MRL2k is disposed on the first reflective layer MRL1k to reduce light scattering that may occur while the light emitted from the light emitting element (LD in FIG. 7A) transmits through the first reflective layer MRL1k, thereby improving visibility of the display device.

The sensing patterns MRL21k and MRL22k of the second reflective layer MRL2k may be electrically connected to the touch sensing lines TL21 and TL22, respectively. For example, the third sensing pattern MRL21k may be connected to the third touch sensing line TL21, and the fourth sensing pattern MRL22k may be connected to the fourth touch sensing line TL22.

In one or more embodiments, the touch sensing lines TL21 and TL22 may be formed at the same layer as the second reflective layer MRL2k, and may be concurrently (or simultaneously) formed. In addition, the touch sensing lines TL21 and TL22 may be made of the same material as the second reflective layer MRL2k. In one or more embodiments, the touch sensing lines TL21 and TL22 may be formed on a different layer from the second reflective layer MRL2k. In addition, the touch sensing lines TL21 and TL22 may be made of a different material from the second reflective layer MRL2k.

The touch sensing lines TL11, TL12, TL21, and TL22 may be connected to a touch sensing controller TSC of the display device 1000k. The touch sensing controller TSC may provide a touch driving signal to the touch sensing lines TL11, TL12, TL21, and TL22, or may receive a touch sensing signal from the touch sensing lines TL11, TL12, TL21, and TL22. For example, one of the touch sensing lines TL11 and TL12 connected to the first reflective layer MRL1k and the touch sensing lines TL21 and TL22 connected to the second reflective layer MRL2k may receive a touch driving signal from the touch sensing controller TSC, and the other lines thereof may receive a touch sensing signal from the touch sensing controller TSC. The position of the touch sensing controller TSC is not limited thereto, and may be formed on a separate member to be connected thereto by other wires.

A separate insulation member (for example, the fourth insulation layer INS4 of FIG. 19) may be disposed between the first reflective layer MRL1k and the second reflective layer MRL2k, and the first reflective layer MRL1k and the second reflective layer MRL2k may be electrically isolated from each other.

As described above, the reflective layer MRLk may be shared with the touch electrode layer TSL5, and may function as a sensing electrode of a mutual-capacitance type of touch screen panel. For example, when an external conductor (for example, a user's finger) touches (or is adjacent to) the display device 1000k, the mutual capacitance value may be changed at the touched position. That is, the value of the mutual capacitance formed between the first reflective layer MRL1k and the second reflective layer MRL2k may be changed. The change in the mutual capacitance value of the first reflective layer MRL1k and the second reflective layer MRL2k may be a touch sensing signal for touch sensing, and the touch sensing signal may be provided to the touch sensing controller TSC through the touch sensing lines TL11, TL12, TL21, and TL22 connected to the reflective layer MRLk. The touch sensing controller TSC (or an operation processing device connected to the touch sensing controller TSC) may determine a position where an external conductor is touched based on the touch sensing signal according to the change in the mutual capacitance value.

Figure 29:
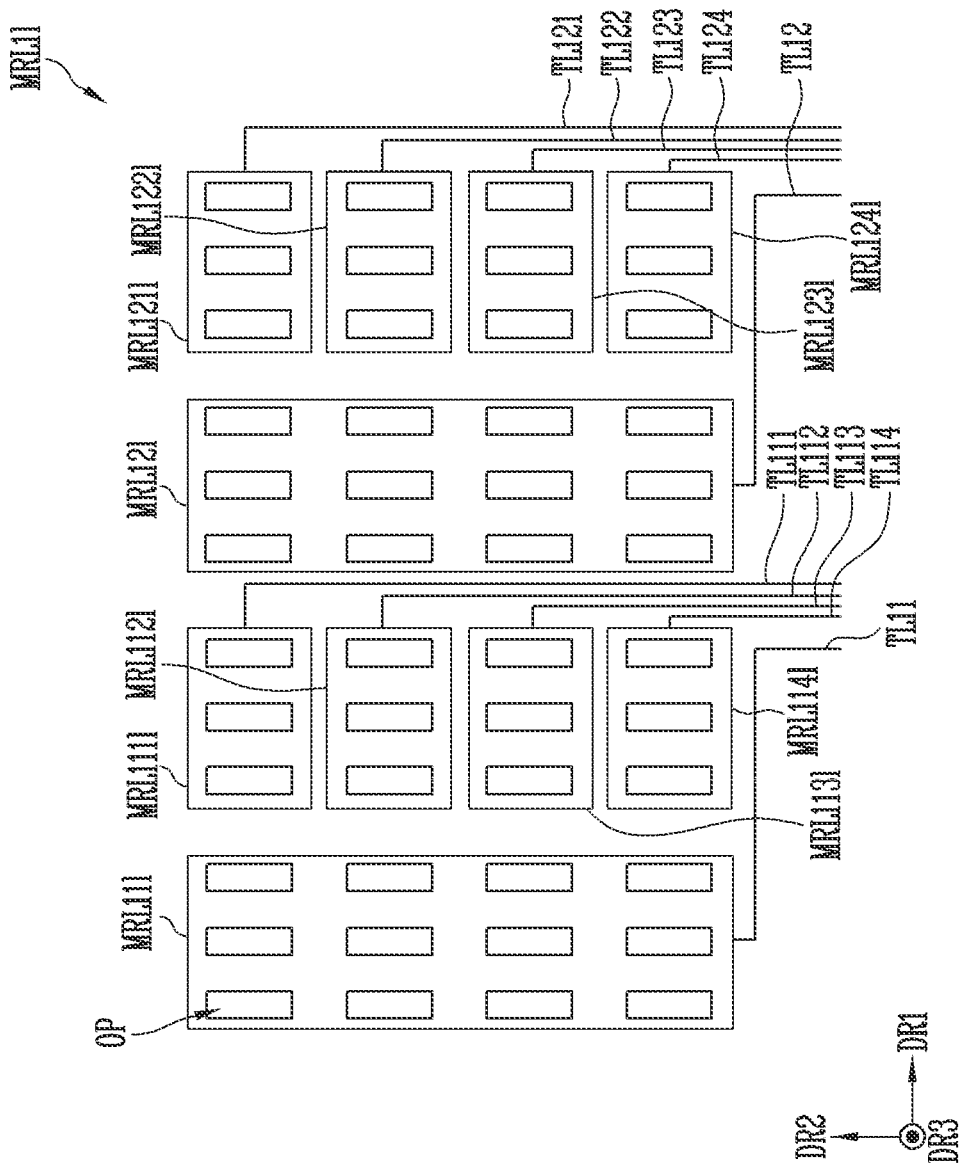
FIG. 29 illustrates a top plan view of a first reflective layer according to one or more embodiments.
Figure 30:
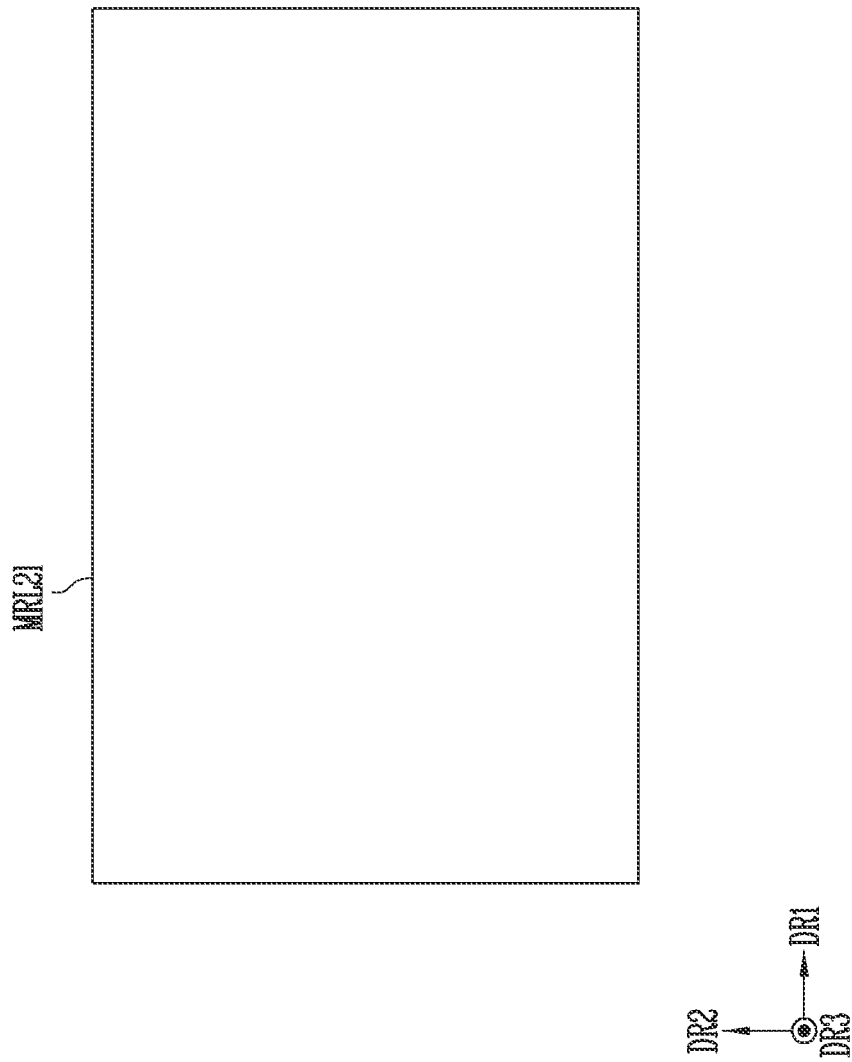
FIG. 30 illustrates a top plan view of a second reflective layer according to one or more embodiments.
Figure 31:
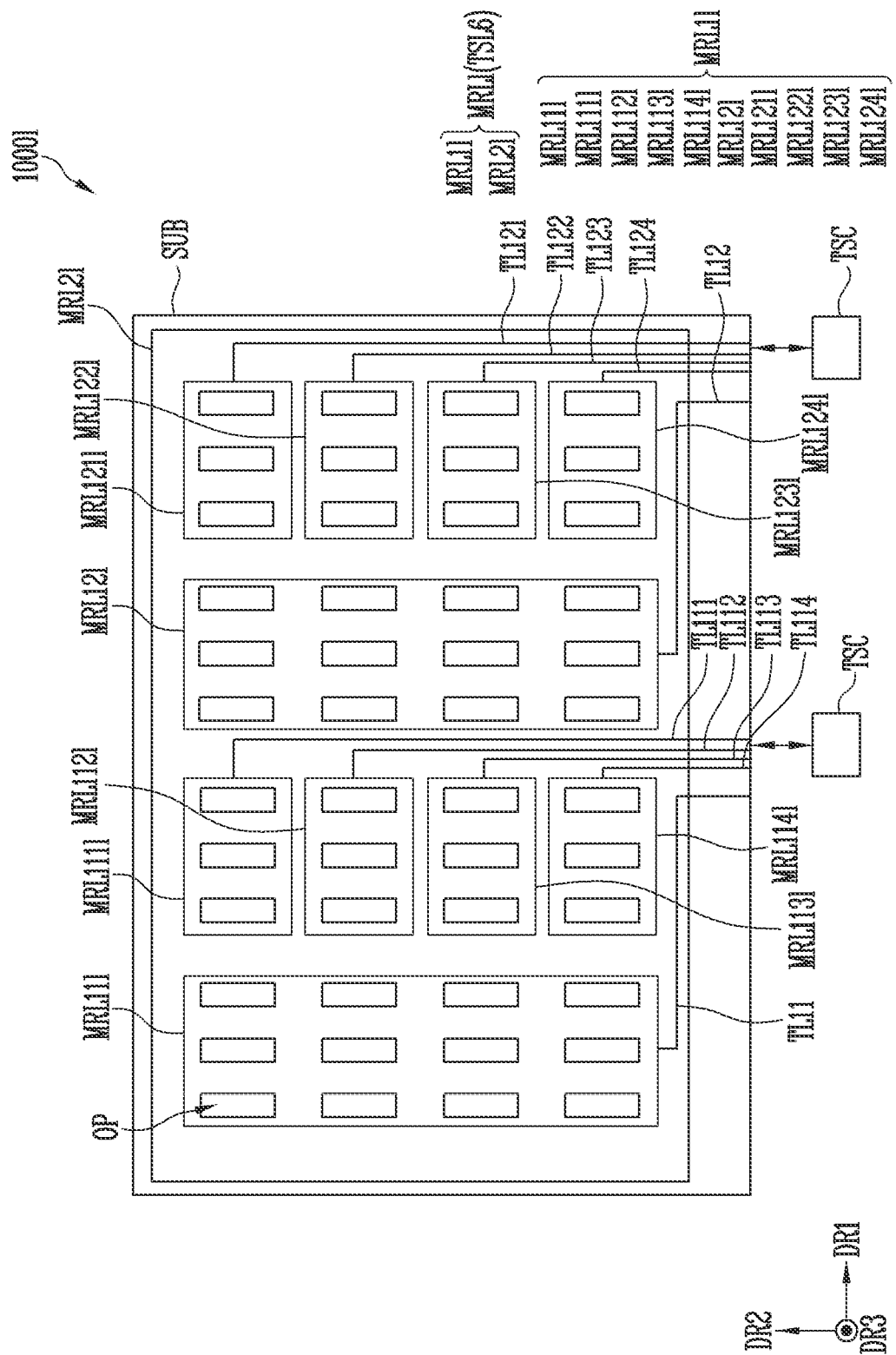
FIG. 31 illustrates a top plan view of a display device according to one or more embodiments.

FIG. 29 illustrates a top plan view of a first reflective layer according to one or more embodiments. FIG. 30 illustrates a top plan view of a second reflective layer according to one or more embodiments. FIG. 31 illustrates a top plan view of a display device according to one or more embodiments.

The embodiment of FIG. 29 to FIG. 31 is different from the embodiments of FIG. 26 to FIG. 28 in that the first reflective layer includes a sensing pattern and sub-sensing patterns, and a mutual capacitance value is formed between the sensing pattern and respective sub-sensing patterns, and other constituent elements are the same or similar.

Referring to FIG. 29 to FIG. 31, a display device 1000l may include a reflective layer MRLl disposed on the substrate SUB. The reflective layer MRLl may be shared with a touch electrode layer TSL6 of the display device 1000l. For example, the reflective layer MRLl may function as a sensing electrode of a mutual-capacitance type of touch screen panel.

The reflective layer MRLl may include a first reflective layer MRL1l and a second reflective layer MRL2l.

The first reflective layer MRL1l may include a plurality of sensing patterns MRL11l, MRL111l, MRL112l, MRL113l, MRL114l, MRL12l, MRL121l, MRL122l, MRL123l, and MRL124l. For example, the plurality of sensing patterns may include a first sensing pattern MRL11l, first sub-sensing patterns MRL111l, MRL112l, MRL113l, and MRL114l, a second sensing pattern MRL121, and second sub-sensing patterns MRL1211, MRL1221, MRL1231, and MRL1241.

Each of the sensing patterns MRL11l, MRL111l, MRL112l, MRL113l, MRL114l, MRL12l, MRL121l, MRL122l, MRL123l, and MRL124l may be formed to have a size corresponding to a suitable number (e.g., a set or predetermined number) of pixels (PXL in FIG. 2). For example, each of the sensing patterns MRL11l, MRL111l, MRL112l, MRL113l, MRL114l, MRL12l, MRL121l, MRL122l, MRL123l, and MRL1241 may be formed to have a size corresponding to two or more pixels. FIG. 29 and FIG. 31 illustrate the structure in which each of the first sensing pattern MRL11l and the second sensing pattern MRL12l is formed to have a size corresponding to twelve pixels, and in which each of the first sub-sensing patterns MRL111l, MRL112l, MRL113l, and MRL114l and each of the second sub-sensing patterns MRL1211, MRL122l, MRL123l, and MRL124l are formed to have a size corresponding to three pixels, but the present disclosure is not limited thereto.

The sensing patterns MRL11l, MRL111l, MRL112l, MRL113l, MRL114l, MRL12l, MRL121l, MRL122l, MRL123l, and MRL124l of the first reflective layer MRL1l may include an opening OP formed at a position corresponding to each pixel. As described above, the opening OP may at least partially overlap the light emitting element (LD in FIG. 6) of each pixel.

The sensing patterns MRL11l, MRL111l, MRL112l, MRL113l, MRL114l, MRL12l, MRL121l, MRL122l, MRL123l, and MRL124l of the first reflective layer MRL1l may be electrically connected to the touch sensing lines TL11, TL111, TL112, TL113, TL114, TL12, TL121, TL122, TL123, TL124, respectively.

As an embodiment, the touch sensing lines TL11, TL111, TL112, TL113, TL114, TL12, TL121, TL122, TL123, and TL124 may be formed at the same layer as the first reflective layer MRL11, and may be concurrently (or simultaneously) formed. In addition, the touch sensing lines TL11, TL111, TL112, TL113, TL114, TL12, TL121, TL122, TL123, and TL124 may be made of the same material as the first reflective layer MRL11. In one or more embodiments, at least some of the touch sensing lines TL11, TL111, TL112, TL113, TL114, TL12, TL121, TL122, TL123, and TL124 may be formed on a different layer from the first reflective layer MRL11. In addition, the touch sensing lines TL11, TL111, TL112, TL113, TL114, TL12, TL121, TL122, TL123, and TL124 may be formed of a different material from the first reflective layer MRL11.

The touch sensing lines TL11, TL111, TL112, TL113, TL114, TL12, TL121, TL122, TL123, and TL124 may be connected to a touch sensing controller TSC of the display device 1000*l*. The touch sensing controller TSC may provide a touch driving signal to the touch sensing lines TL11, TL111, TL112, TL113, TL114, TL12, TL121, TL122, TL123, and TL124, or may receive a touch sensing signal from the touch sensing lines TL11, TL111, T112, TL113, T114, TL12, TL121, TL122, TL123, and TL124. For example, the touch sensing lines TL11 and TL12 connected to the first sensing pattern MRL11*l* and the second sensing pattern MRL121 may receive a touch driving signal from the touch sensing controller TSC, and the touch sensing lines TL111, TL112, TL113, TL114, TL121, TL122, TL123, and TL124 connected to the first sub-sensing patterns MRL111*l*, MRL112*l*, MRL113*l*, and MRL114*l* and the second sub-sensing patterns MRL121*l*, MRL122*l*, MRL123*l*, and MRL124*l* may receive a touch sensing signal from the touch sensing controller TSC. The position of the touch sensing controller TSC is not limited thereto, and may be formed on a separate member to be connected thereto by other wires.

The second reflective layer MRL2*l* may be a reflective pattern disposed on the first reflective layer MRL1*l*. The second reflective layer MRL2*l* may be entirely formed on the first reflective layer MRL1*l* and may be integrally formed therewith, but in one or more embodiments, it may also be configured of a plurality of reflective patterns.

The second reflective layer MRL2*l* is disposed on the first reflective layer MRL11 to reduce light scattering that may occur while the light emitted from the light emitting element (LD in FIG. 7A) transmits through the first reflective layer MRL11, thereby improving visibility of the display device.

A separate insulation member (for example, the fourth insulation layer INS4 of FIG. 19) may be disposed between the first reflective layer MRL1*l* and the second reflective layer MRL2*l*, and the first reflective layer MRL1*l* and the second reflective layer MRL2*l* may be electrically isolated from each other. Accordingly, the first reflective layer MRL1*l* may function as a touch sensing electrode regardless of the shape of the second reflective layer MRL2*l*.

As described above, the reflective layer MRLl may be shared with the touch electrode layer TSL6, and may function as a sensing electrode of a mutual-capacitance type of touch screen panel.

In one or more embodiments, a constant mutual capacitance value may be formed between the first sensing pattern MRL11*l* and each of the first sub sensing patterns MRL111*l*, MRL112*l*, MRL113*l*, and MRL114*l*. When an external conductor (for example, a user's finger) touches (or is adjacent to) the display device 1000I, the value of the mutual capacitance formed between the second reflective layer MRL2*l* and the first sensing pattern MRL11*l* and each of the first sub-sensing patterns MRL111*l*, MRL112*l*, MRL113*l*, and MRL114*l* may be changed at the touched position. The change in the mutual capacitance value may be a touch sensing signal for touch sensing, and the touch sensing signal may be provided to the touch sensing controller TSC through the touch sensing lines TL11, TL111, TL112, TL113, and TL114 connected to the reflective layer MRLl. The touch sensing controller TSC (or an operation processing device connected to the touch sensing controller TSC) may determine a position where an external conductor is touched based on the touch sensing signal according to the change in the mutual capacitance value.

Figure 32:
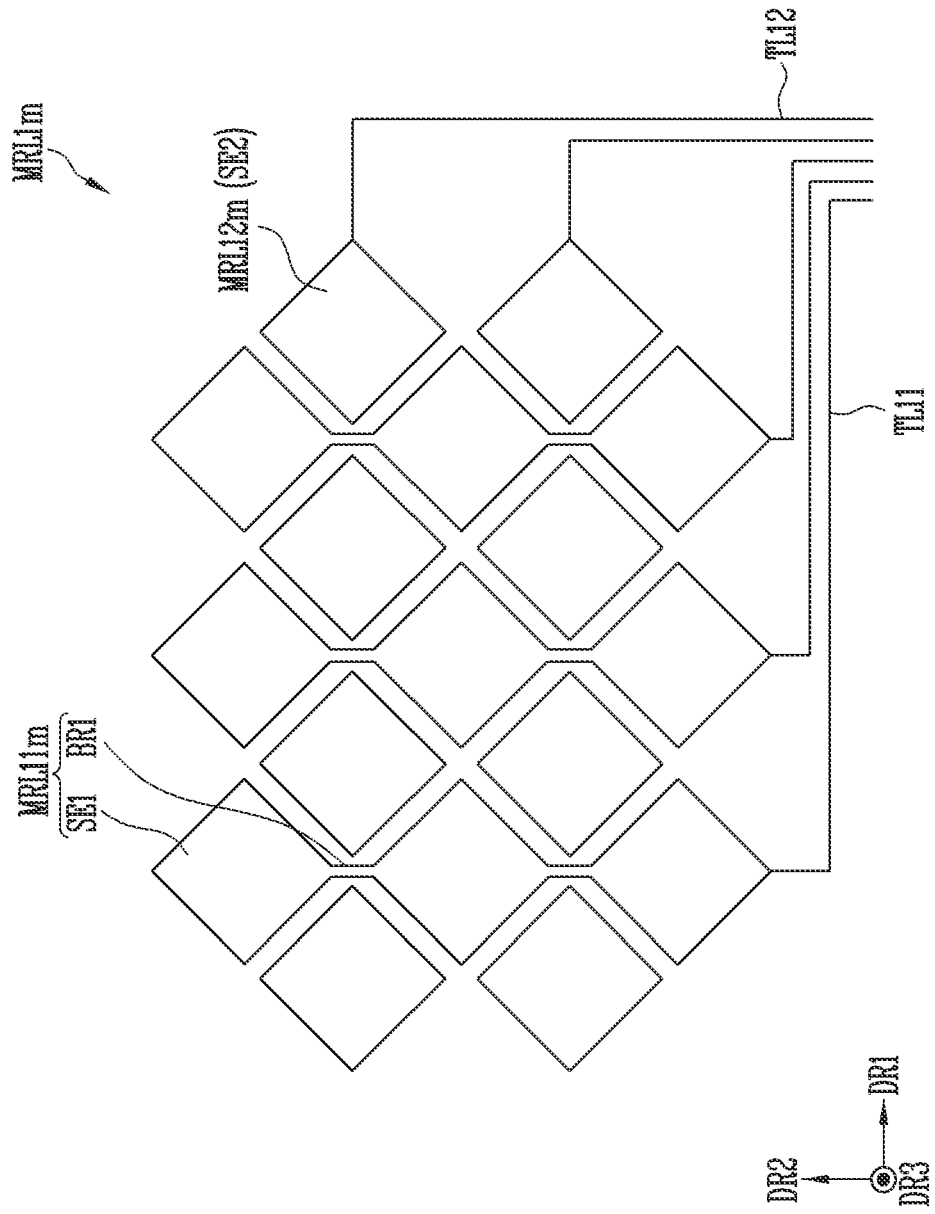
FIG. 32 illustrates a top plan view of a first reflective layer according to one or more embodiments.
Figure 33:
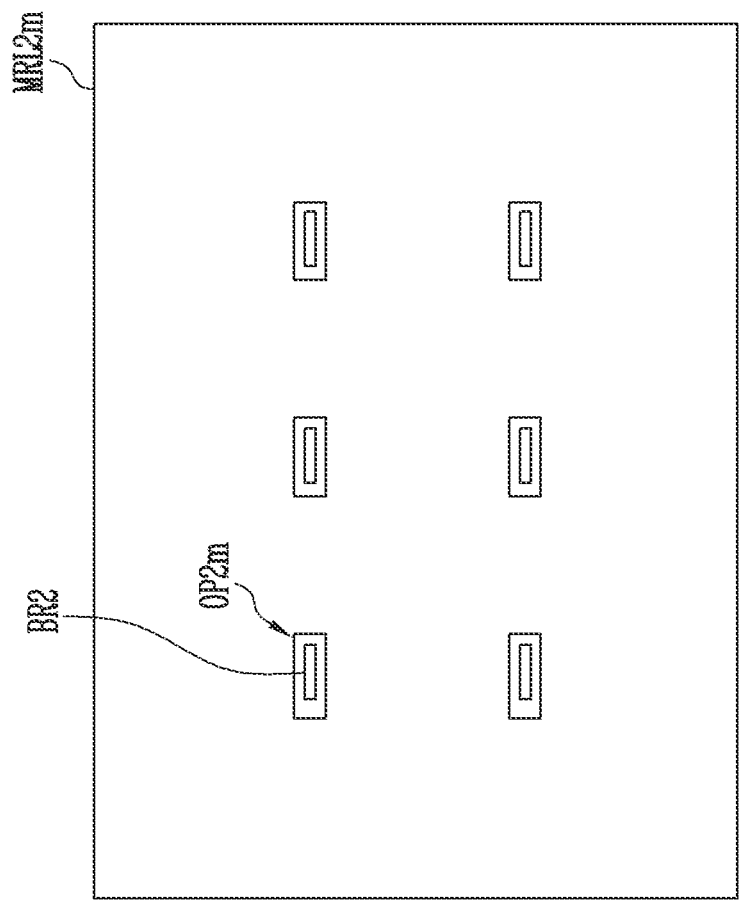
FIG. 33 illustrates a top plan view of a second reflective layer according to one or more embodiments.
Figure 34:
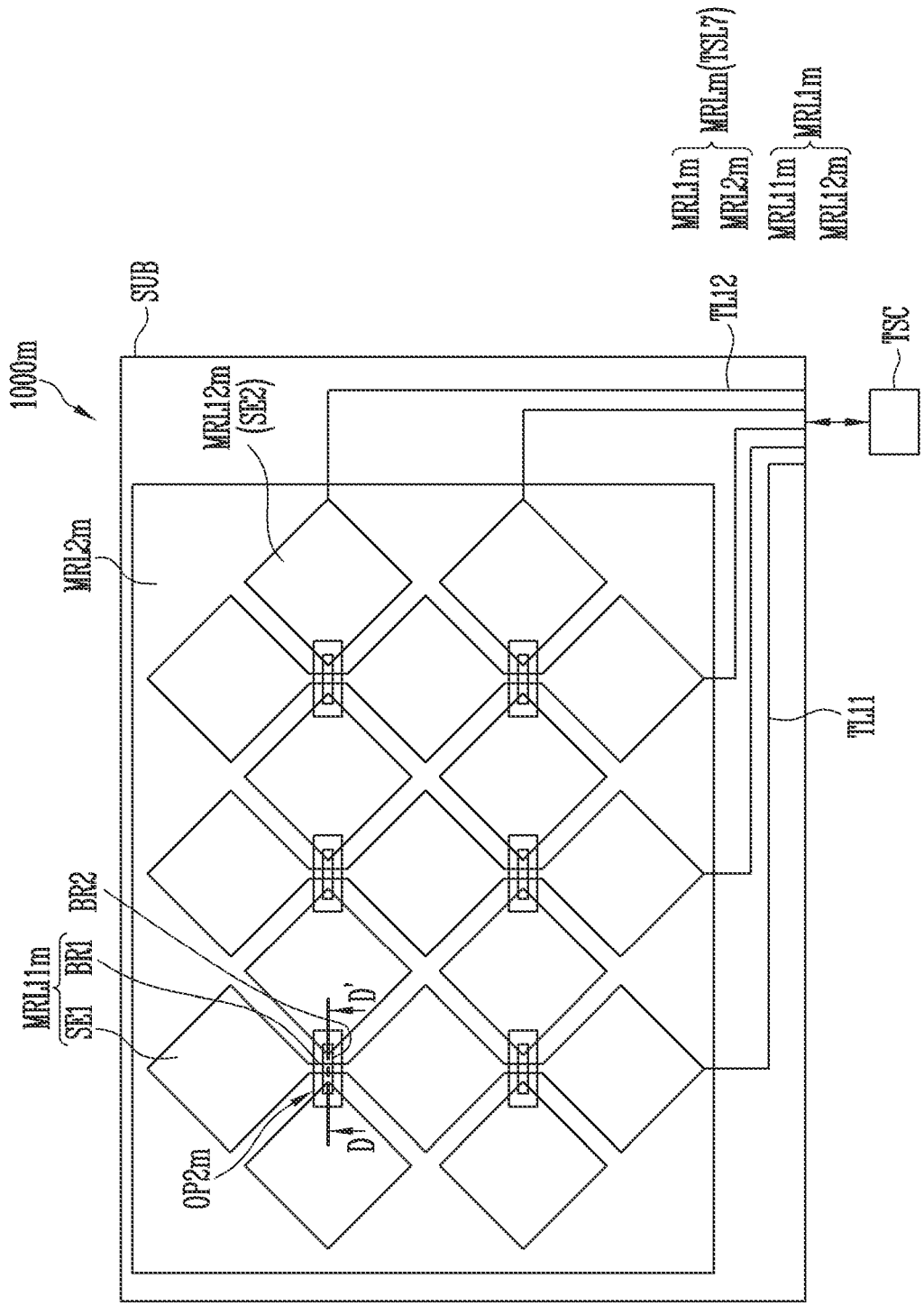
FIG. 34 illustrates a top plan view of a display device according to one or more embodiments.
Figure 35:
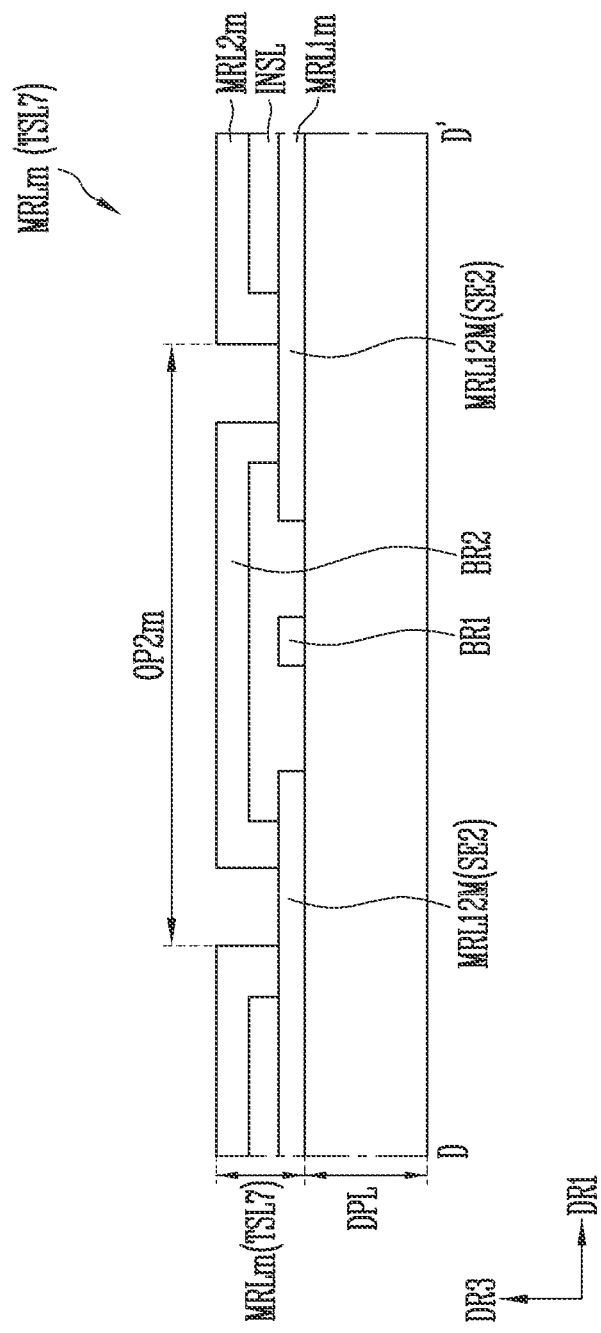
FIG. 35 illustrates a cross-sectional view taken along the line D-D' of FIG. 34.

FIG. 32 illustrates a top plan view of a first reflective layer according to one or more embodiments. FIG. 33 illustrates a top plan view of a second reflective layer according to one or more embodiments. FIG. 34 illustrates a top plan view of a display device according to one or more embodiments. FIG. 35 illustrates a cross-sectional view taken along the line D-D' of FIG. 34.

The embodiment of FIG. 32 to FIG. 35 is different from the embodiment of FIG. 26 to FIG. 28 in that the first reflective layer includes the first sensing patterns and the second sensing patterns, and the second reflective layer includes a second connection portion connecting the second sensing patterns, and other constituent elements are the same or similar.

Referring to FIG. 32 to FIG. 35, a display device 1000*m* may include a reflective layer MRLm disposed on the substrate SUB. The reflective layer MRLm may be shared with a touch electrode layer TSL7 of the display device 1000*m*. For example, the reflective layer MRLm may function as a sensing electrode of a mutual-capacitance type of touch screen panel.

The reflective layer MRLm may include a first reflective layer MRL1*m* and a second reflective layer MRL2*m*.

The first reflective layer MRL1*m* may include a plurality of sensing patterns MRL11*m* and MRL12*m*. For example, the plurality of sensing patterns MRL11*m* and MRL12*m* may include a first sensing pattern MRL11*m* and a second sensing pattern MRL12*m*. The first sensing pattern MRL11*m* may include a plurality of first sensing electrodes SE1 and a first connection portion BR1 electrically connecting the first sensing electrodes SE1 adjacent to each other along the second direction DR2. The first sensing electrodes SE1 and the first connection portion BR1 connecting them may be integrally formed. In addition, the second sensing pattern MRL12*m* may include second sensing electrodes SE2, and the second sensing electrodes SE2 may be respectively formed between the first sensing electrodes SE1.

The first sensing electrodes SE1 and the second sensing electrodes SE2 may have a rhombus shape, but are not limited thereto, and the shapes of the first sensing electrodes SE1 and the second sensing electrodes SE2 may be modified into various shapes such as a triangle, a circle, and a bar shape.

In one or more embodiments, the sensing patterns MRL11*m* and MRL12*m* of the first reflective layer MRL1*m* may include an opening (OP in FIG. 19) formed at a position corresponding to each pixel. As described above, the opening OP may at least partially overlap the light emitting element (LD in FIG. 6) of each pixel.

The sensing patterns MRL11*m* and MRL12*m* of the first reflective layer MRL1*m* may be electrically connected to the touch sensing lines TL11 and TL12, respectively. For example, the first sensing pattern MRL11m may be connected to the first touch sensing line TL11, and the second sensing pattern MRL12m may be connected to the second touch sensing line TL12.

In one or more embodiments, the touch sensing lines TL11 and TL12 may be formed at the same layer as the first reflective layer MRL1m, and may be concurrently (e.g., simultaneously) formed. In addition, the touch sensing lines TL11 and TL12 may be made of the same material as the first reflective layer MRL1m. In one or more embodiments, the touch sensing lines TL11 and TL12 may be formed on a different layer from the first reflective layer MRL1m. In addition, the touch sensing lines TL11 and TL12 may be made of a different material from the first reflective layer MRL1m.

The touch sensing lines TL11 and TL12 may be connected to a touch sensing controller TSC of the display device 1000m. The touch sensing controller TSC may provide a touch driving signal to the touch sensing lines TL11 and TL12, or may receive a touch sensing signal from the touch sensing lines TL11 and TL12. For example, the first touch sensing line TL11 connected to the first electrode pattern MRL11m receives a touch driving signal from the touch sensing controller TSC, and the second touch sensing line TL12 connected to the second electrode pattern MRL12m receives a touch sensing signal from the touch sensing controller TSC, but the present disclosure is not limited thereto.

The second reflective layer MRL2m may include a second connection portion BR2 connecting the second sensing electrodes SE2. For example, the second reflective layer MRL2m may include a connection opening OP2m exposing between the second sensing electrodes SE2 arranged along the first direction DR1, and may include the second connection portion BR2 formed in the connection opening OP2m. The second connection portion BR2 may electrically connect the second sensing electrodes SE2 of the first reflective layer MRL1m adjacent to each other along the first direction DR1. The first sensing electrodes SE1 connected to by the first connection portion BR1 may cross the second sensing electrodes SE2 connected to by the second connection portion BR2.

In addition, the second reflective layer MRL2m may reduce light scattering that may occur while the light emitted from the light emitting element (LD in FIG. 7A) transmits through the first reflective layer MRL1m, thereby improving visibility of the display device.

An insulation layer INSL may be disposed between the first reflective layer MRL1m and the second reflective layer MRL2m. The first sensing pattern MRL11m of the first reflective layer MRL1m may be insulated from the second connection portion BR2 of the second reflective layer MRL2m by the insulation layer INSL. The insulation layer INSL may be formed in the connection opening OP2m to be disposed between the first connection portion BR1 and the second connection portion BR2, and in one or more embodiments, it may also be formed in between the first sensing electrodes SE1 and the second sensing electrodes SE2 in an area other than the connection opening OP2m.

As described above, the reflective layer MRLm may be shared with the touch electrode layer TSL7, and may function as a sensing electrode of a mutual-capacitance type of touch screen panel. For example, a mutual capacitance value may be formed between the first sensing electrodes SE1 connected by the first connection portion BR1 and the second sensing electrodes SE2 connected by the second connection portion BR2, and when an external conductor (for example, a user's finger) touches (or is adjacent to) the display device 1000m, the mutual capacitance value may be changed at the touched position. The change in the mutual capacitance value may be a touch sensing signal for touch sensing, and the touch sensing signal may be provided to the touch sensing controller TSC through the touch sensing lines TL1 and TL12. The touch sensing controller TSC (or an operation processing device connected to the touch sensing controller TSC) may determine a position where an external conductor is touched based on the touch sensing signal according to the change in the mutual capacitance.

Hereinafter, other embodiments of the display device will be described. The embodiments of FIG. 36 to FIG. 45 may include a structure in which the reflective layer is shared with a pressure sensor. In the following embodiment, the same components as those in the previously described embodiment are denoted by the same reference numerals, and descriptions thereof will be omitted or simplified, and differences will be mainly described.

Figure 36:
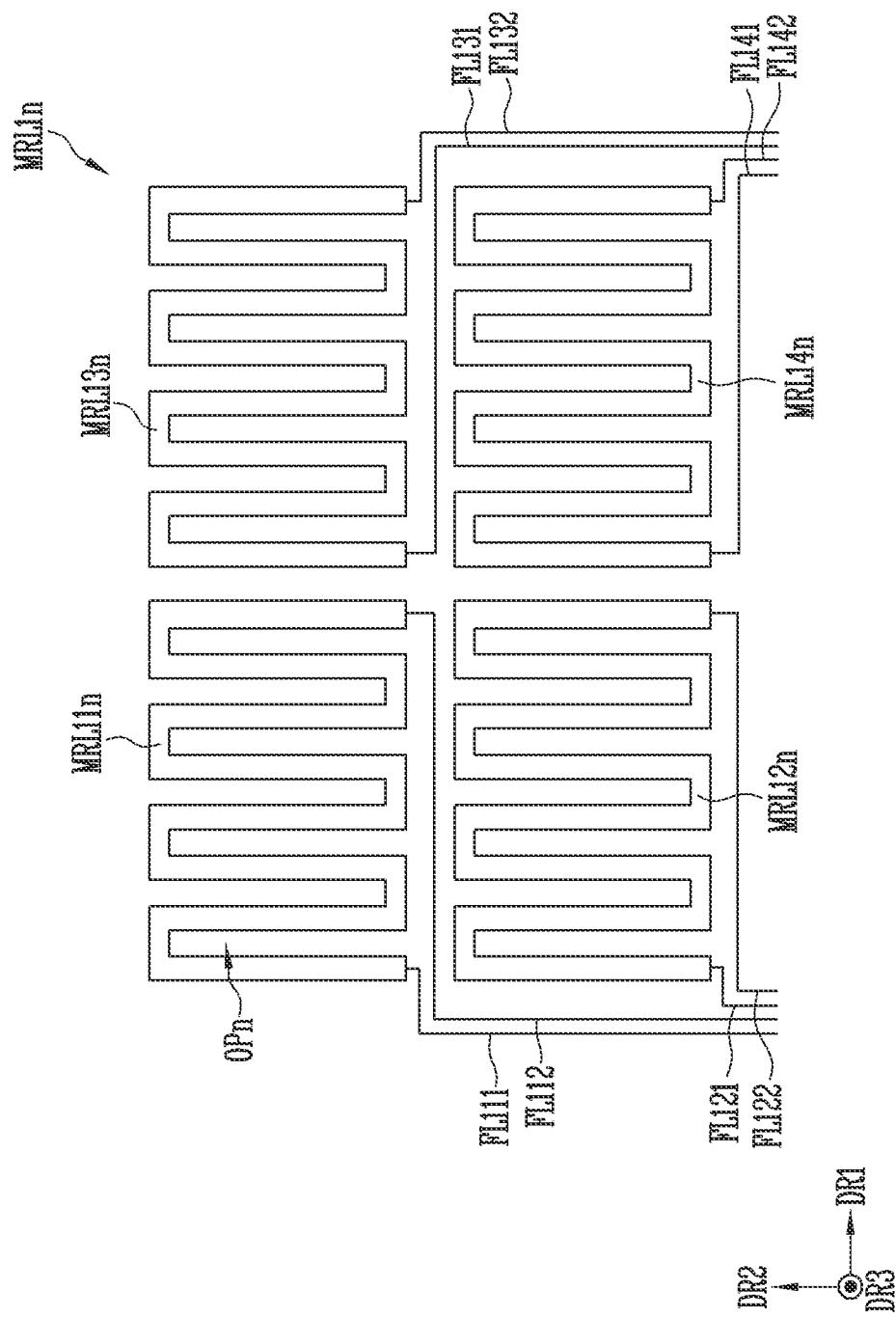
FIG. 36 illustrates a top plan view of a first reflective layer according to one or more embodiments.
Figure 37:
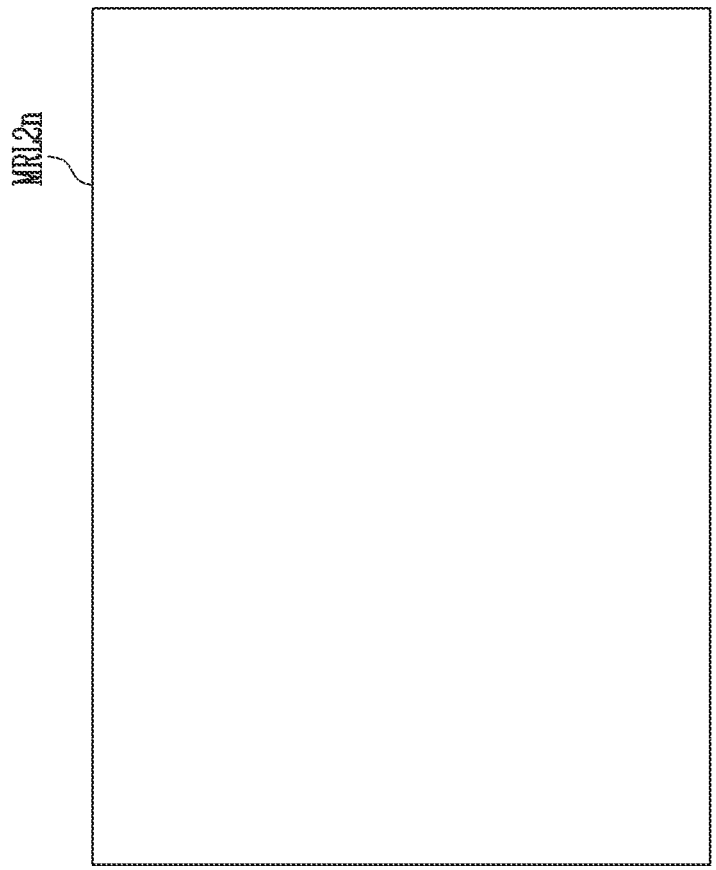
FIG. 37 illustrates a top plan view of a second reflective layer according to one or more embodiments.
Figure 38:
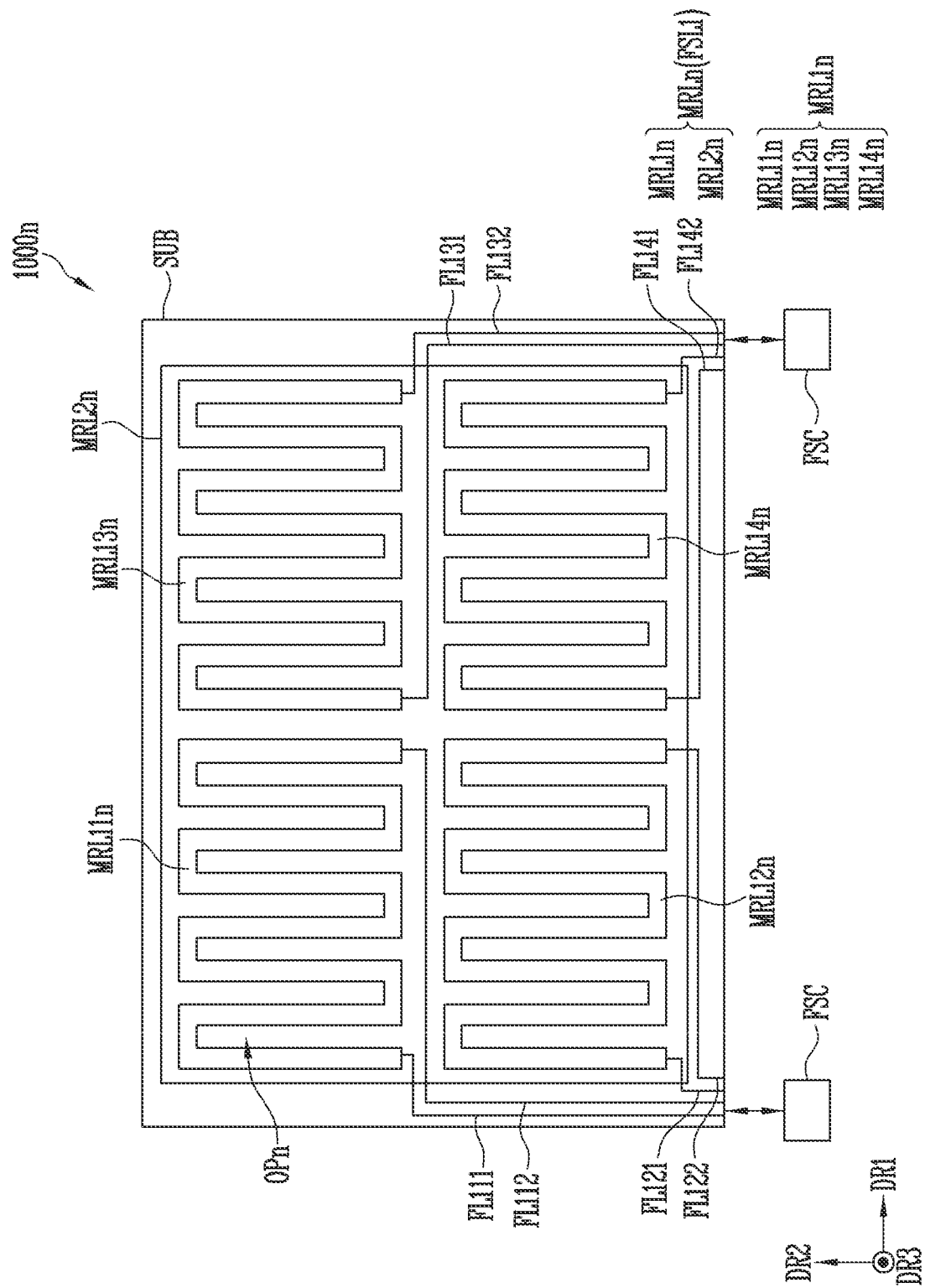
FIG. 38 illustrates a top plan view of a display device according to one or more embodiments.
Figure 39:
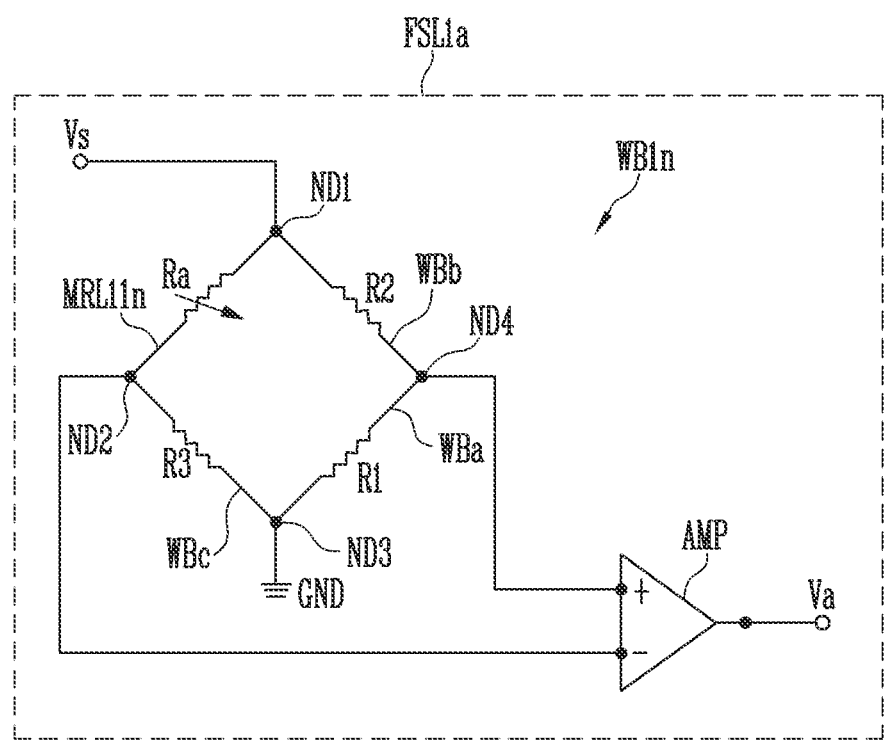
FIG. 39 schematically illustrates a first pressure sensing part including a first sensing pattern of FIG. 38.

FIG. 36 illustrates a top plan view of a first reflective layer according to one or more embodiments. FIG. 37 illustrates a top plan view of a second reflective layer according to one or more embodiments. FIG. 38 illustrates a top plan view of a display device according to one or more embodiments. FIG. 39 schematically illustrates a first pressure sensing part including a first sensing pattern of FIG. 38.

Referring to FIG. 36 to FIG. 39, a display device 1000n may include a reflective layer MRLn disposed on the substrate SUB. The reflective layer MRLn may be shared with a pressure sensing layer FSL1 of the display device 1000n. For example, the reflective layer MRLn may function as a strain gauge in which its resistance value is changed by its length or cross-sectional area being changed when an external force is applied.

The reflective layer MRLn may include a first reflective layer MRL1n and a second reflective layer MRL2n.

The first reflective layer MRL1n may include a plurality of sensing patterns MRL11n, MRL12n, MRL13n, and MRL14n. For example, the plurality of sensing patterns MRL11n, MRL12n, MRL13n, and MRL14n may include a first sensing pattern MRL11n, a second sensing pattern MRL12n, a third sensing pattern MRL13n, and a fourth sensing pattern MRL14n.

Each of the sensing patterns MRL11n, MRL12n, MRL13n, and MRL14n may be formed to have a size corresponding to a suitable number (e.g., a set or predetermined number) of pixels (PXL in FIG. 2). For example, each of the sensing patterns MRL11n, MRL12n, MRL13n, and MRL14n may be formed to have a size corresponding to one pixel, or may be formed to have a size corresponding to two or more pixels.

Each of the sensing patterns MRL11n, MRL12n, MRL13n, and MRL14n may be configured as a strain sensing element to be able to detect minute displacements. For example, each of the sensing patterns MRL11n, MRL12n, MRL13n, and MRL14n may be a strain gauge having a shape at least partially curved to have a suitable pattern (e.g., a set or predetermined pattern). Due to the curved shape, each of the patterns may include an opening OPn. The opening OPn may at least partially overlap the light emitting element (LD in FIG. 6) of each of the pixels.

Each of the sensing patterns MRL11n, MRL12n, MRL13n, and MRL14n may have one end portion and the other end portion along the curved shape. The sensing patterns MRL11n, MRL12n, MRL13n, and MRL14n may be respectively connected to pressure sensing lines FL111, FL112, FL121, FL122, FL131, FL132, FL141, and FL142 at one end portion and the other end portion. For example, the first pressure sensing line FL111 may be connected to one end portion of the first sensing pattern MRL11n, and the second pressure sensing line FL112 may be connected to the other end portion of the first sensing pattern MRL11n. The third pressure sensing line FL121 may be connected to one end portion of the second sensing pattern MRL12n, and the fourth pressure sensing line FL122 may be connected to the other end portion of the second sensing pattern MRL12n. The fifth pressure sensing line FL131 may be connected to one end portion of the third sensing pattern MRL13n, and the sixth pressure sensing line FL132 may be connected to the other end portion of the third sensing pattern MRL13n. The seventh pressure sensing line FL141 may be connected to one end portion of the fourth sensing pattern MRL14n, and the eighth pressure sensing line FL142 may be connected to the other end portion of the fourth sensing pattern MRL14n.

In the described embodiment, the pressure sensing lines FL111, FL112, FL121, FL122, FL131, FL132, FL141, and FL142 are formed at the same layer as the first reflective layer MRL1n, and may be concurrently (or simultaneously) formed. In addition, the pressure sensing lines FL111, FL112, FL121, FL122, FL131, FL132, FL141, and FL142 may be made of the same material as the first reflective layer MRL1n. In one or more embodiments, the pressure sensing lines FL111, FL112, FL121, FL122, FL131, FL132, FL141, and FL142 may be formed of a different layer from the first reflective layer MRL1n. In addition, the pressure sensing lines FL111, FL112, FL121, FL122, FL131, FL132, FL141, and FL142 may be made of a different material from the first reflective layer MRL1n.

The pressure sensing lines FL111, FL112, FL121, FL122, FL131, FL132, FL141, and FL142 may be connected to a pressure sensing controller FSC of the display device 1000n. The pressure sensing controller FSC may receive a pressure sensing signal generated from the sensing patterns MRL11n, MRL12n, MRL13n, and MRL14n through the pressure sensing lines FL111, FL112, FL121, FL122, FL131, FL132, FL141, and FL142.

The second reflective layer MRL2n may be disposed on the first reflective layer MRL1n to reduce light scattering that may occur while the light emitted from the light emitting element (LD in FIG. 7A) transmits through the first reflective layer MRL1n, thereby improving visibility of the display device. The second reflective layer MRL2n may be entirely formed on the first reflective layer MRL1n and may be integrally formed therewith, but in one or more embodiments, it may also be configured of a plurality of reflective patterns.

A separate insulation member (for example, the fourth insulation layer INS4 of FIG. 19) may be disposed between the first reflective layer MRL1n and the second reflective layer MRL2n, and the first reflective layer MRL1n and the second reflective layer MRL2n may be electrically isolated from each other.

As described above, the reflective layer MRLn may be shared with the pressure sensing layer FSL1. For example, the display device 1000n may include a plurality of pressure sensing portions including the sensing patterns MRL11n, MRL12n, MRL13n, and MRL14n. In the described embodiment, the plurality of pressure sensing portions may be constituent elements included in the pressure sensing controller FSC of the display device 1000n, but are not limited thereto.

For example, the display device 1000n may include a first pressure sensing portion FSL1a including a wheatstone bridge circuit part WB1n. The first pressure sensing portion FSL1a may further include an analog-to-digital converter (ADC) and a processor for detecting a pressure sensing signal outputted from the wheatstone bridge circuit part WB1n.

The wheatstone bridge circuit part WB1n may include a first node ND1, a second node ND2, a third node ND3, and a fourth node ND4. A driving voltage Vs may be provided to the first node ND1, and the third node ND3 may be connected to a ground portion GND. The first node ND1 and the third node ND3 may be, for example, input nodes.

The wheatstone bridge circuit part WB1n may include a first sensing pattern MRL11n connected to the first node ND1 and the second node ND2, a first resistor WBa connected to the third node ND3 and the fourth node ND4, a second resistor WBb connected to the first node ND1 and the fourth node ND4, and a third resistor WBc connected to the second node ND2 and the third node ND3.

Each of a resistance value R1 of the first resistor WBa, a resistance value R2 of the second resistor WBb, and a resistance value R3 of the third resistor WBc may have a suitable (e.g., a set or predetermined) value. That is, the first resistors WBa to WBc may be fixed resistors.

The wheatstone bridge circuit part WB1n may further include an amplification circuit AMP such as an operational amplifier. The amplification circuit AMP may include an inverting input terminal, a non-inverting input terminal, and an output terminal. The wheatstone bridge circuit part WB1n may detect an electrical flow between the second node ND2 and the fourth node ND4 through the amplification circuit AMP. The second node ND2 and the fourth node ND4 may be, for example, output nodes.

One of the second node ND2 and the fourth node ND4 may be electrically connected to one of the input terminals of the amplification circuit AMP, and the other thereof may be electrically connected to the other input terminal of the amplification circuit AMP. For example, the second node ND2 may be connected to the inverting input terminal of the amplification circuit AMP, and the fourth node ND4 may be connected to the non-inverting input terminal of the amplification circuit AMP. The output terminal of the amplification circuit AMP may output a pressure sensing voltage Va proportional to a difference between voltage values inputted to both input terminals.

The first sensing pattern MRL11n may be electrically connected to the first node ND1 and the second node ND2 via the first pressure sensing line FL111 and the second pressure sensing line FL112.

The first sensing pattern MRL11n, the first resistor WBa, the second resistor WBb, and the third resistor WBc may be connected to each other to implement the wheatstone bridge circuit part WB1n.

The resistance values of the first resistor WBa, the second resistor WBb, and the third resistor WBc may be set so that a product of the resistance value Ra of the first sensing pattern MRL11n and the resistance value R1 of the first resistor WBa may be the same as a product of the resistance value R2 of the second resistor WBb and the resistance value R3 of the third resistor WBc, in a state in which no pressure is applied.

As such, in the state in which no pressure is applied, when the product of the resistance value Ra of the first sensing pattern MRL11n and the resistance value R1 of the first resistor WBa is the same as the product of the resistance value R2 of the second resistor WBb and the resistance value R3 of the third resistor WBc, the voltages of the second node ND2 and the fourth node ND4 may be the same as each other. When the voltages of the second node ND2 and the fourth node ND4 are the same as each other, a voltage difference between the second node ND2 and the fourth node ND4 may be 0 V, and the pressure sensing voltage Va outputted by the amplification circuit AMP may be 0 V.

When pressure is applied to the first sensing pattern MRL11n, the shape of the first sensing pattern MRL11n is changed according to strength of the pressure, and the resistance value Ra of the first sensing pattern MRL11n may be changed by the changed shape. For example, the resistance value Ra of the first sensing pattern MRL11n may increase by the pressure applied to the first sensing pattern MRL11n. A voltage difference may occur between the second node ND2 and the fourth node ND4 according to a change in the resistance value Ra of the first sensing pattern MRL11n. When the voltage difference occurs between the second node ND2 and the fourth node ND4, the amplification circuit AMP may output a voltage other than 0 V as the pressure sensing voltage Va. The pressure sensing portion FSL1a may detect the pressure applied to the display device through the pressure sensing voltage Va.

The reflective layer MRLn may concurrently (e.g., simultaneously) perform a mirror function for reflecting an image of an object positioned in front of the display device and a pressure sensing function as a deformation sensing element for detecting the strength of pressure applied onto the display device. When the reflective layer MRLn is shared with the pressure sensing layer FSL1, a separate process for forming the deformation sensing element (for example, strain gauge) of the pressure sensor may be omitted, the manufacturing process of the display device may be simplified, and the manufacturing cost may be reduced.

Hereinafter, a first reflective layer in an embodiment of FIG. 40 to FIG. 45 may be substantially the same as the first reflective layer illustrated in the embodiment of FIG. 36. For better understanding and ease of description, a detailed description of the first reflective layer in the embodiment of FIG. 40 to FIG. 45 will be omitted.

Figure 40:
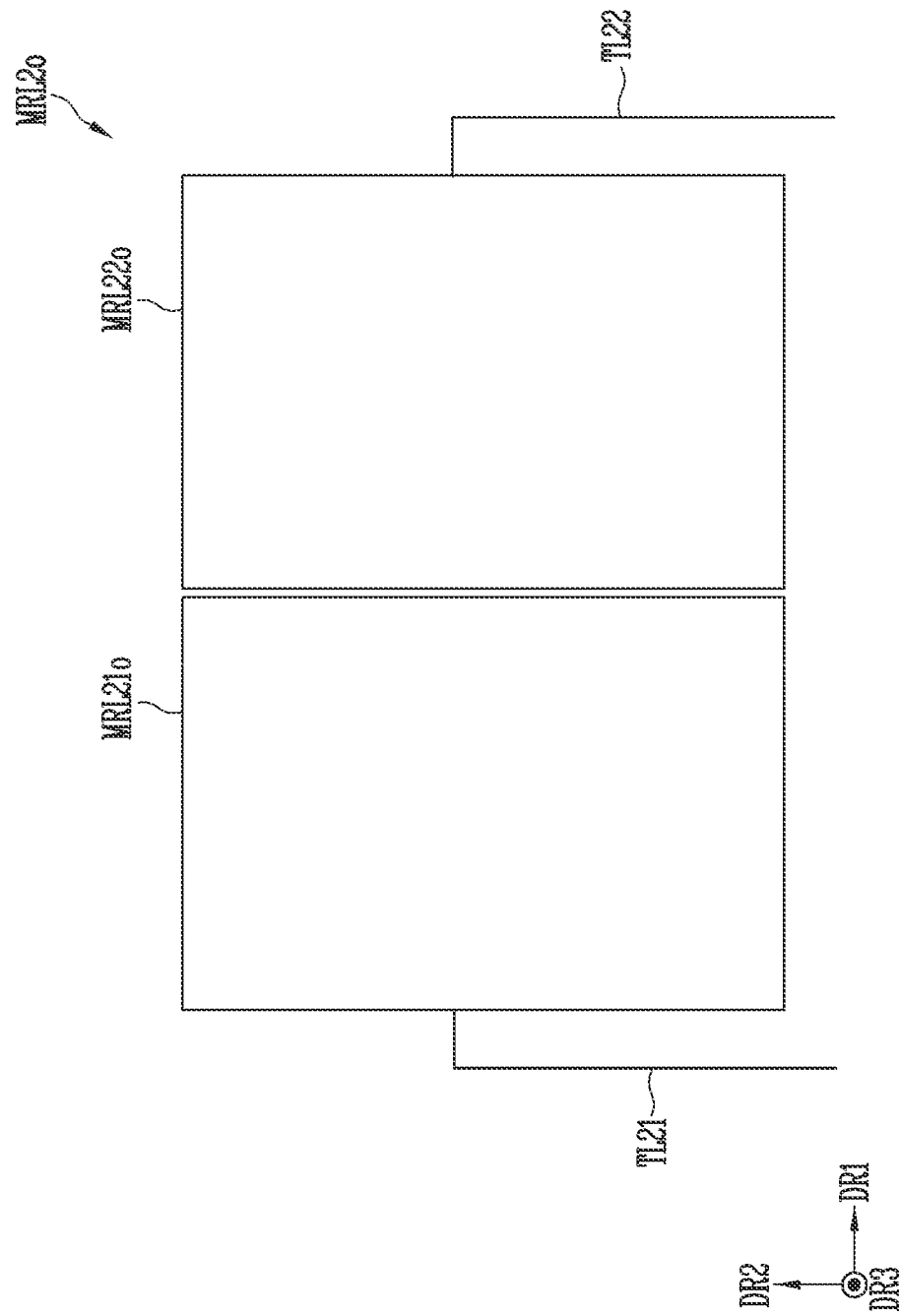
FIG. 40 illustrates a top plan view of a second reflective layer according to one or more embodiments.
Figure 41:
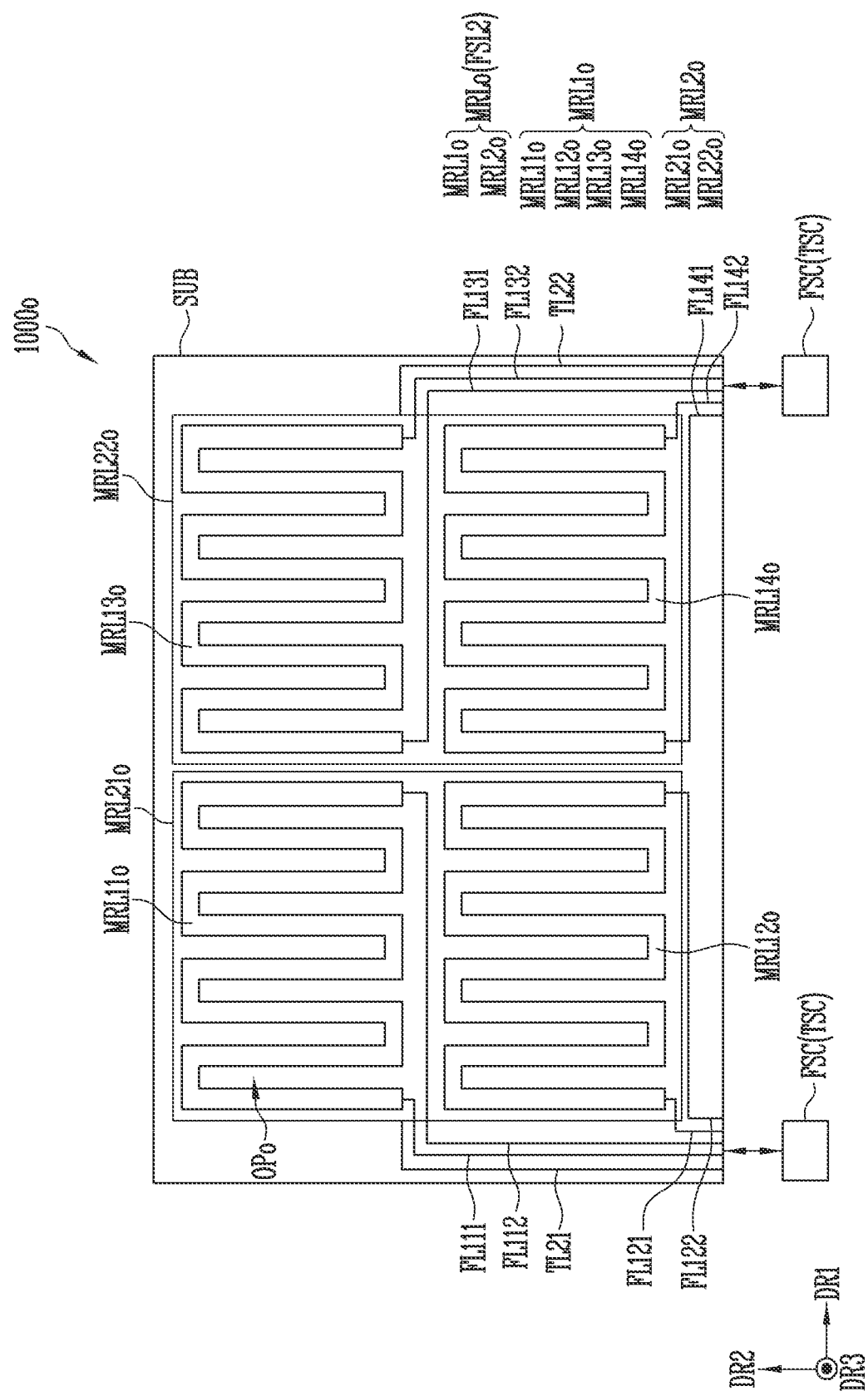
FIG. 41 illustrates a top plan view of a display device according to one or more embodiments.

FIG. 40 illustrates a top plan view of a second reflective layer according to one or more embodiments. FIG. 41 illustrates a top plan view of a display device according to one or more embodiments.

The embodiment of FIG. 40 and FIG. 41 is different from the embodiment of FIG. 36 to FIG. 39 in that the first reflective layer is shared with the pressure sensing layer and the second reflective layer is shared with the touch electrode layer.

Referring to FIG. 40 to FIG. 41, a display device 10000 may include a reflective layer MRLo disposed on the substrate SUB. The reflective layer MRLo may be shared with a pressure sensing layer FSL2 of the display device 1000o. For example, the reflective layer MRLo may function as a strain gauge in which its resistance value is changed by its length or cross-sectional area being changed, and a sensing electrode of a self-capacitance type of touch screen panel, when an external force is applied.

The reflective layer MRLo may include a first reflective layer MRL1o and a second reflective layer MRL2o. The first reflective layer MRL1o may include a plurality of sensing patterns MRL11o, MRL12o, MRL13o, and MRL14o. For example, the plurality of sensing patterns MRL11o, MRL12o, MRL13o, and MRL14o may include a first sensing pattern MRL11o, a second sensing pattern MRL12o, a third sensing pattern MRL13o, and a fourth sensing pattern MRL14o.

Each of the sensing patterns MRL11o, MRL12o, MRL13o, and MRL14o may be configured as a strain sensing element to be able to detect minute displacements. For example, each of the sensing patterns MRL11o, MRL12o, MRL13o, and MRL14o may be a strain gauge having a shape at least partially curved to have a suitable pattern (e.g., a set or predetermined pattern). Due to the curved shape, each of the patterns may include an opening OPo. The opening OPo may at least partially overlap the light emitting element (LD in FIG. 6) of each of the pixels.

As described above, a detailed description of the first reflective layer MRL1o may be the same as or similar to the first reflective layer MRL1n illustrated in the embodiment of FIG. 36, and thus will be omitted.

The second reflective layer MRL2o may be disposed on the first reflective layer MRL1o to reduce light scattering that may occur while the light emitted from the light emitting element (LD in FIG. 7A) transmits through the first reflective layer MRL1o, thereby improving visibility of the display device.

The second reflective layer MRL2o may include a plurality of touch sensing patterns MRL21o and MRL22o. For example, the plurality of touch sensing patterns MRL21o and MRL22o may include a first touch sensing pattern MRL21o and a second touch sensing pattern MRL22o.

The touch sensing patterns MRL21o and MRL22o may be formed to have a size corresponding to a suitable number (e.g., a set or predetermined number) of pixels (PXL in FIG. 2). For example, each of the touch sensing patterns MRL21o and MRL22o may be formed to have a size corresponding to two or more pixels. FIG. 40 and FIG. 41 illustrate the structure in which each of the touch sensing patterns MRL21o and MRL22o is formed to have a size corresponding to 24 pixels, but the present disclosure is not limited thereto.

In addition, the touch sensing patterns MRL21o and MRL22o may each have the same planar area, but are not limited thereto.

The touch sensing patterns MRL21o and MRL22o of the second reflective layer MRL2o may be electrically connected to the touch sensing lines TL21 and TL22, respectively. For example, the first touch sensing pattern MRL21o may be electrically connected to the first touch sensing line TL21, and the second touch sensing pattern MRL22o may be electrically connected to the second touch sensing line TL22.

As one or more embodiments, the touch sensing lines TL21 and TL22 may be formed at the same layer as the first reflective layer MRL2o, and may be concurrently (e.g., simultaneously) formed. In addition, the touch sensing lines TL21 and TL22 may be made of the same material as the second reflective layer MRL2o. However, the formation position, formation timing, and material of the touch sensing lines are not limited thereto.

In the present embodiment, it is described as an example that the second reflective layer MRL2o is shared with the touch electrode layer of the self-capacitance type touch sensor, but the second reflective layer MRL2o is not limited thereto. For example, the second reflective layer MRL2o may be shared with the touch electrode layer of the mutual capacitance type touch sensor described in the previous embodiments.

A separate insulation member (for example, the fourth insulation layer INS4 of FIG. 19) may be disposed between the first reflective layer MRL1o and the second reflective layer MRL2o, and the first reflective layer MRL1o and the second reflective layer MRL2o may be electrically isolated from each other. Accordingly, the first reflective layer MRL1o and the second reflective layer MRL2o may be shared as a pressure sensing layer and a touch electrode layer, respectively.

The pressure sensor connected to the first reflective layer MRL1o and the touch sensor connected to the second reflective layer MRL2o may be individually driven, and if necessary, only the pressure sensor connected to the first reflective layer MRL1o may be driven, while only the touch sensor connected to the second reflective layer MRL2o may be driven. In addition, the touch position and pressure strength may be concurrently (e.g., simultaneously) measured by driving both the pressure sensor connected to the first reflective layer MRL1o and the touch sensor connected to the second reflective layer MRL2o.

The reflective layer MRLo may concurrently (e.g., simultaneously) perform a mirror function for reflecting an image of an object positioned in front of the display device, a pressure sensing function as a deformation sensing element for detecting the strength of pressure applied onto the display device, and a touch electrode function for detecting the touched position on the display device. When the reflective layer MRLo is shared with the pressure sensing layer and the touch electrode layer, a separate process for forming the deformation sensing element (for example, strain gauge) of the pressure sensing sensor may be omitted. In addition, a separate process for forming the touch electrode of the touch sensor may be omitted. Accordingly, the manufacturing process of the display device may be further simplified, and the manufacturing cost may be reduced.

Figure 42:
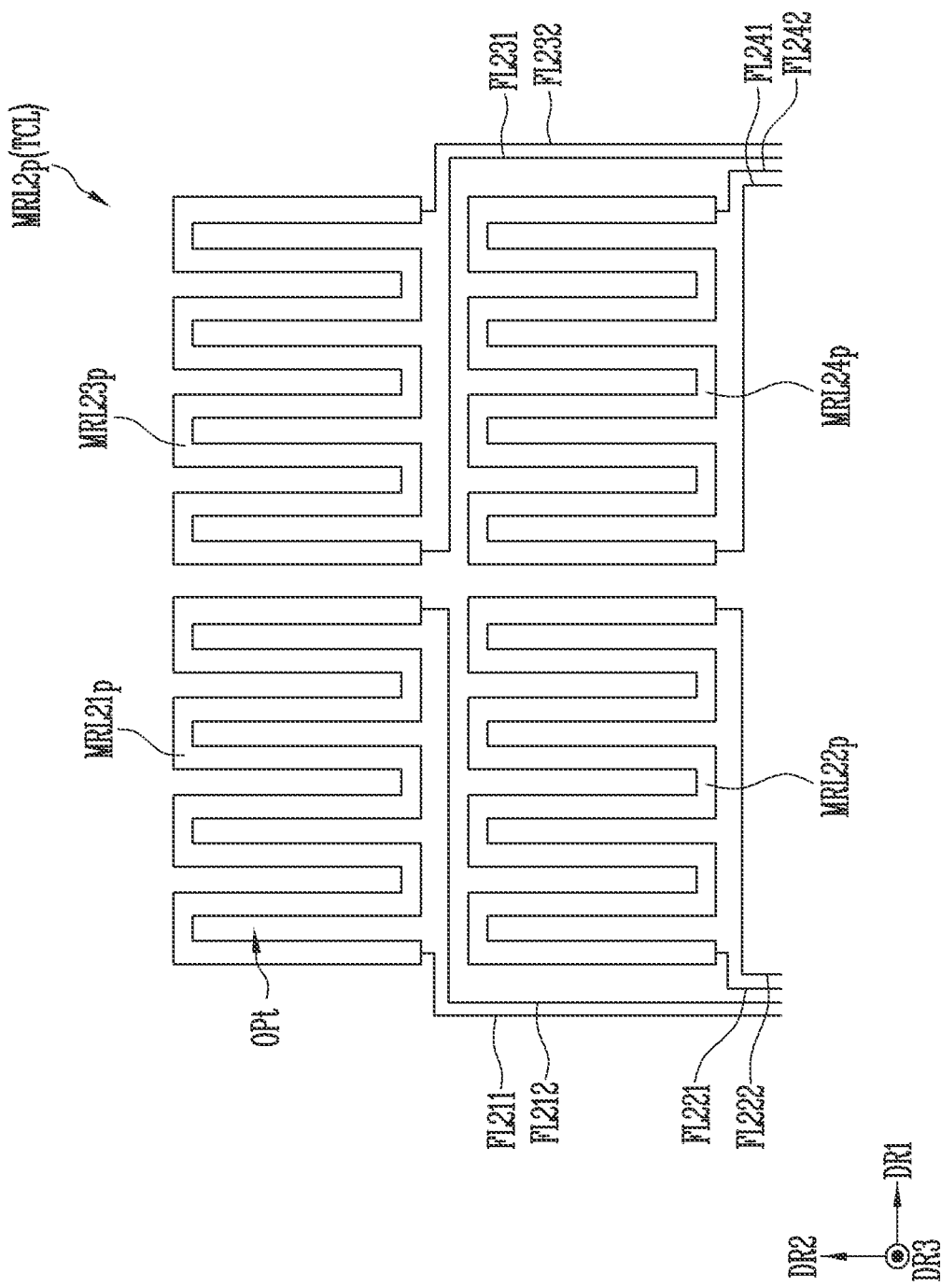
FIG. 42 illustrates a top plan view of a second reflective layer according to one or more embodiments.
Figure 43:
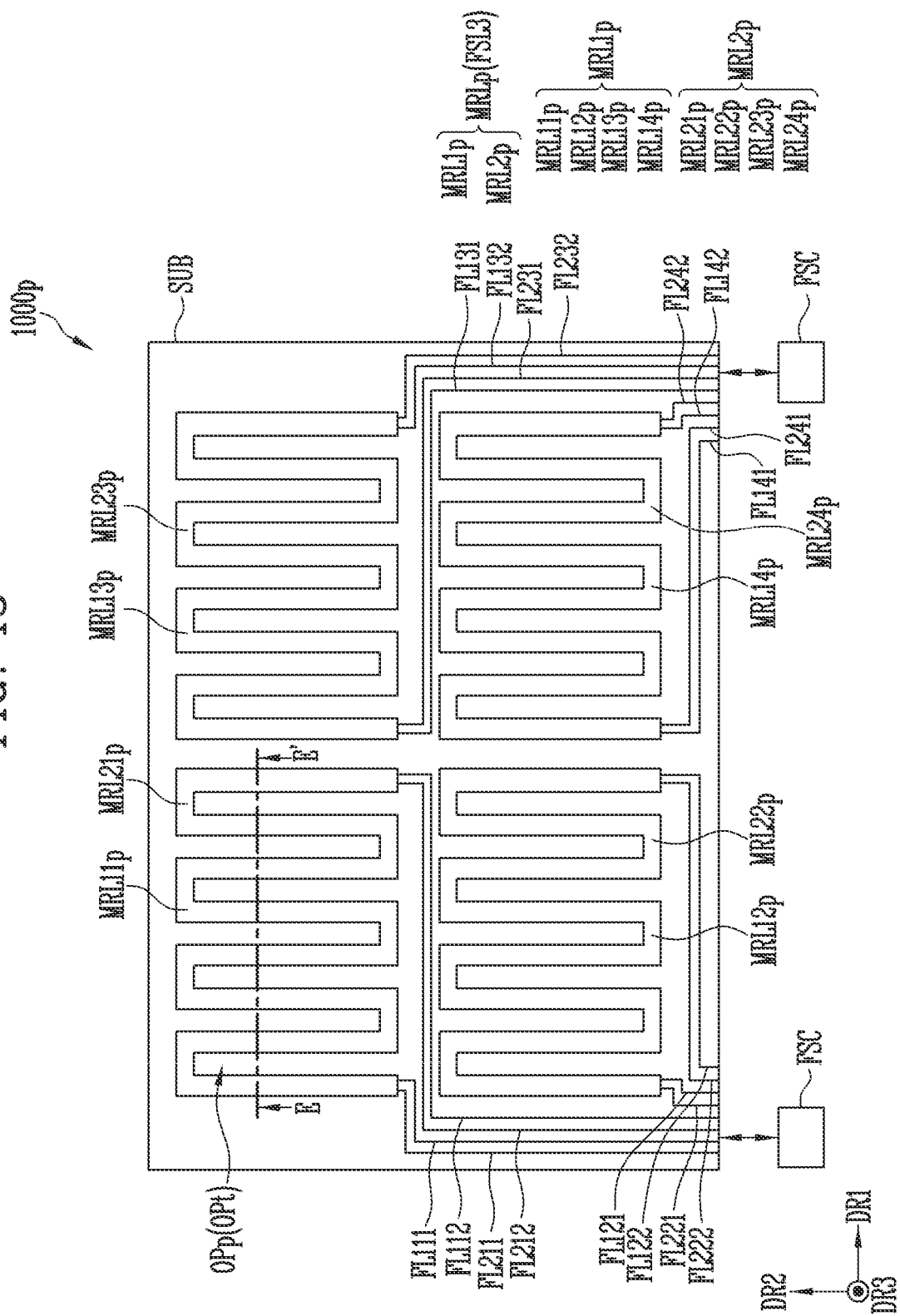
FIG. 43 illustrates a top plan view of a display device according to one or more embodiments.
Figure 44:
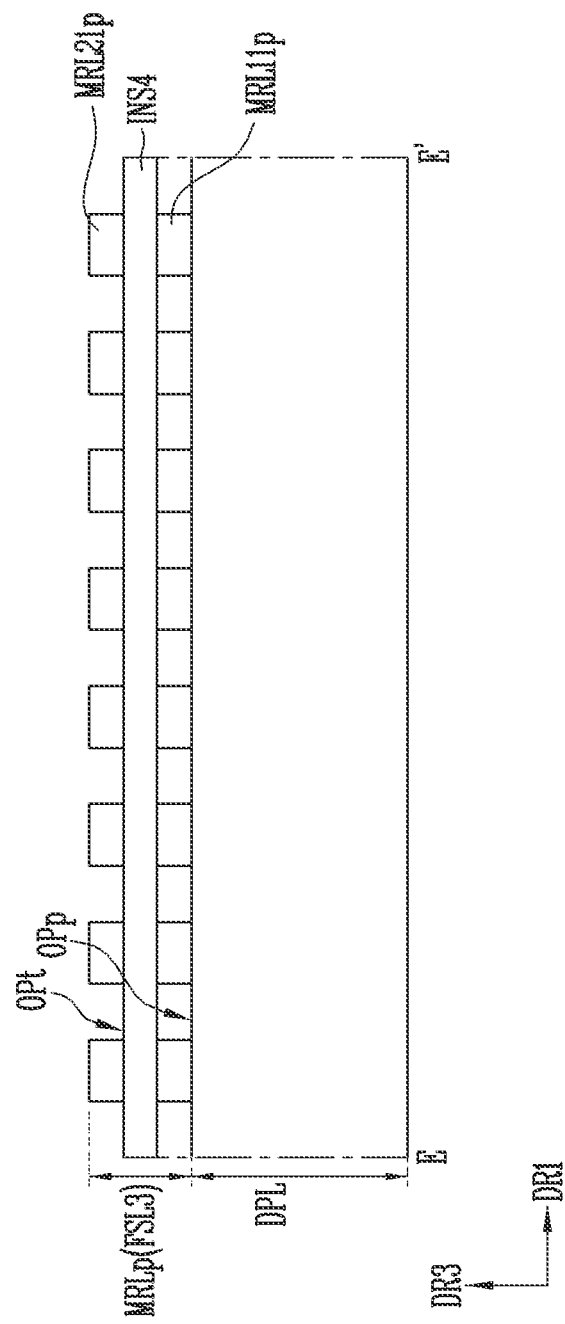
FIG. 44 illustrates a cross-sectional view taken along the line E-E' of FIG. 43.
Figure 45:
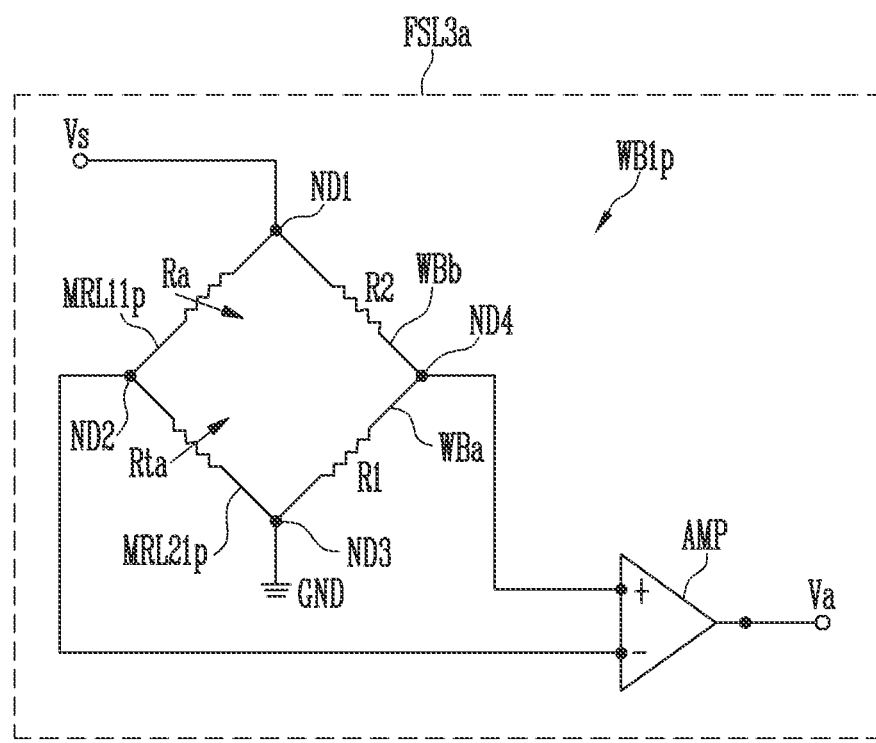
FIG. 45 schematically illustrates a first pressure sensing part including a first sensing pattern of FIG. 43.

FIG. 42 illustrates a top plan view of a second reflective layer according to one or more embodiments. FIG. 43 illustrates a top plan view of a display device according to one or more embodiments. FIG. 44 illustrates a cross-sectional view taken along the line E-E' of FIG. 43. FIG. 45 schematically illustrates a first pressure sensing part including a first sensing pattern of FIG. 43.

The embodiment of FIG. 42 to FIG. 45 is different from the embodiment of FIG. 36 to FIG. 39 in that the first reflective layer is shared with the pressure sensing layer and the second reflective layer is shared with a temperature compensation layer.

Referring to FIG. 42 to FIG. 45, a display device 1000p may include a reflective layer MRLp disposed on the substrate SUB. The reflective layer MRLp may be shared with a pressure sensing layer FSL3 of the display device 1000p. For example, the reflective layer MRLp may function as a strain gauge in which its resistance value is changed by its length or cross-sectional area being changed when an external force is applied.

The reflective layer MRLp may include a first reflective layer MRL1p and a second reflective layer MRL2p.

The first reflective layer MRL1p may include a plurality of sensing patterns MRL11p, MRL12p, MRL13p, and MRL14p. For example, the plurality of sensing patterns MRL11p, MRL12p, MRL13p, and MRL14p may include a first sensing pattern MRL11p, a second sensing pattern MRL12p, a third sensing pattern MRL13p, and a fourth sensing pattern MRL14p.

Each of the sensing patterns MRL11p, MRL12p, MRL13p, and MRL14p may be formed to have a size corresponding to a suitable number (e.g., a set or predetermined number) of pixels (PXL in FIG. 2). For example, each of the sensing patterns MRL11p, MRL12p, MRL13p, and MRL14p may be formed to have a size corresponding to one pixel, or may be formed to have a size corresponding to two or more pixels.

Each of the sensing patterns MRL11p, MRL12p, MRL13p, and MRL14p may be configured as a strain sensing element to be able to detect minute displacements. For example, each of the sensing patterns MRL11p, MRL12p, MRL13p, and MRL14p may be a strain gauge having a shape at least partially curved to have a suitable pattern (e.g., a set or predetermined pattern). Due to the curved shape, each of the patterns may include an opening OPp. The opening OPp may at least partially overlap the light emitting element (LD in FIG. 6) of each of the pixels.

As described above, a detailed description of the first reflective layer MRL1p may be the same as or similar to the first reflective layer MRL1n illustrated in the embodiment of FIG. 36, and thus will be omitted.

The second reflective layer MRL2p may include a plurality of temperature compensation patterns MRL21p, MRL22p, MRL23p, and MRL24p. For example, the plurality of temperature compensation patterns MRL21p, MRL22p, MRL23p, and MRL24p may include a first temperature compensation pattern MRL21p, a second temperature compensation pattern MRL22p, a third temperature compensation pattern MRL23p, and a fourth temperature compensation pattern MRL24p.

The second reflective layer MRL2p may be disposed on the first reflective layer MRL1p. The second reflective layer MRL2p may compensate for a change in resistance due to an increase in temperature of the first reflective layer MRL1p when pressure is applied, thereby compensating for noise of the pressure sensor according to a temperature difference therebetween.

In one or more embodiments, the temperature compensation patterns MRL21p, MRL22p, MRL23p, and MRL24p may be formed to have a size and shape that is substantially the same as the sensing patterns MRL11p, MRL12p, MRL13p, and MRL14p of the first reflective layer MRL1p. Accordingly, the temperature compensation patterns MRL21p, MRL22p, MRL23p, and MRL24p may have the same resistance value as the sensing patterns MRL11p, MRL12p, MRL13p, and MRL14p.

However, but the present disclosure is not limited thereto, and in one or more embodiments, the temperature compensation patterns MRL21p, MRL22p, MRL23p, and MRL24p may be formed to have a size and shape different from the sensing patterns MRL11p, MRL12p, MRL13p, and MRL14p. However, even in this case, a rate of change of resistance values of the temperature compensation patterns MRL21p, MRL22p, MRL23p, and MRL24p due to temperature may be the same as a rate of change of resistance values of the sensing patterns MRL11p, MRL12p, MRL13p, and MRL14p due to temperature.

For example, each of the temperature compensation patterns MRL21p, MRL22p, MRL23p, and MRL24p may have a shape at least partially curved to have a suitable pattern (e.g., a set or predetermined pattern). Due to the curved shape, each of the patterns may include an opening OPt. The opening OPt may at least partially overlap the light emitting element (LD in FIG. 6) of each of the pixels, and the opening OPt of the second reflective layer MRL2p may at least partially overlap the opening OPp of the first reflective layer MRL1p as shown in FIG. 44.

Each of the temperature compensation patterns MRL21p, MRL22p, MRL23p, and MRL24p may have one end portion and the other end portion along the curved shape. The temperature compensation patterns MRL21p, MRL22p, MRL23p, and MRL24p may be respectively connected to temperature compensation lines FL211, FL212, FL221, FL222, FL231, FL232, FL241, and FL242 at one end portion and the other end portion. For example, the first temperature compensation line FL111 may be connected to one end portion of the first temperature compensation pattern MRL21p, and the second temperature compensation line FL112 may be connected to the other end portion of the first temperature compensation pattern MRL21p. The third temperature compensation line FL221 may be connected to one end portion of the second temperature compensation pattern MRL22p, and the fourth temperature compensation line FL222 may be connected to the other end portion of the second temperature compensation pattern MRL22p. The fifth temperature compensation line FL231 may be connected to one end portion of the third temperature compensation pattern MRL23p, and the sixth temperature compensation line FL232 may be connected to the other end portion of the third temperature compensation pattern MRL23p. The seventh temperature compensation line FL241 may be connected to one end portion of the fourth temperature compensation pattern MRL24p, and the eighth temperature compensation line FL242 may be connected to the other end portion of the fourth temperature compensation pattern MRL24p.

In the described embodiment, the temperature compensation lines FL211, FL212, FL221, FL222, FL231, FL232, FL241, and FL242 may be formed at the same layer as the second reflective layer MRL2p, and may be concurrently (or simultaneously) formed. In addition, the temperature compensation lines FL211, FL212, FL221, FL222, FL231, FL232, FL241, and FL242 may be made of the same material as the second reflective layer MRL2p. In one or more embodiments, the temperature compensation lines FL211, FL212, FL221, FL222, FL231, FL232, FL241, and FL242 may be formed of a different layer from the second reflective layer MRL2p. In addition, the temperature compensation lines FL211, FL212, FL221, FL222, FL231, FL232, FL241, and FL242 may be made of a different material from the second reflective layer MRL2p.

The temperature compensation lines FL211, FL212, FL221, FL222, FL231, FL232, FL241, and FL242 may be connected to a pressure sensing controller FSC of the display device 1000p.

A fourth insulation layer INS4 may be disposed between the first reflective layer MRL1p and the second reflective layer MRL2p. The first reflective layer MRL1p and the second reflective layer MRL2p have the fourth insulation layer INS4 interposed therebetween, and may overlap each other.

As described above, the reflective layer MRLp may be shared with the pressure sensing layer FSL3. For example, the display device 1000p may include a plurality of pressure sensing portions including the sensing patterns MRL11p, MRL12p, MRL13p, and MRL14p. In the described embodiment, the plurality of pressure sensing portions may be constituent elements included in the pressure sensing controller FSC of the display device 1000p, but are not limited thereto.

For example, the display device 1000p may include a first pressure sensing portion FSL3a including a wheatstone bridge circuit WB1p. The first pressure sensing portion FSL3a may further include an analog-to-digital converter (ADC) and a processor for detecting a pressure sensing signal outputted from the wheatstone bridge circuit WB1p.

The wheatstone bridge circuit part WB1p may include a first node ND1, a second node ND2, a third node ND3, and a fourth node ND4. A driving voltage Vs may be provided to the first node ND1, and the third node ND3 may be connected to a ground portion GND. The first node ND1 and the third node ND3 may be, for example, input nodes.

The wheatstone bridge circuit part WB1p may include a first sensing pattern MRL11p connected to the first node ND1 and the second node ND2, a first temperature compensation pattern MRL21p connected to the second node ND2 and the third node ND3, a first resistor WBa connected to the third node ND3 and the fourth node ND4, and a second resistor WBb connected to the first node ND1 and the fourth node ND4.

Each of the resistance value R1 of the first resistor WBa and the resistance value R2 of the second resistor WBb may have a suitable value (e.g., a set or predetermined value). That is, the first resistor WBa and the second resistor WBb may be fixed resistors.

The wheatstone bridge circuit part WB1p may further include an amplification circuit AMP such as an operational amplifier. The amplification circuit AMP may include an inverting input terminal, a non-inverting input terminal, and an output terminal. The wheatstone bridge circuit part WB1p may detect an electrical flow between the second node ND2 and the fourth node ND4 through the amplification circuit AMP. The second node ND2 and the fourth node ND4 may be, for example, output nodes.

One of the second node ND2 and the fourth node ND4 may be electrically connected to one of the input terminals of the amplification circuit AMP, and the other thereof may be electrically connected to the other input terminal of the amplification circuit AMP. For example, the second node ND2 may be connected to the inverting input terminal of the amplification circuit AMP, and the fourth node ND4 may be connected to the non-inverting input terminal of the amplification circuit AMP. The output terminal of the amplification circuit AMP may output a pressure sensing voltage Va proportional to a difference between voltage values inputted to both input terminals.

The first sensing pattern MRL11p may be electrically connected to the first node ND1 and the second node ND2 via the first pressure sensing line FL111 and the second pressure sensing line FL112.

The first temperature compensation pattern MRL21p may be electrically connected to the second node ND2 and the third node ND3 via the first temperature compensation line FL211 and the second temperature compensation line FL212.

The first sensing pattern MRL11p, the first temperature compensation pattern MRL21p, the first resistor WBa, and the second resistor WBb may be connected to each other to implement the wheatstone bridge circuit part WB1p.

The resistance values of the first resistor WBa and the second resistor WBb may be set so that, in a state in which no pressure is applied, a product of the resistance value Ra of the first sensing pattern MRL11p and the resistance value R1 of the first resistor WBa may be the same as a product of the resistance value Rta of the first temperature compensation pattern MRL21p and the resistance value R2 of the second resistance WBb.

As described above, in the state in which no pressure is applied, when the product of the resistance value Ra of the first sensing pattern MRL11p and the resistance value R1 of the first resistor WBa is the same as the product of the resistance value Rta of the first temperature compensation pattern MRL21p and the resistance value R2 of the second resistance WBb, the voltages of the second node ND2 and the fourth node ND4 may be the same as each other. When the voltages of the second node ND2 and the fourth node ND4 are the same as each other, a voltage difference between the second node ND2 and the fourth node ND4 may be 0 V, and the pressure sensing voltage Va outputted by the amplification circuit AMP may be 0 V.

When pressure is generated on the display device, the resistance value Ra of the first sensing pattern MRL11p includes a component (hereinafter, a 'first pressure resistance component') that changes by being changed in shape according to a strength of the pressure, and a component that changes according to a temperature change (hereinafter, a 'first temperature resistance component'). In addition, when pressure is generated on the display device, the resistance value Rta of the first temperature compensation pattern MRL21p includes a component (hereinafter, a 'second pressure resistance component') that changes by being changed in shape according to a strength of the pressure, and a component that changes according to a temperature change (hereinafter, a 'second temperature resistance component'). The second pressure resistance component may represent a significant difference from the first pressure resistance component, but the difference may be negligibly small. Because the first sensing pattern MRL11p and the first temperature compensation pattern MRL21p are not disposed to face each other in a diagonal direction in the wheatstone bridge circuit part WB1p, the second temperature resistance component of the first temperature compensation pattern MRL21p may compensate for or offset the first temperature resistance component of the first sensing pattern MRL11p, and thus the pressure strength may be more sensitively detected.

The present embodiment exemplifies the structure in which the temperature compensation patterns MRL21p, MRL22p, MRL23p, and MRL24p are disposed on the sensing patterns MRL11p, MRL12p, MRL13p, and MRL14p, but is not limited thereto. For example, the first reflective layer may include the temperature compensation patterns, and the second reflective layer may include the sensing patterns. That is, the sensing patterns may be disposed on the temperature compensation patterns.

Hereinafter, other embodiments of the display device will be described. The embodiments of FIG. 46 to FIG. 50 are different in that the display device including the reflective layer further includes a photosensitive sensor including a photodiode, and in the following embodiments, the same components as those of the previously described embodiments are denoted by the same reference numerals, and descriptions thereof will be omitted or simplified, and differences will be mainly described.

Figure 46:
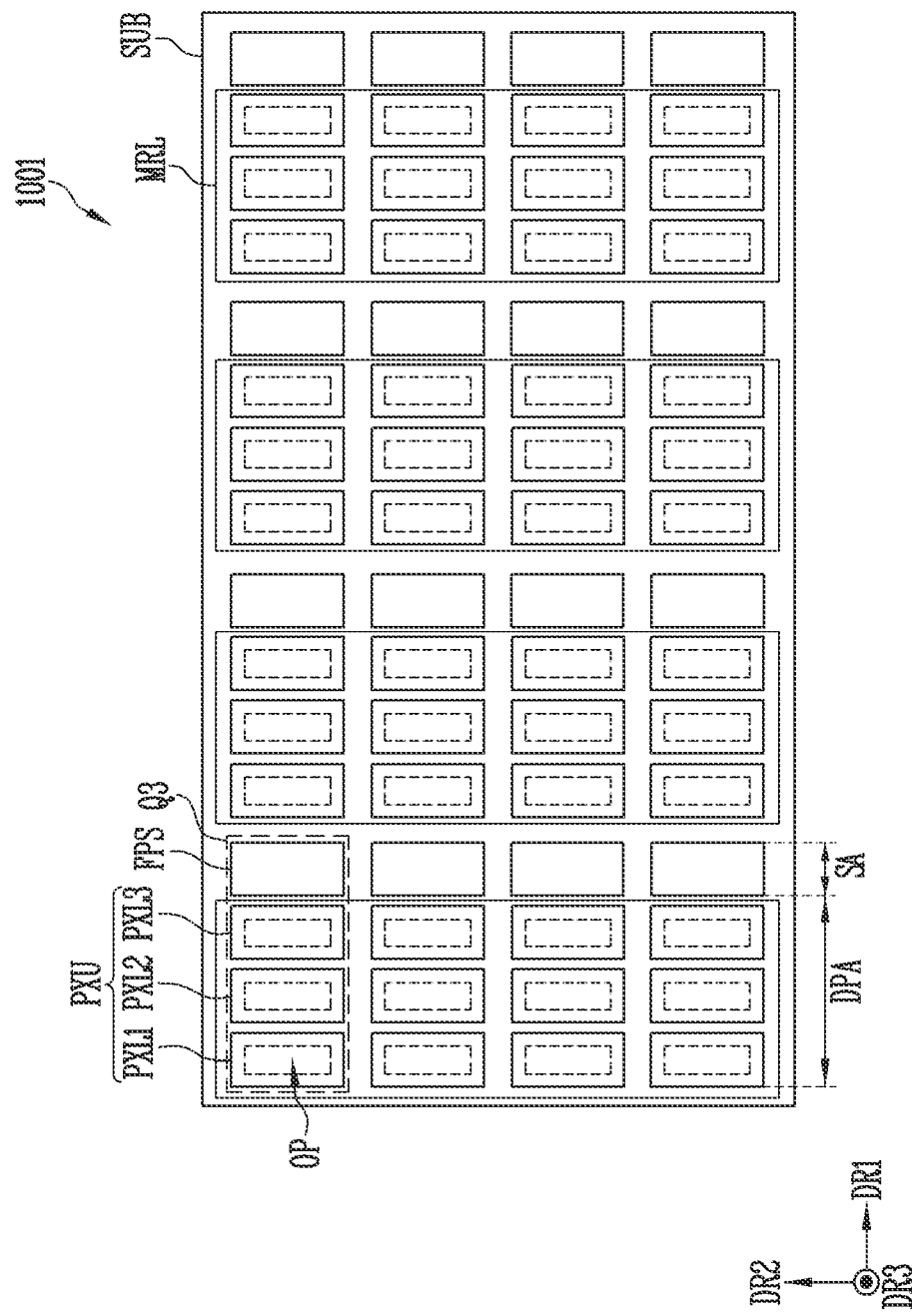
FIG. 46 illustrates a top plan view of a display device according to one or more embodiments.
Figure 47:
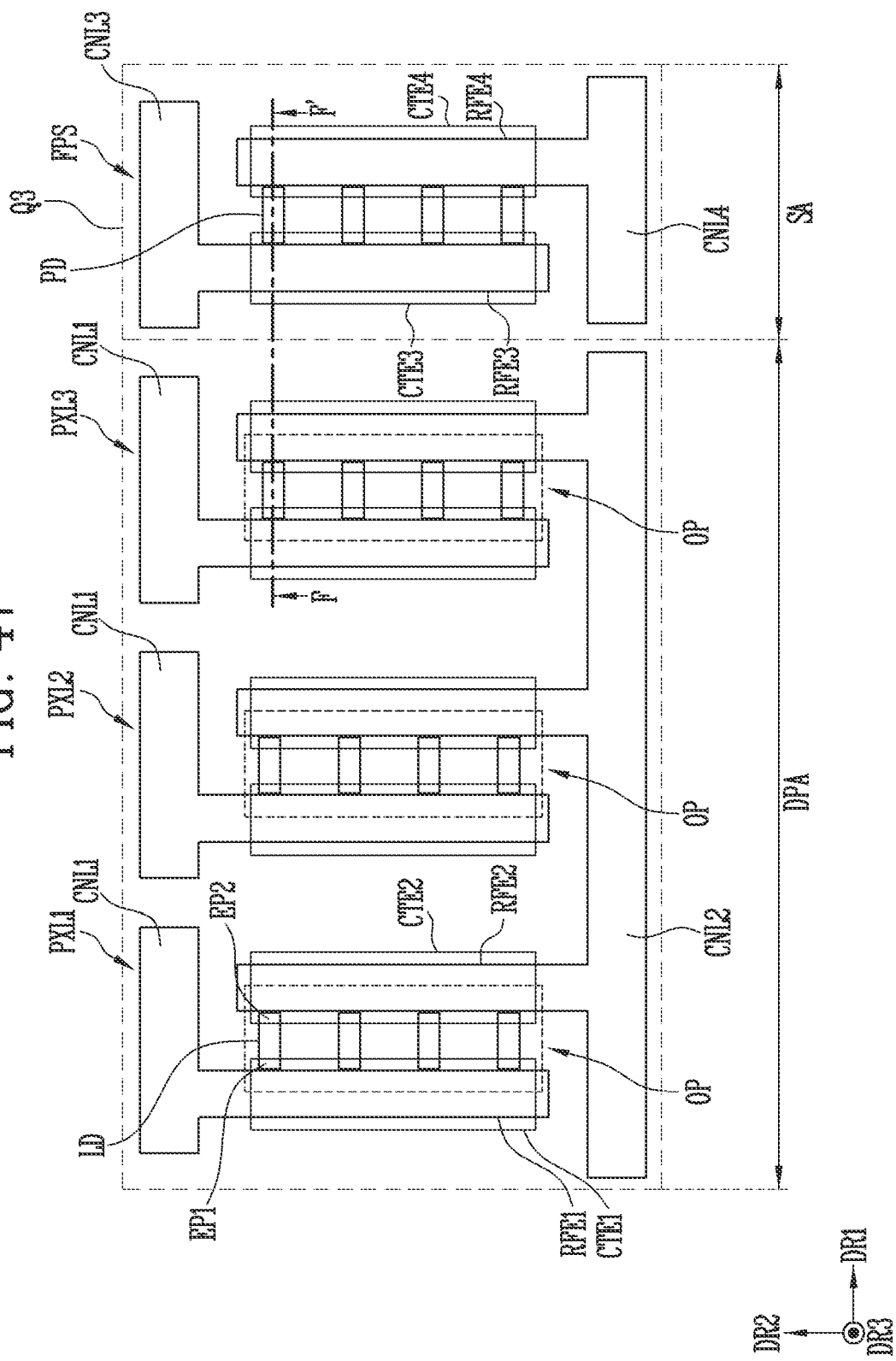
FIG. 47 illustrates an enlarged top plan view of an area Q3 of FIG. 46.
Figure 48:
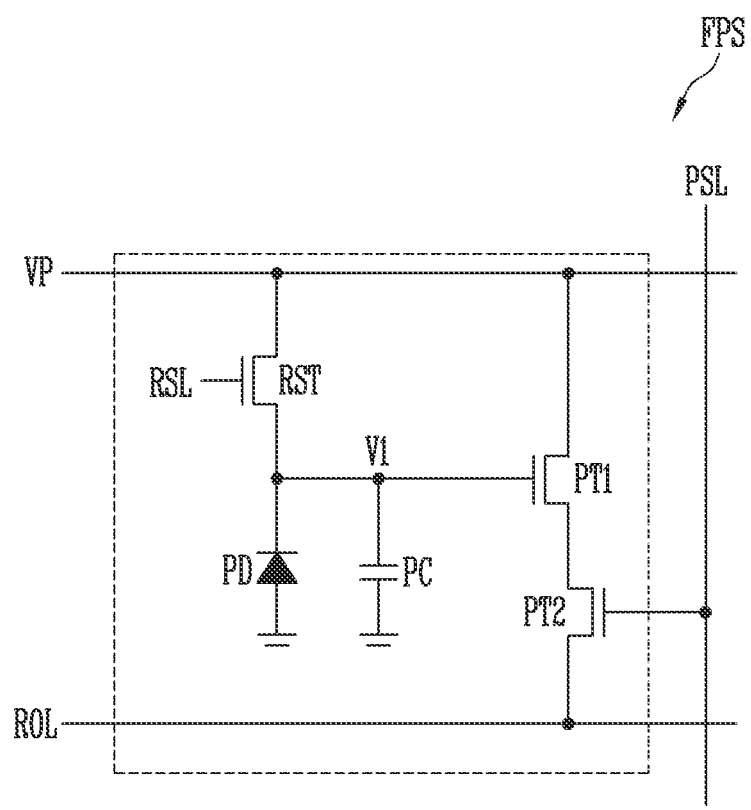
FIG. 48 illustrates an example of a circuit diagram of a light sensing sensor including a photodiode.
Figure 49:
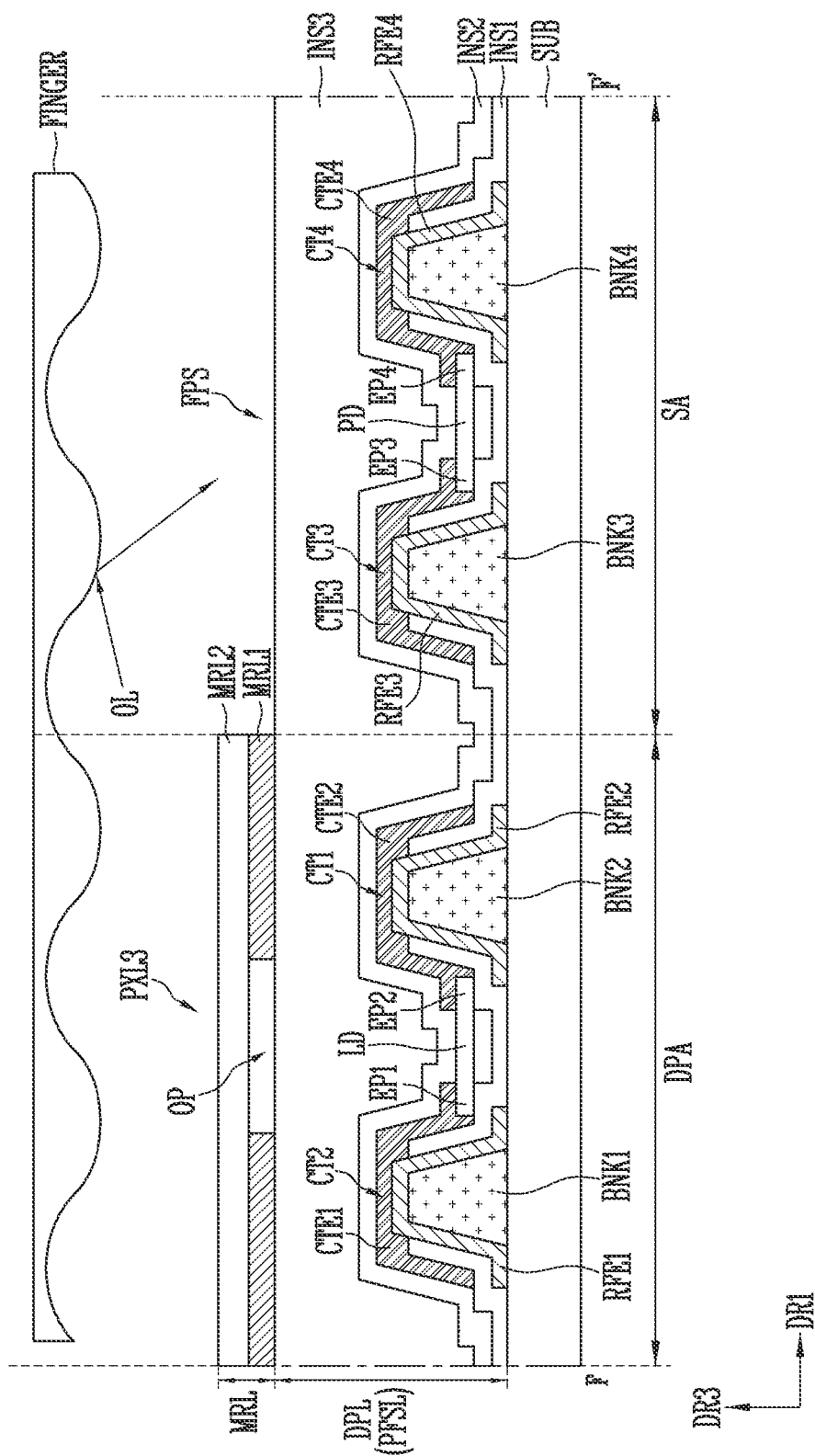
FIG. 49 illustrates a cross-sectional view taken along the line F-F' of FIG. 47.
Figure 50:
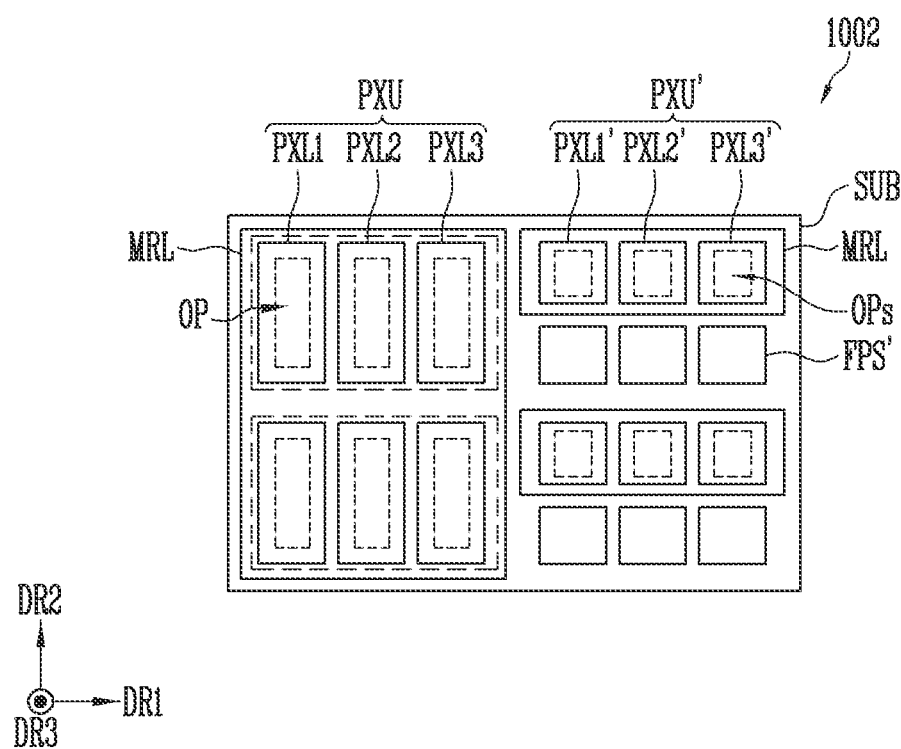
FIG. 50 illustrates a top plan view of a display device according to one or more embodiments.

FIG. 46 illustrates a top plan view of a display device according to one or more embodiments. FIG. 47 illustrates an enlarged top plan view of area Q3 of FIG. 46. FIG. 48 illustrates an example of a circuit diagram of a light sensing sensor including a photodiode. FIG. 49 illustrates a cross-sectional view taken along the line F-F' of FIG. 47. FIG. 50 illustrates a top plan view of a display device according to one or more embodiments.

Referring to FIG. 5 to FIG. 7A and FIG. 46 to FIG. 49, a display device 1001 may include a substrate SUB including a pixel area DPA and a sensor area SA, a plurality of pixels PXL1, PXL2, and PXL3 disposed in the pixel area DPA, and a plurality of photo sensors FPS disposed in the sensor area SA.

Each of the pixels PXL1, PXL2, and PXL3 may include a light emitting element LD to emit light with a desired luminance (e.g., a set or predetermined luminance) in response to a provided driving current (or driving signal).

Detailed descriptions of the plurality of pixels PXL1, PXL2, and PXL3 disposed in the pixel area DPA are duplicate with those described with reference to FIG. 5 to FIG. 7A, so will be omitted. In addition, all of the structures exemplified in the previous embodiments may be applied to the reflective layer MRL of the pixel area DPA.

As shown in FIG. 46, the photo sensor FPS may be arranged along the first direction DR1 with the pixels PXL1, PXL2, and PXL3. The photo sensor FPS may have substantially the same area as each of the pixels PXL1, PXL2, and PXL3. The position of the photo sensor FPS is not limited thereto, and may be disposed at various positions.

The photo sensor FPS may include a light receiving element and a sensor driving circuit that is connected to the light receiving element to drive it. For example, the light receiving element may be a photodiode, a photo transistor, a photo gate, and a pinned photodiode. Hereinafter, the light receiving element included in the photo sensor FPS will be described as being implemented as a photodiode PD. In the embodiment, the photo sensor FPS may be an optical fingerprint sensor that recognizes a fingerprint by sensing light reflected by a valley between ridges of the fingerprint through the light receiving element.

The display device 1001 may include a sensor circuit layer and a sensor element layer PFSL sequentially disposed in the sensor area SA of the substrate SUB. Unlike the pixel area DPA, the reflective layer MRL may not be disposed in the sensor area SA.

The sensor circuit layer may include various constituent elements of a sensor driving circuit for driving the photodiode PD of the photo sensor FPS.

As shown in FIG. 48, the photo sensor FPS according to the described embodiment may include the photodiode PD, a reset transistor RST, a first sensing transistor PT1, a second sensing transistor PT2, and a sensing capacitor PC. However, the structure of the photo sensor FPS is not limited to the embodiment shown in FIG. 48.

The reset transistor RST may be a transistor that resets a first electrode potential V1 of the sensing capacitor PC in response to a reset control signal applied to a reset control line RSL. A first electrode of the reset transistor RST may be connected to a sensing voltage line VP, and a second electrode thereof may be connected to a first electrode of the photodiode PD.

A gate electrode of the first sensing transistor PT1 is connected to the first electrode of the photodiode PD and the first electrode of the sensing capacitor PC. A first electrode of the first sensing transistor PT1 may be connected to the sensing voltage line VP, and a second electrode thereof may be connected to a first electrode of the second sensing transistor PT2.

The first sensing transistor PT1 functions to convert the first electrode potential V1 of the sensing capacitor PC into a current signal and amplify it. For example, the first sensing transistor PT1 may be an amplifying transistor.

A gate electrode of the second sensing transistor PT2 may be connected to a sensing line PSL, the first electrode thereof may be connected to the second electrode of the first sensing transistor PT1, and a second electrode thereof may be connected to a readout line ROL. When a sensing signal is applied to the sensing line PSL, the second sensing transistor PT2 may be turned on, and the first electrode potential V1 of the sensing capacitor PC amplified by the first sensing transistor PT1 may be transmitted to the readout line ROL as a current signal.

The first and second electrodes of the photodiode PD may be respectively connected to the first electrode of the sensing capacitor PC and the ground potential, and the first and second electrodes of the sensing capacitor PC may be respectively connected to the gate electrode of the first sensing transistor PT1 and the ground potential.

An operation of the photo sensor FPS according to the present embodiment will be described in detail as follows.

First, when the reset transistor RST is turned on by a reset control signal, the first electrode potential V1 of the sensing capacitor PC may be reset to a potential of the sensing voltage line VP.

When light reflected by an external object (for example, a fingerprint or the like) is supplied to the photodiode PD, a leakage current may occur, and a charge may be charged in the sensing capacitor PC by the leakage current.

When the sensing capacitor PC is charged with the charge, a potential of the gate electrode of the first sensing transistor PT1 connected to the first electrode of the sensing capacitor PC may increase. When the potential of the gate electrode of the first sensing transistor PT1 exceeds a threshold voltage, the first sensing transistor PT1 may be turned on.

Then, when a sensing signal is applied to the sensing line PSL, the second sensing transistor PT2 may be turned on. The first electrode potential V1 of the sensing capacitor PC is amplified through the first sensing transistor PT1 and the second sensing transistor PT2 and may be transmitted as a current signal to the readout line ROL. That is, a change in a readout potential value when the sensing signal is applied to the sensing line PSL may be transmitted to a separate controller.

Because the potential of the readout line ROL is proportional to the first electrode potential V1 of the sensing capacitor PC, that is, the amount of charge charged in the sensing capacitor PC and the amount of charge stored in the sensing capacitor PC is proportional to the amount of light supplied to the photodiode PD, through the change in the potential value of the readout line ROL, it is possible to determine how much light is supplied to the corresponding photo sensor FPS. Through the amount of light supplied to the photo sensor FPS, the photo sensor FPS may determine whether an object is in contact and a contact state (e.g., contact distance and contact area, and the like), and may combine the determined information to configure an overall image (for example, fingerprint image).

The sensor element layer PFSL may be disposed on the sensor circuit layer including various constituent elements of the sensor driving circuit for driving the photodiode PD.

The sensor element layer PFSL may include third and fourth banks BNK3 and BNK4, fifth and sixth electrodes RFE3 and RFE4, and a first insulation layer INS1, a photodiode PD, seventh and eighth electrodes CTE3 and CTE4, a second insulation layer INS2, and a third insulation layer INS3, which are disposed on the sensor circuit layer (or the substrate SUB).

The third and fourth banks BNK3 and BNK4 may have substantially the same configuration as the first and second banks BNK1 and BNK2 of the display element layer DPL, the fifth and sixth electrodes RFE3 and RFE4 may have substantially the same configuration as the first and second electrodes RFE1 and RFE2 of the display element layer DPL, and the seventh and eighth electrodes CTE3 and CTE4 may have substantially the same configuration as the third and fourth electrodes CTE1 and CTE2. In addition, the first insulation layer INS1, the second insulation layer INS2, and the third insulation layer INS3 may be components common to the display element layer DPL and the sensor element layer PFSL. That is, the components included in the display element layer DPL and the sensor element layer PFSL may be substantially the same as or similar to each other, so duplicate descriptions will be omitted or simplified.

The photodiode PD may be disposed in a space provided between the fifth electrode RFE3 (or first sensing electrode) and the sixth electrode RFE4 (or second sensing electrode). The photodiode PD may include one end portion EP3 and the other end portion EP4, one end portion EP3 of the photodiode PD may be connected to the fifth electrode RFE3 through the seventh electrode CTE3 (or the third sensing electrode), and the other end portion EP4 thereof may be connected to the sixth electrode RFE4 through the eighth electrode CTE4 (or the fourth sensing electrode).

Each of the components of the sensor element layer PFSL may be disposed at the same layer as each of the corresponding components of the display element layer DPL. For example, the fifth electrode RFE3 and the sixth electrode RFE4 of the sensor element layer PFSL may be disposed at the same layer as the first electrode RFE1 and the second electrode RFE2 of the display element layer DPL. That is, the fifth electrode RFE3 and the sixth electrode RFE4 may be concurrently (e.g., simultaneously) formed with the first electrode RFE1 and the second electrode RFE2, respectively. In one or more embodiments, when the first electrode RFE1 and the second electrode RFE2 are disposed on different layers, the fifth electrode RFE3 and the sixth electrode RFE4 may also be disposed on different layers, the fifth electrode RFE3 may be disposed at the same layer as the first electrode RFE1, and the sixth electrode RFE4 may be disposed at the same layer as the second electrode RFE2. In addition, the photodiode PD of the sensor element layer PFSL may be formed at the same layer as the light emitting element LD of the display element layer DPL.

The fifth electrode RFE3 may be connected to a third connection wire CNL3, and the sixth electrode RFE4 may be connected to a fourth connection wire CNL4. The fifth electrode RFE3 and the sixth electrode RFE4 may receive a sensor driving signal through the third connection wire CNL3 and the fourth connection wire CNL4, and may provide the received sensor driving signal to the photodiode PD.

The third connection wire CNL3 and the fourth connection wire CNL4 may be electrically separated from the first connection wire CNL1 and the second connection wire CNL2, respectively. That is, the light emitting elements LD in the pixel area DPA may be individually driven from the photodiode PD in the sensor area SA. However, the present disclosure is not limited thereto, and one of the third connection wire CNL3 and the fourth connection wire CNL4 may be electrically connected to one of the first connection wire CNL1 and the second connection wire CNL2.

Light OL emitted from the light emitting element LD in the pixel area DPA may transmit through the reflective layer MRL to proceed in the third direction DR3. The light OL emitted from the light emitting element LD may be reflected by an external object (for example, a finger), and at least a portion of the reflected light may be incident on the photodiode PD. As described with reference to FIG. 48, the photo sensor FPS may determine whether an object is in contact and a contact state according to the amount of light supplied to the photodiode PD, and may combine the determined information to form an overall image (for example, fingerprint image).

As described above, the position of the photo sensor FPS is not limited to the embodiment of FIG. 46, and may be dispose at various positions. For example, as shown in FIG. 50, a display device 1002 may include a photo sensor FPS' and auxiliary pixels PXL1', PXL2', PXL3', which are disposed in the area of the existing pixel unit PXU.

The photo sensor FPS' may be formed in a portion of the area in which each pixel unit PXU is disposed, and the pixel unit PXU at the position at which the photo sensor FPS' may be formed in a smaller area than that of the existing pixel unit PXU as an auxiliary pixel unit PXU'. That is, the areas of the auxiliary pixel unit PXU' and the corresponding photo sensors FPS' may be substantially the same as the area of the existing pixel unit PXU.

The reflective layer MRL disposed in the auxiliary pixel unit PXU' may include openings OPs that at least partially overlap the light emitting element included in the auxiliary pixel unit PXU'.

As described above, the display device 1001 may provide a mirror function to a user through the reflective layer MRL. In addition, the display device 1001 may perform a fingerprint sensing function with the photo sensor FPS formed in the sensor area SA. Accordingly, a separate process for forming a fingerprint sensor on the display device may be omitted, the manufacturing process of the display device may be simplified, and the manufacturing cost thereof may be reduced.

While embodiments of the disclosure are described with reference to the attached drawings, those with ordinary skill in the technical field of the present disclosure pertains will be understood that the present disclosure may be carried out in other specific forms without changing the technical idea or essential features. Therefore, it is to be understood that the above-described embodiments are for illustrative purposes only, and the scope of the present disclosure is not limited thereto.

The invention claimed is:

1. A display device comprising:
a substrate;
a first electrode and a second electrode on the substrate;
a light emitting element electrically connected to the first electrode and the second electrode;
a first reflective layer on the light emitting element and including an opening overlapping the light emitting element;
a first insulation layer that at least partially covers the first electrode and the second electrode and is located between the light emitting element and the substrate;
a third electrode on the first electrode and being in contact with one end portion of the light emitting element;
a fourth electrode on the second electrode and being in contact with the other end portion of the light emitting element; and
a second insulation layer that covers the light emitting element, the third electrode, and the fourth electrode,
wherein the first reflective layer comprises a material having a first reflectivity,
wherein the first insulation layer includes a first area and a second area, and
wherein the third electrode contacts the first electrode through the first area, and the fourth electrode contacts the second electrode through the second area.

2. The display device of claim 1, further comprising a fixing layer around at least a portion of an outer circumferential surface of the light emitting element, wherein the fixing layer is located between the first insulation layer and the light emitting element.

3. The display device of claim 1, further comprising an insulation layer located between the light emitting element and the first reflective layer.

4. The display device of claim 3, wherein the insulation layer comprises a wavelength conversion particle and a scattering particle.

5. The display device of claim 1, further comprising a wavelength conversion layer on the first reflective layer, wherein the wavelength conversion layer comprises a wavelength conversion particle and a scattering particle.

6. The display device of claim 1, wherein the second electrode surrounds the first electrode in a plan view.

7. The display device of claim 1, further comprising a second reflective layer having a constant light transmittance overlapping the opening and the light emitting element,
wherein the second reflective layer comprises a material having a second reflectivity, and
wherein the second reflective layer includes at least one of Ag, Mg, Al, Pt, Pd, Au, Ni, Nd, Ir, Cr, and Ti.

8. The display device of claim 7, further comprising a touch sensing controller electrically connected to the first reflective layer,
wherein the touch sensing controller is configured to determine a touch position in response to a touch sensing signal received from the first reflective layer.

9. The display device of claim 8, wherein the touch sensing controller is configured to receive a change in a capacitance value of the first reflective layer as the touch sensing signal.

10. The display device of claim 8, wherein the touch sensing controller is further electrically connected to the second reflective layer, and configured to receive a change in a capacitance value of the second reflective layer as the touch sensing signal.

11. The display device of claim 8, wherein the touch sensing controller is further electrically connected to the second reflective layer, and configured to receive a change in a capacitance value between the first reflective layer and the second reflective layer as the touch sensing signal.

12. The display device of claim 7, further comprising a pressure sensing controller electrically connected to the first reflective layer, wherein the pressure sensing controller is configured to determine a strength of pressure in response to a pressure sensing signal received from the first reflective layer.

13. The display device of claim 12, wherein the first reflective layer comprises a sensing pattern,
wherein the sensing pattern has at least a partially curved shape in a plan view and has a resistance value that is changed when pressure is applied thereto, and
wherein the pressure sensing controller is configured to receive a change in a resistance value of the sensing pattern as the pressure sensing signal.

14. The display device of claim 13, wherein the pressure sensing controller is further electrically connected to the second reflective layer, wherein the second reflective layer comprises a temperature compensation pattern, and
wherein the temperature compensation pattern overlaps the sensing pattern and has the same shape as the sensing pattern.

15. The display device of claim 14, wherein the pressure sensing controller comprises a wheatstone bridge circuit part,
wherein the wheatstone bridge circuit part comprises:
the sensing pattern connected to a first node and a second node;
a first resistor connected to a third node and a fourth node;
a second resistor connected to the first node and the fourth node;
the temperature compensation pattern connected to the second node and the third node; and an amplification circuit connected to the second node and the fourth node, wherein a driving voltage is applied to the first node and the third node is connected to a ground portion, and wherein the amplification circuit is configured to output the pressure sensing signal based on a voltage difference between the second node and the fourth node.

16. The display device of claim 7, further comprising an insulation layer located between the first reflective layer and the second reflective layer.

17. The display device of claim 1, further comprising:
a first sensing electrode and a second sensing electrode on the substrate; and
a photodiode electrically connected to the first sensing electrode and the second sensing electrode,
wherein the first sensing electrode and the second sensing electrode are located at the same layer as the first electrode and the second electrode,
wherein the photodiode is located at the same layer as the light emitting element, and
wherein the first reflective layer does not overlap the photodiode.

18. A display device, comprising:
a substrate;
a first electrode and a second electrode on the substrate;
a light emitting element electrically connected to the first electrode and the second electrode;
a first reflective layer on the light emitting element and including an opening overlapping the light emitting element;
a touch sensing controller electrically connected to the first reflective layer;
a first insulation layer that at least partially covers the first electrode and the second electrode and is located between the light emitting element and the substrate;
a third electrode on the first electrode and being in contact with one end portion of the light emitting element;
a fourth electrode on the second electrode and being in contact with the other end portion of the light emitting element; and
a second insulation layer that covers the light emitting element, the third electrode, and the fourth electrode,
wherein a capacitance value of the first reflective layer is changed according to a touch input,
wherein the touch sensing controller is configured to determine a touch position according to a touch sensing signal based on a change in the capacitance value,
wherein the first insulation layer includes a first area and a second area, and
wherein the third electrode contacts the first electrode through the first area, and the fourth electrode contacts the second electrode through the second area.

19. The display device of claim 18, wherein the first reflective layer comprises a first sensing pattern and a first sub-sensing pattern, and
wherein the touch sensing controller is configured to receive a change in a mutual capacitance value between the first sensing pattern and the first sub-sensing pattern as the touch sensing signal.

20. The display device of claim 18, further comprising a second reflective layer having a constant light transmittance overlapping the opening, the first reflective layer, and the light emitting element, wherein the second reflective layer is electrically connected to the touch sensing controller, wherein the touch sensing controller is configured to receives a change in a capacitance value of the second reflective layer or a change in a capacitance value between the first reflective layer and the second reflective layer as the touch sensing signal, and wherein the second reflective layer includes at least one of Ag, Mg, Al, Pt, Pd, Au, Ni, Nd, Ir, Cr, and Ti.

21. The display device of claim 18, wherein the first reflective layer comprises:
a plurality of first sensing electrodes;
a first connection portion connecting the plurality of first sensing electrodes adjacent to each other along a first direction; and
a plurality of second sensing electrodes located between the plurality of first sensing electrodes.

22. The display device of claim 21, further comprising:
a second reflective layer on the first reflective layer and comprising a second connection portion connecting the plurality of second sensing electrodes adjacent to each other along a second direction crossing the first direction; and
an insulation layer between the first connection portion and the second connection portion.

23. A display device comprising:
a substrate including a pixel area and a sensor area;
a pixel located in the pixel area, the pixel comprising:
a first electrode and a second electrode on the substrate;
a light emitting element electrically connected to the first electrode and the second electrode; and
a first reflective layer on the light emitting element and including an opening overlapping the light emitting element, the first reflective layer comprising a material having a constant reflectivity;
a photo sensor located in the sensor area;
a first insulation layer that at least partially covers the first electrode and the second electrode and is located between the light emitting element and the substrate;
a third electrode on the first electrode and being in contact with one end portion of the light emitting element;
a fourth electrode on the second electrode and being in contact with the other end portion of the light emitting element; and
a second insulation layer that covers the light emitting element, the third electrode, and the fourth electrode,
wherein the photo sensor comprises:
a first sensing electrode and a second sensing electrode on the substrate; and
a photodiode electrically connected to the first sensing electrode and the second sensing electrode,
wherein the first insulation layer includes a first area and a second area, and
wherein the third electrode contacts the first electrode through the first area, and the fourth electrode contacts the second electrode through the second area.

24. The display device of claim 23, further comprising a second reflective layer having a constant light transmittance overlapping the opening, the first reflective layer, and the light emitting element,
wherein the second reflective layer includes at least one of Ag, Mg, Al, Pt, Pd, Au, Ni, Nd, Ir, Cr, and Ti.

* * * * *